(12) United States Patent
Kamiguchi et al.

(10) Patent No.: US 7,791,843 B2
(45) Date of Patent: Sep. 7, 2010

(54) MAGNETORESISTANCE EFFECT ELEMENT, MAGNETIC HEAD AND MAGNETIC RECORDING AND/OR REPRODUCING SYSTEM

(75) Inventors: Yuuzo Kamiguchi, Yokohama (JP); Hiromi Yuasa, Yokohama (JP); Tomohiko Nagata, Yokohama (JP); Hiroaki Yoda, Kawasaki (JP); Katsuhiko Koui, Kawasaki (JP); Masatoshi Yoshikawa, Yokohama (JP); Hitoshi Iwasaki, Yokosuka (JP); Masashi Sahashi, Yokohama (JP); Masayuki Takagishi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/498,202

(22) Filed: Jul. 6, 2009

(65) Prior Publication Data

US 2009/0269618 A1    Oct. 29, 2009

Related U.S. Application Data

(60) Division of application No. 12/212,162, filed on Sep. 17, 2008, now Pat. No. 7,561,383, which is a division of application No. 11/389,175, filed on Mar. 27, 2006, now Pat. No. 7,515,386, which is a division of application No. 11/080,485, filed on Mar. 16, 2005, now Pat. No. 7,046,489, which is a continuation of application No. 09/981,987, filed on Oct. 19, 2001, now Pat. No. 6,937,446.

(30) Foreign Application Priority Data

Oct. 20, 2000    (JP)    ............................. 2000-321171

(51) Int. Cl.
G11B 5/39    (2006.01)
(52) U.S. Cl. ................................. 360/324.11
(58) Field of Classification Search .................. None
See application file for complete search history.

(56) References Cited

U.S. PATENT DOCUMENTS 5,715,121 A    2/1998    Sakakima et al.

(Continued)

FOREIGN PATENT DOCUMENTS

| JP | 9-172212 | 6/1997 |
|----|----------|--------|
| JP | 2001-237471 | 8/2001 |
| JP | 2002-157711 | 5/2002 |
| JP | 2002-353535 | 12/2002 |
| JP | 2003-31871 | 1/2003 |

OTHER PUBLICATIONS

K. Nagasaka, et al., The 8th Joint MMM-Intermag Conference, Abstracts, p. 214, DD-10, "Giant Magnetoresistance Properties of Specular Spin Valve Films in CPP Structure", Jan. 7-11, 2001.

(Continued)

*Primary Examiner*—Mark Blouin
(74) *Attorney, Agent, or Firm*—Oblon, Spivak, McClelland, Maier & Neustadt, L.L.P.

(57) ABSTRACT

There is provided a practical magnetoresistance effect element which has an appropriate value of resistance, which can be sensitized and which has a small number of magnetic layers to be controlled, and a magnetic head and magnetic recording and/or reproducing system using the same. In a magnetoresistance effect element wherein a sense current is caused to flow in a direction perpendicular to the plane of the film, a resistance regulating layer is provided in at least one of a pinned layer, a free layer and an non-magnetic intermediate layer. The resistance regulating layer contains, as a principal component, an oxide, a nitride, a fluoride, a carbide or a boride. The resistance regulating layer may be a continuous film or may have pin holes. Thus, it is possible to provide a practical magnetoresistance effect element which has an appropriate value of resistance, which can be sensitized and which has a small number of magnetic layers, while effectively utilizing the scattering effect depending on spin.

11 Claims, 32 Drawing Sheets

U.S. PATENT DOCUMENTS

| | | | |
|---|---|---|---|
| 6,111,729 | A | 8/2000 | Kamiguchi et al. |
| 6,226,160 | B1 | 5/2001 | Gallagher et al. |
| 6,303,218 | B1 | 10/2001 | Kamiguchi et al. |
| 6,456,468 | B1 | 9/2002 | Hayashi |
| 6,462,641 | B1 | 10/2002 | Dieny et al. |
| 6,535,365 | B1 | 3/2003 | Lukaszew et al. |
| 6,544,801 | B1 | 4/2003 | Slaughter et al. |
| 6,556,390 | B1 | 4/2003 | Mao et al. |
| 6,560,077 | B2 | 5/2003 | Fujiwara et al. |
| 6,574,079 | B2 | 6/2003 | Sun et al. |
| 6,657,826 | B2 | 12/2003 | Shimazawa et al. |
| 6,710,986 | B1 | 3/2004 | Sato et al. |
| 7,035,058 | B2 | 4/2006 | Hosomi |
| 2001/0033463 | A1 | 10/2001 | Mizuguchi |
| 2003/0011944 | A1 | 1/2003 | Hosomi |
| 2003/0053268 | A1 | 3/2003 | Lin et al. |
| 2005/0201021 | A1 | 9/2005 | Hosomi |
| 2006/0164764 | A1* | 7/2006 | Kamiguchi et al. ...... 360/324.1 |

OTHER PUBLICATIONS

K. Nagasaka, et al., Journal of the Magnetic Society of Japan, vol. 25, No. 4-2, pp. 807-810. "Giant Magnetoresistance Properties of Spin Valve Films in Current-Perpendicular-To-Plane Geometry", 2001 (with English Abstract).

* cited by examiner

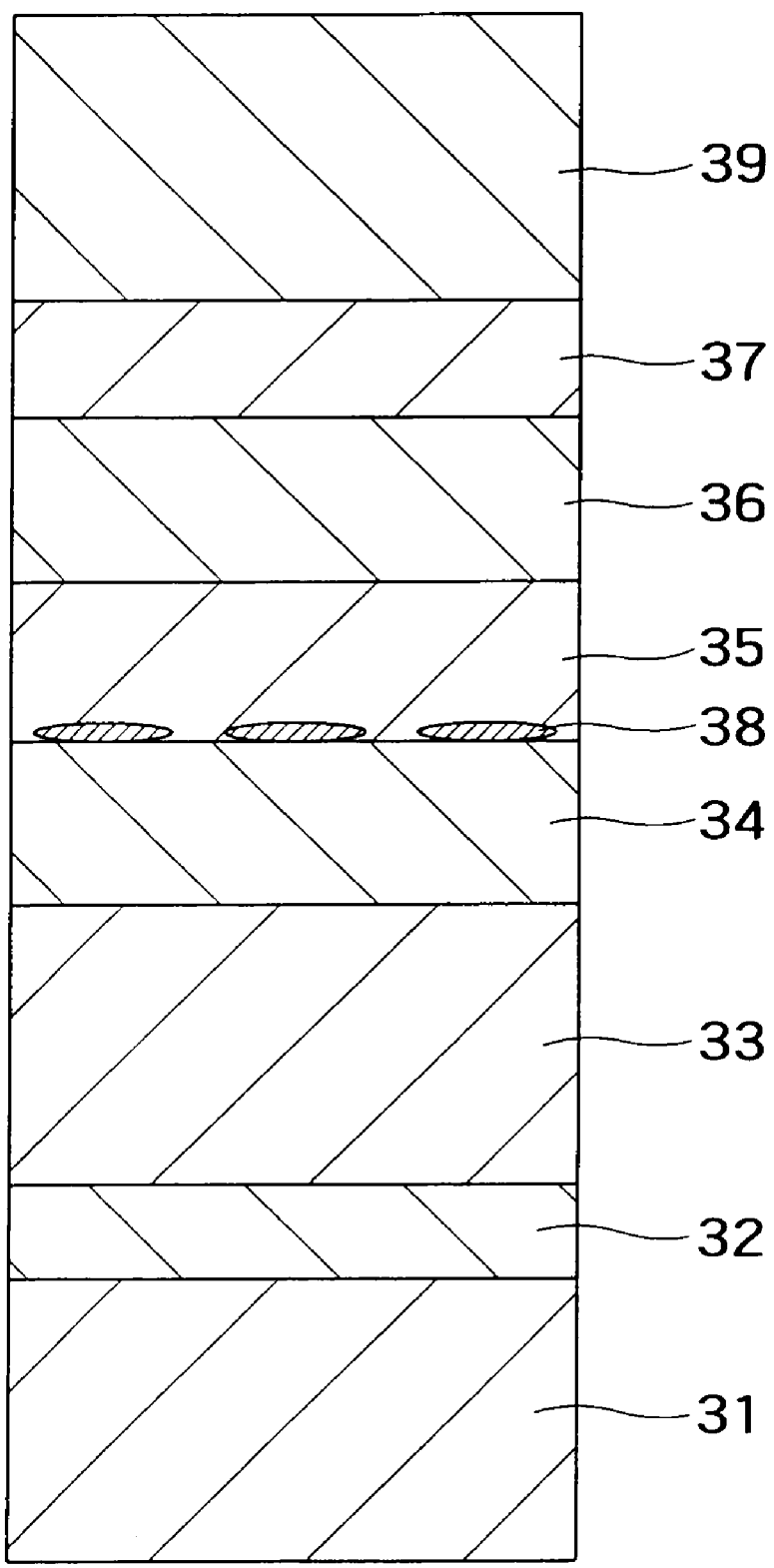
F I G. 36

MAGNETORESISTANCE EFFECT ELEMENT, MAGNETIC HEAD AND MAGNETIC RECORDING AND/OR REPRODUCING SYSTEM

CROSS REFERENCE TO RELATED APPLICATION

The present divisional application claims the benefit of priority under 35 U.S.C. §120 to application Ser. No. 12/212,162, filed on Sep. 17, 2008 which is a divisional of application Ser. No. 11/389,175, filed on Mar. 27, 2006, which is a divisional of U.S. application Ser. No. 11/080,485 (now U.S. Pat. No. 7,046,489), filed on Mar. 16, 2005, which is a continuation of U.S. application Ser. No. 09/981,987 (now U.S. Pat. No. 6,937,446), filed on Oct. 19, 2001, and under 35 U.S.C. §119 from Japanese Patent Application No. 2000-321171, filed on Oct. 20, 2000; the entire contents of each of which are incorporated herein by reference.

BACKGROUND OF THE INVENTION

1. Field of the Invention

The present invention relates generally to a magnetoresistance effect element, a magnetic head and a magnetic recording and/or reproducing system. More specifically, the invention relates to a magnetoresistance effect element using a spin-valve film wherein a sense current flows in a direction perpendicular to the plane of the thin film, a magnetic head including the magnetoresistance effect element, and a magnetic recording and/or reproducing system including the magnetoresistance effect element.

2. Description of Related Art

There is known a phenomenon that an electric resistance varies in response to an external magnetic field in a certain kind of ferromagnetic material. This is called a "magnetoresistance effect". This effect can be used for detecting an external magnetic field, and such a magnetic field detecting element is called a magnetoresistance effect element (which will be hereinafter referred to as an "MR element")".

Such an MR element is industrially utilized for reading information, which has been stored in a magnetic recording medium, in a magnetic recording and/or reproducing system, such as a hard disk or a magnetic tape (see IEEE MAG-7, 150 (1971)), and such a magnetic head is called an "MR head".

is being enhanced, and the size of one bit is decreasing, so that the amount of leakage flux from a bit is increasingly decreased. For that reason, it is necessary to prepare an MR element, which has a high sensitivity and a high S/N ratio and which can obtain a high rate of change in resistance even in a lower magnetic field, in order to read information which has been written in a magnetic medium, and this is an important basic technique for improving the recording density.

The "high sensitivity" means that the amount of change in resistance ($\Omega$) per a unit magnetic field (Oe) is large. As an MR element has a larger amount of change in MR and a more excellent magnetically soft characteristic, the MR element has a higher sensitivity. In addition, in order to realize a high S/N ratio, it is important to reduce thermal noises. Therefore, it is not desired that the resistance itself of the element is too high, and when the element is used as a reading sensor for a hard disk, the resistance of the element is preferably in the range of from about $5\Omega$ to about $30\Omega$ in order to realize a good S/N ratio.

Under such a background, at present, a spin-valve film capable of obtaining a high rate of change in MR is generally used as an MR element for use in a hard disk MR head.

FIG. 25 is a conceptual drawing showing an example of a schematic cross-sectional structure of a spin-valve film. The spin-valve film 100 has a structure wherein a ferromagnetic layer F, a non-magnetic layer S, a ferromagnetic layer P and an antiferromagnetic layer A are stacked in that order. Of the two ferromagnetic layers F and P which are magnetically in a non-coupled state via the non-magnetic layer S, the magnetization of one ferromagnetic layer P is fixed by an exchange bias or the like using the antiferromagnetic material, and the magnetization of the other ferromagnetic layer F is set to be capable of being easily rotated by an external magnetic field (a signal magnetic field or the like). Then, only the magnetization of the ferromagnetic layer F can be rotated by the external magnetic field to change a relative angle between the magnetization directions of the two ferromagnetic layers P and F to obtain a large magnetoresistance effect (see Phys. Rev. B45, 806 (1992), J. Appl. Phys. 69, 4774 (1991)).

The ferromagnetic layer F is often called a "free layer", a "magnetic field receiving layer", or a "magnetization free layer". The ferromagnetic layer P is often called a "pinned layer" or a "magnetization fixed layer". The non-magnetic layer S is often called a "spacer layer", a "non-magnetic intermediate layer" or an "intermediate layer".

The spin-valve film can rotate the magnetization of the free layer, i.e., the ferromagnetic layer F. Therefore, the spin-valve film can be sensitized, so that it is suitable for an MR element for use in an MR head.

It is required to cause a "sense current" to flow through such a spin-valve element in order to detect the variation in resistance due to a magnetic field.

FIG. 26 is a conceptual drawing showing a generally used current supply system. That is, at present, there is generally used a system for providing electrodes EL, EL on both ends of a spin-valve element as shown in the figure to cause a sense current I to flow in parallel to the plane of the film to measure a resistance in a direction parallel to the plane of the film. This method is generally called a "current-in-plane (CIP)" system.

In the case of the CIP system, it is possible to obtain a value of about 10 to 20% as a rate of change in MR. In a shield-type MR head which is generally used at present, a spin-valve element has a substantially square shape, so that the resistance of an MR element is substantially equal-to a value of plane electric resistance (sheet resistance) of an MR film. Therefore, a spin-valve film of a CIP system can obtain good S/N characteristics if the value of plane electric resistance is set to be 5 to $30\Omega$. This can be relatively simply realized by decreasing the thickness of the whole spin-valve film. Because of these advantages, the spin-valve film of the CIP system is generally used as an MR element for an MR head at present.

However, it is expected that the rate of change in MR is required to exceed 30% in order to realize information reproduction at a high recording density exceeding 100 Gbit/inch$^2$. On the other hand, it is difficult to obtain a value exceeding 20% as the rate of change in MR in conventional spin-valve films. For that reason, in order to further improve a recording density, it is a great technical theme to increase the rate of change in MR.

From such a point of view, in order to increase the rate of change in MR, there is proposed a spin-valve wherein an "electron reflective layer" of any one of oxides, nitrides, fluorides and borides is inserted into a pinned layer and a free layer in a CIP-SV film.

FIG. 27 is a conceptual drawing showing the construction of a cross section of such a spin-valve film. That is, in the construction shown in this figure, an electron reflective layer ER is inserted into each of a pinned layer P and a free layer F.

If the scattering of electrons occurs on the interfaces between respective layers in a spin-valve film, the apparent mean free path decreases, so that the rate of change in MR decreases. On the other hand, if the electron reflective layer ER is provided for causing electrons to reflect, it is possible to increase the apparent mean free path of electrons to obtain a high rate of change in MR.

In addition, in this construction, the probability that electrons will pass through the interface of magnetic material/non-magnetic material is increased by causing electrons to reflect, so that it is possible to apparently obtain the same effects as those of an artificial lattice film to increase the rate of change in MR.

However, also in this construction, all of electrons do not always pass through the interface of magnetic material/non-magnetic material, so that there is a limit to the increase of the rate of change in MR. For that reason, also in the above described CIP-SV film wherein the electron reflective layers are inserted, it is substantially difficult to realize a high rate of change in MR exceeding 20% and a practical amount of change in resistance of 5 to 30 Ω.

On the other hand, as a method for obtaining a large MR exceeding 30%, there is proposed a magnetoresistance effect element (which will be hereinafter referred to as a CPP-artificial lattice) of a type (current perpendicular to plane (CPP)) that a sense current is caused to flow in a direction perpendicular to the plane of the film in an artificial lattice wherein magnetic and non-magnetic materials are stacked.

FIG. 28 is a conceptual drawing showing a cross-sectional structure of a CPP-artificial lattice type element. In a magnetoresistance effect element of this type, electrodes EL are provided on the top and bottom face of an artificial lattice SL comprising ferromagnetic and non-magnetic layers which are alternately stacked, and a sense current I flows in a direction perpendicular to the plane of the film. It is known that this construction can a good interface effect and a high rate of change in MR since the-probability that the current I will cross the interfaces between the magnetic layers and the non-magnetic layers.

However, in such a CPP artificial lattice type film, it is required to measure the electric resistance of an artificial lattice SL having the stacked structure of very thin metallic films in a direction perpendicular to the plane of the film. However, this value of resistance is generally very small. Therefore, in the CPP artificial lattice, it is an important technical theme to increase the value of resistance. Conventionally, in order to increase this value, it is necessary to decreases the junction area between the artificial lattice SL and the electrode SL as small as possible and to increase the number of stacked layers of the artificial lattice SL to increase the total thickness of the film. For example, when the element is patterned so as to have a size of 0.1 μm×0.1 μm, if a Co layer having a thickness of 2 nm and a Cu layer having a thickness of 2 nm are alternately stacked ten times, the total thickness of the film is 20 nm, and a value of resistance of about 1Ω can be obtained. However, it can not be said that such a value of resistance is sufficiently a large value, so that it is required to further increase the number of the layers.

For the above described reasons, in order that the CPP artificial lattice type film provides a sufficient head output to be used as a good reading sensor for a hard disk, it is necessary for the film to be the artificial lattice type, not the spin-valve type, from the standpoint of resistance.

However, when the MR element is used for an MR head, it is required to cause each of magnetic layers to be a single magnetic domain so as not to generate Barkhausen noises and so forth, while controlling the magnetization of the magnetic layer so that an external magnetic field can be efficiently measured. However, as described above, it is required to alternately stack many magnetic and non-magnetic layers in order to increase the value of resistance in the CPP-MR element, and it is technically very difficult to individually control the magnetization of such many magnetic layers.

In addition, when the MR element is used for an MR head, it is required to allow the magnetization of a small signal magnetic field to sensitively rotate to obtain a high rate of change in MR. For that purpose, it is required to improve the signal magnetic flux density at a sensing portion to obtain a large amount of rotation of magnetization even at the same magnetic flux density. Therefore, it is required to decrease the total Mst (magnetization×thickness) of layers wherein magnetization is rotated by an external magnetic field. However, in the CPP-MR element, it is required to alternately stack many magnetic and non-magnetic layers in order to increase the value of resistance. Therefore, the Mst increases, so that it is difficult to improve the sensitivity to the signal magnetic flux.

For that reason, although it is expected that the CPP artificial lattice type film has a rate of change in MR exceeding 30%, it is difficult to sensitize the film in order to use the film as an MR sensor for a head, so that it is substantially impossible to use the film as the MR sensor.

On the other hand, it is considered that the spin-valve structure using FeMn/NiFe/Cu/NiFe, FeMn/CoFe/Cu/CoFe or the like adopts the CPP system.

FIG. 29 is a conceptual drawing showing a cross-sectional structure of a CPP-SV element. However, in such a CPP-SV construction, the thickness of a magnetic layer must be increased to about 20 nm in order to increase the value of resistance. Also in that case, it is predicted that the rate of change in resistance would be only about 30% at 4.2 K and about 15%, which is half thereof, at room temperatures.

That is, in the spin-valve film of the CPP system, the rate of change in MR is only about 15%, and the Mst of the free layer must be increased. Therefore, it is difficult to sensitize the film in order to use the film as an MR sensor for a head, so that it is substantially difficult to use the film.

As described above, although there are proposed various systems, such as the spin-valve film of the CIP system, the artificial lattice of the CPP system, and the spin-valve of the CPP system. However, at present, the magnetic packing density is increasing at a rate of 60% or more every year, so that it will be requested to further increase the output in future. However, at present, it is difficult to realize a spin-valve film which can be used at a high packing density exceeding 100 Gbit/inch$^2$, which has an appropriate value of resistance and a large amount of change in MR and which is magnetically sensitive.

SUMMARY OF THE INVENTION

It is therefore an object of the present invention to eliminate the aforementioned problems and to provide a practical magnetoresistance effect element which has an appropriate value of resistance, which can be sensitized and which has a small number of magnetic layers to be controlled, while effectively utilizing the scattering effect depending on spin, and a magnetic head and magnetic recording and/or reproducing system using the same.

In order to accomplish the aforementioned object, according to a first aspect of the present invention, a magnetoresistance effect element comprises: a magnetoresistance effect film including a magnetization fixed layer having a ferromagnetic film in which the direction of magnetization is substantially fixed to one direction, a magnetization free layer having a ferromagnetic film in which the direction of magnetization varies in response to an external magnetic field, and an non-magnetic intermediate layer provided between the magnetization fixed layer and the magnetization free layer; a pair of electrodes which are electrically connected to the magnetoresistance effect film for applying a current in a direction perpendicular to the plane of the magnetoresistance effect film; and a resistant regulating layer which contains an oxide, a nitride, a fluoride, a carbide or a boride as a principal component.

According to a second aspect of the present invention, a magnetoresistance effect element comprises: a magnetoresistance effect film including a magnetization fixed layer having a ferromagnetic film in which the direction of magnetization is substantially fixed to one direction, a magnetization free layer having a ferromagnetic film in which the direction of magnetization varies in response to an external magnetic field, and an non-magnetic intermediate layer provided between the magnetization fixed layer and the magnetization free layer; a pair of electrodes which are electrically connected to the magnetoresistance effect film for applying a current in a direction perpendicular to the plane of the magnetoresistance effect film; and a resistant regulating layer for restricting the quantity of a sense current passing through the magnetoresistance effect film.

The resistance regulating layer may have pin holes at a rate of hole area which is 50% or less.

The resistance regulating layer may be made of two kinds or more of metallic elements.

The resistance regulating layer may be formed in the magnetization free layer, or on the magnetization free layer on the opposite side to the non-magnetic intermediate layer.

The resistance regulating layer may be formed in the non-magnetic intermediate layer or on the interface of the non-magnetic intermediate layer.

The resistance regulating layer may be formed in the magnetization fixed layer, or on the magnetization fixed layer on the opposite side to the non-magnetic intermediate layer.

The resistance regulating layer may contain, as a principal component, at least one of oxides, nitrides, fluorides, carbides or borides of an element selected from the group consisting of B, Si, Ge, Ta, W, Nb, Al, Mo, P, V, As, Sb, Zr, Ti, Zn, Pb, Th, Be, Cd, Sc, La, Y, Pr, Cr, Sn, Ga, Cu, In, Rh, Pd, Mg, Li, Ba, Ca, Sr, Mn, Fe, Co, Ni and Rb.

The resistance regulating layer may be formed on the magnetization free layer on the opposite side to the non-magnetic intermediate layer, or in the non-magnetic intermediate layer, or on the interface of the non-magnetic intermediate layer, and contain a metal including at least one of Cu, Au, Ag, Ru, Ir, Re, Rh, Pt, Pd, Al and Os.

The resistance regulating layer may comprise: a first region which is formed on the magnetization free layer on the opposite side to the non-magnetic intermediate layer, or in the non-magnetic intermediate layer, or on the interface of the non-magnetic intermediate layer, and which contains Cu as a principal component; and a second region which contains, as a principal component, at least one of oxides, nitrides, fluorides, carbides and borides of an element selected from the group consisting of B, Fe, Mo, Pb, Ta, Cr, V, Si, Sb and Ge.

The resistance regulating layer may comprise: a first region which is formed on the magnetization free layer on the opposite side to the non-magnetic intermediate layer, or in the non-magnetic intermediate layer, or on the interface of the non-magnetic intermediate layer, and which contains Au as a principal component; and a second region which contains, as a principal component, at least one of oxides, nitrides, fluorides, carbides and borides of an element selected from the group consisting of B, Fe, Ge, Mo, P, Rh, Si, W and Cr.

The resistance regulating layer may comprise: a first region which is formed on the magnetization free layer on the opposite side to the non-magnetic intermediate layer, or in the non-magnetic intermediate layer, or on the interface of the non-magnetic intermediate layer, and which contains Ag as a principal component; and a second region which contains, as a principal component, at least one of oxides, nitrides, fluorides, carbides and borides of an element selected from the group consisting of Be, Co, Cr, Fe, Mo, Pb, Si, Ta, V, W, Ge, Sn, Al and Rh.

According to a third aspect of the present invention, a magnetoresistance effect element comprises: a magnetoresistance effect film including a magnetization fixed layer having a ferromagnetic film in which the direction of magnetization is substantially fixed to one direction, a magnetization free layer having a ferromagnetic film in which the direction of magnetization varies in response to an external magnetic field, and an non-magnetic intermediate layer provided between the magnetization fixed layer and the magnetization free layer; a pair of electrodes which are electrically connected to the magnetoresistance effect film for applying a current in a direction perpendicular to the plane of the magnetoresistance effect film; and a region which is formed on the magnetization free layer on the opposite side to the non-magnetic intermediate layer, or in the non-magnetic intermediate layer, or on the interface of the non-magnetic intermediate layer, and which contains, as a principal component, a crystalline oxide containing at least one selected from the group consisting of B, Si, Ge, W, Nb, Mo, P, V, Sb, Zr, Ti, Zn, Pb, Cr, Sn, Ga, Fe and Co.

The resistance regulating layer may have a thickness of 0.5 to 5 nm.

The resistance regulating layer may include holes of a metal phase of 2% to 30%.

The mean diameter of each of the holes of the resistance regulating layer may be in the range of from 5% to 100% with respect to the total thickness of the magnetization free layer, the non-magnetic intermediate layer and the magnetization fixed layer.

The mean distance between adjacent two of the holes of the metal phase may be in the range of from 10 nm to 100 nm.

According to a fourth aspect of the present invention, there is provided a magnetic head having any one of the above described magnetoresistance effect elements.

According to a fifth aspect of the present invention, there is provided a magnetic recording and/or reproducing system which has the above described magnetic head and which is capable of reading magnetic information stored in a magnetic recording medium.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIG. 36 is a sectional view showing the construction of a modified example of the fourth embodiment.

DESCRIPTION OF THE EMBODIMENTS

Referring now to the accompanying drawings, the embodiments of the present invention will be described below.

First Embodiment

Figure 1:
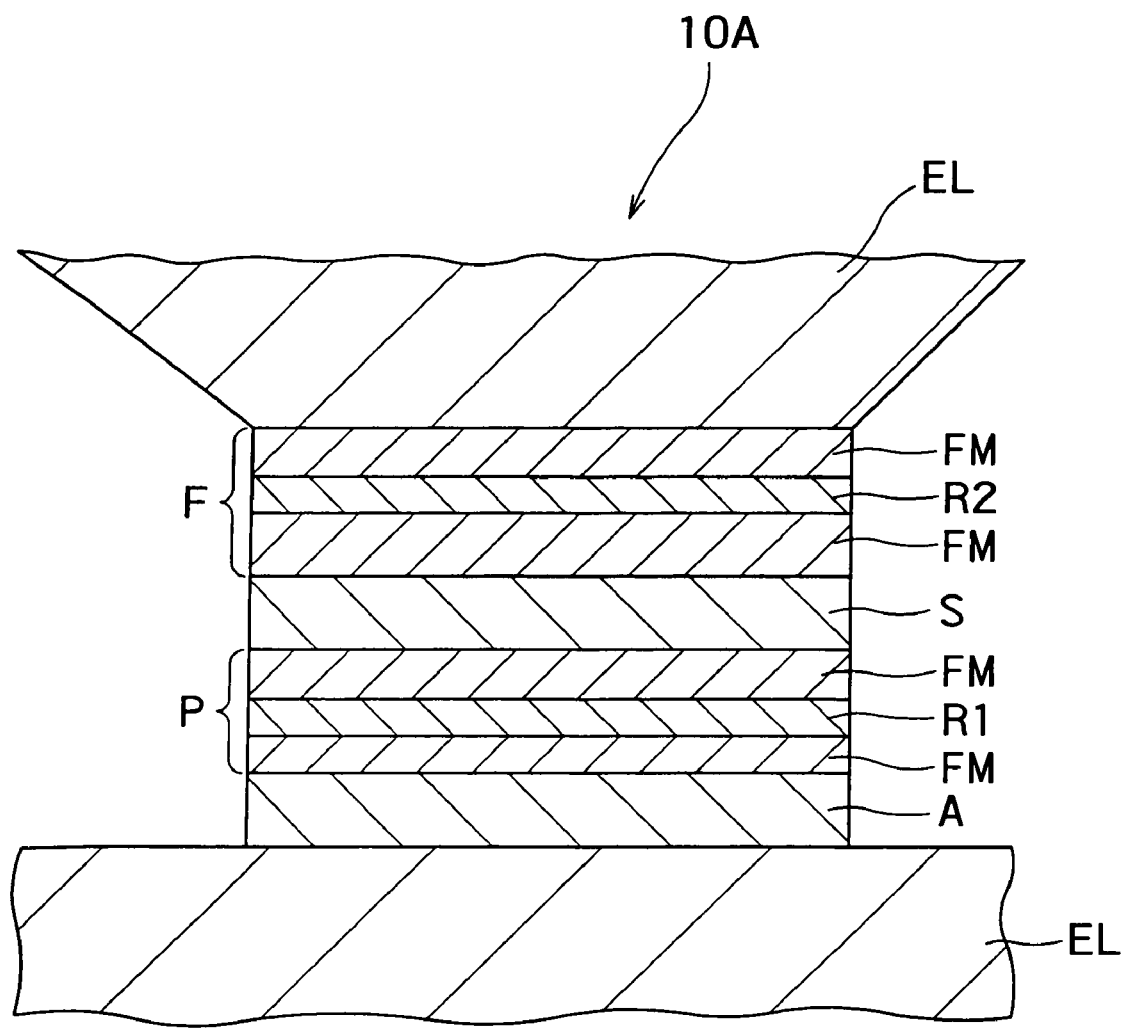
FIG. 1 is a conceptual drawing showing a cross-sectional structure of the first embodiment of a magnetoresistance effect element according to an aspect of the present invention.

FIG. 1 is a conceptual drawing showing a cross-sectional structure of the first embodiment of a magnetoresistance effect element according to an aspect of the present invention. That is, the magnetoresistance effect element 10A according to the aspect of the present invention comprises an antiferromagnetic layer A, a first magnetic layer P, an non-magnetic intermediate layer S and a second magnetic layer F which are stacked on a predetermined substrate (not shown) in that order. In addition, a resistance regulating layer R1 is inserted into the first magnetic layer P, and a resistance regulating layer R2 is inserted into the second magnetic layer F. Furthermore, the antiferromagnetic layer A, the first magnetic layer P, the non-magnetic intermediate layer S and the second magnetic layer F constitute a magnetoresistance effect film.

Moreover, electrode layers EL are provided on the top and bottom faces of this stacked structure, respectively, and a sense current I is caused to flow in a direction perpendicular to the plane of the film.

In this embodiment, the first magnetic layer P functions as a "pinned layer", the magnetization of which is fixed by one-directional anisotropy due to the antiferromagnetic layer A. In addition, the second magnetic layer F functions as a "magnetic field receiving layer or free layer", the magnetization of which is rotated by an external magnetic field (e.g., a magnetic field due to signal) produced from a magnetic recording medium (not shown).

The first magnetic layer P and the second magnetic layer F include the resistance regulating layers R1 and R2, respectively, and have stacked structures of ferromagnetic layer FM/resistance regulating layer R1 or resistance regulating layer R2/ferromagnetic layer FM, respectively. In this structure, the ferromagnetic layers on both sides of the resistance regulating layer R1 or R2 are ferromagnetically coupled to each other, and the magnetization thereof behaves so as to be substantially integrated. That is, the magnetization of each of the ferromagnetic layers included in this stacked structure of ferromagnetic layer/resistance regulating layer/ferromagnetic layer is substantially parallel to each other, the magnetization in the pinned layer (the first magnetic layer P) being substantially fixed in the same direction, and the magnetizing direction in the free layer (the second magnetic layer F) being substantially the same direction with respect to the external magnetic field.

Figure 30:
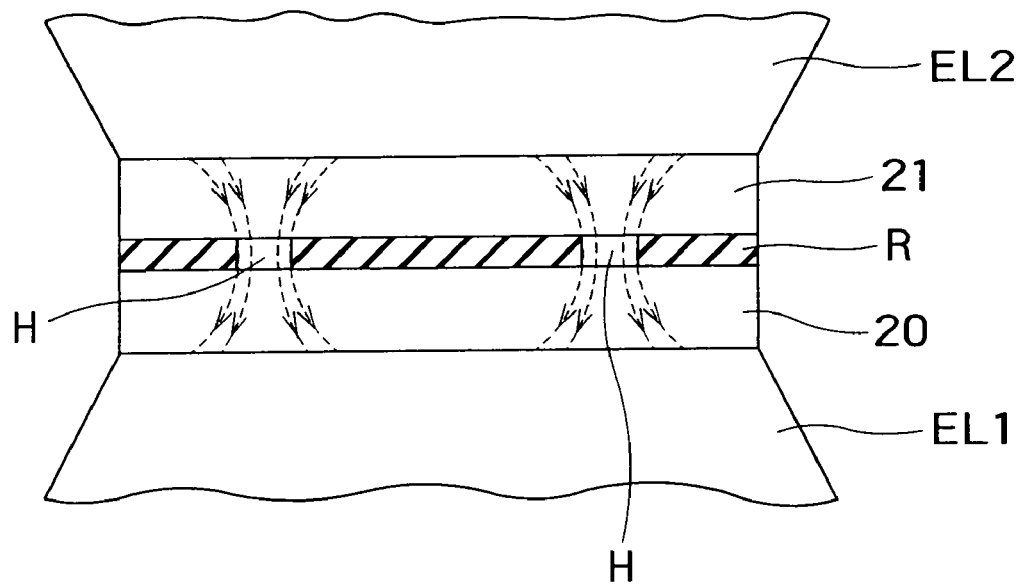
FIG. 30 is an illustration for explaining the construction and operation of an example of a resistance regulating layer.

In this embodiment, a current I is designed to flow from the top electrode EL toward the bottom electrode EL, and the resistance regulating layers R1 and R2 are designed to cause the current to flow in a thickness direction while reducing the quantity of the current. That is, the resistance regulating layers R1 and R2 function as "filter layers" for restricting the quantity of the sense current I passing therethrough, or "current constriction layers" for allowing part of conduction electrons forming the sense current I to be transmitted therein, or "barrier layers" for reducing the quantity of the sense current I. Referring to FIG. 30, the construction and operation of an example of the above described resistance regulating layer will be described below. If the resistance regulating layer R is sandwiched between films 20 and 21 constituting a magnetoresistance effect film and if electrodes EL1 and EL2 are connected to these films, respectively, when a current is caused to flow in a direction perpendicular to the plane of the film, the current passes through pin holes H as shown by broken lines in FIG. 30, so that the quantity of current is reduced and resistance is increased. Furthermore, as will be described later, the construction and function of the resistance regulating layer should not be limited thereto.

Moreover, part of the reduced current I flows between the two resistance regulating layers R1 and R2 while repeatedly reflecting therebetween. However, the quantity of current flowing while repeatedly reflecting is not so large with respect to the whole sense current. However, the probability that electrons will pass through the CPP spin-valve structure without reflection is slightly reduced by the reflection, so that it is possible to further increase the electric resistance. Furthermore, these resistance regulating layers have morphologically different constructions from the electron reflective layer of the CIP spin-valve element.

Figure 28:
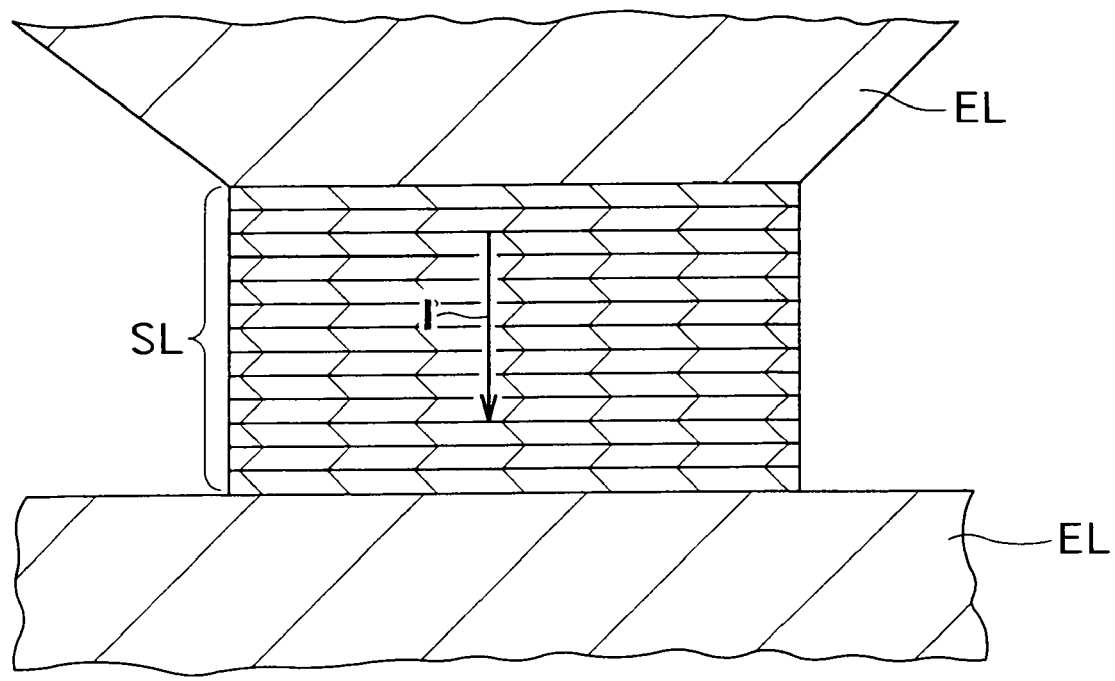
FIG. 28 is a conceptual drawing showing a cross-sectional structure of a CPP-artificial lattice type element.
Figure 29:
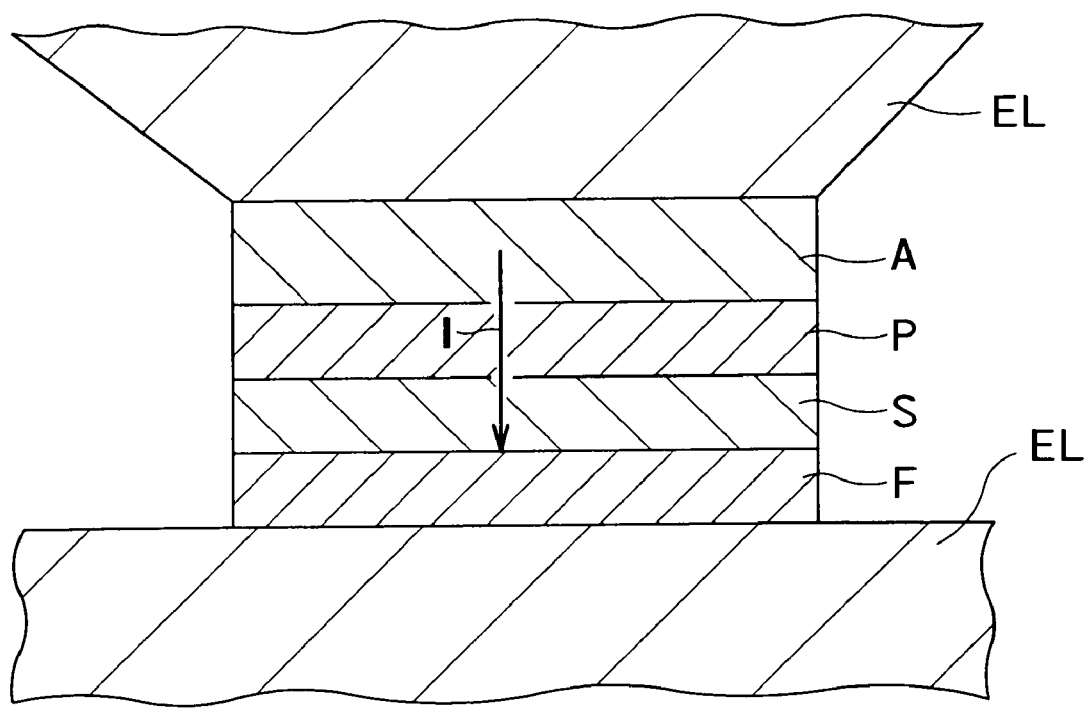
FIG. 29 is a conceptual drawing showing a cross-sectional construction of a CPP-SV element.

In the CPP spin-valve film, the effect of the scattering of electrons on the interface of ferromagnetic layer/non-magnetic layer, i.e., the interface resistance, has a large spin dependency and serves to increase the CPP-MR. In addition, the interface resistance tends to have a relatively large value. These characteristics are the same as the above described functions in the CPP artificial lattice referring to FIG. 28.

Therefore, the value of resistance in a direction perpendicular to the plane of the film can be increased by providing the resistance regulating layers. As a result, according to the embodiment of the present invention, it is possible to utilize a larger number of values of interface resistance, so that it is possible to realize a CPP-SV having a higher resistance and a higher rate of change in MR than those of conventional CPP spin-valve films.

In addition, since this embodiment adopts the CPP system wherein a current I flows in a direction perpendicular to the plane of the film, all of the current I crosses the interfaces of ferromagnetic layers/non-magnetic layers. As a result, it is possible to very effectively utilize the interface effect which can not effectively be utilized in the case of the CIP system. For that reason, it is possible to very conspicuously obtain the function of increasing the rate of change in MR which can not so sufficiently be obtained by the CIP construction.

By the above described effects, it is possible to provide a CPP spin-valve film suitably utilizing an interface resistance and having an appropriate value of resistance though it has a spin-valve construction.

In addition, in this embodiment, since the magnetization of the pinned layer P and the magnetization of the free layer F are operated so as to be integrated, the magnetization can be controlled only by the magnetization fixed of the pinned layer P and the control of the magnetization of one free layer F. Therefore, when the element is used for a reading sensor, such as a magnetic head, it is possible to realize a magnetic head wherein Barkhausen noises are suppressed.

In addition, in this embodiment, it is possible to obtain a good value of resistance and a good rate of change in MR while the total thickness of the pinned layer P and free layer F is small. That is, as compared with the simple CPP spin-valve construction, this construction can reduce the simple transmission probability of electrons, increase the value of resistance and sufficiently utilize the interface resistance. Therefore, even if the total Mst of the pinned layer P and free layer F is small, it is possible to obtain a sufficient value of resistance and a sufficient rate of change in MR.

Specifically, although the thickness of the magnetic material of the pinned layer P and free layer F must be about 20 nm in conventional constructions, this embodiment can obtain sufficient characteristics even if the total thickness of the magnetic layers is 5 nm or less. Thus, the Mst of the free layer F can be held to be a small value, so that it is possible to realize a sensitive spin-valve element. In addition, since it is possible to decrease the Mst of the pinned layer P, it is possible to improve the magnetization fixed characteristics by the antiferromagnetic layer A, so that it is possible to improve the reliability of the device.

In this embodiment, the resistance regulating layers R1 and R2 may be formed of a semimetal, such as Bi (bismuth), Sb (antimony) or C (carbon), or a so-called zero gap semiconductor, such as ZnSe (zinc selenide). In these materials unlike insulating materials, conduction electrons exist, but the density thereof is vary small, so that potential sensed by the conduction electrons is vary small. Specifically, a metal, such as Cu (copper), has a Fermi potential of about 7 eV, whereas a semimetal has a small Fermi potential of 1 eV or less.

Figure 2A:
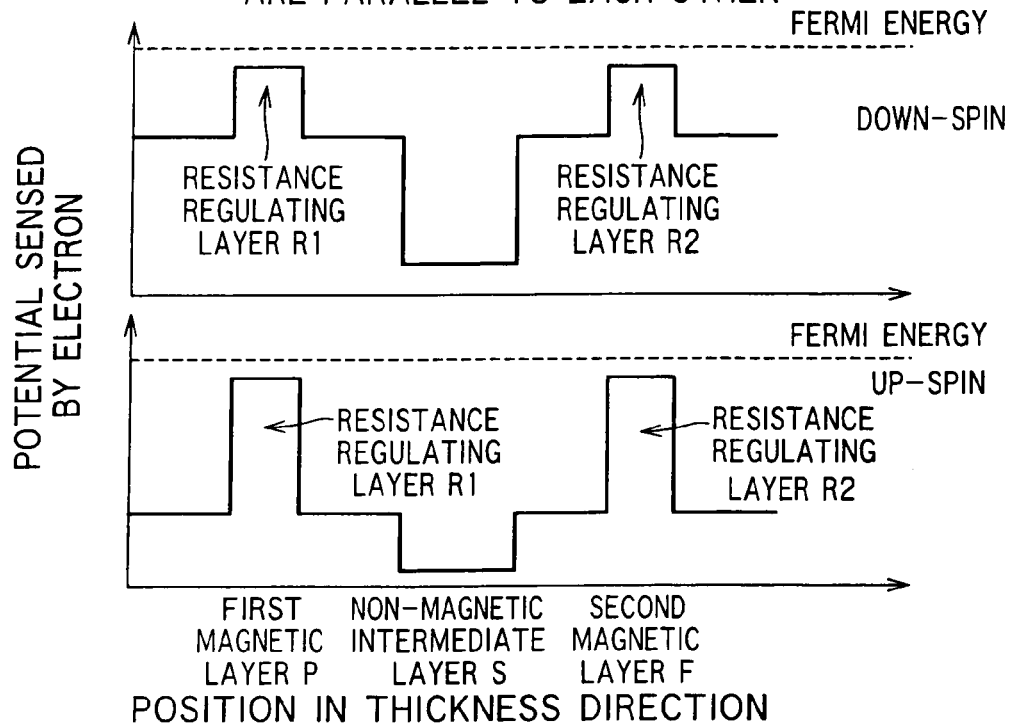
FIG. 2A is a graph showing potentials sensed by electrons in the cases of up-spin and down-spin when the magnetization of a pinned layer P is parallel to the magnetization of a free layer F.
Figure 2B:
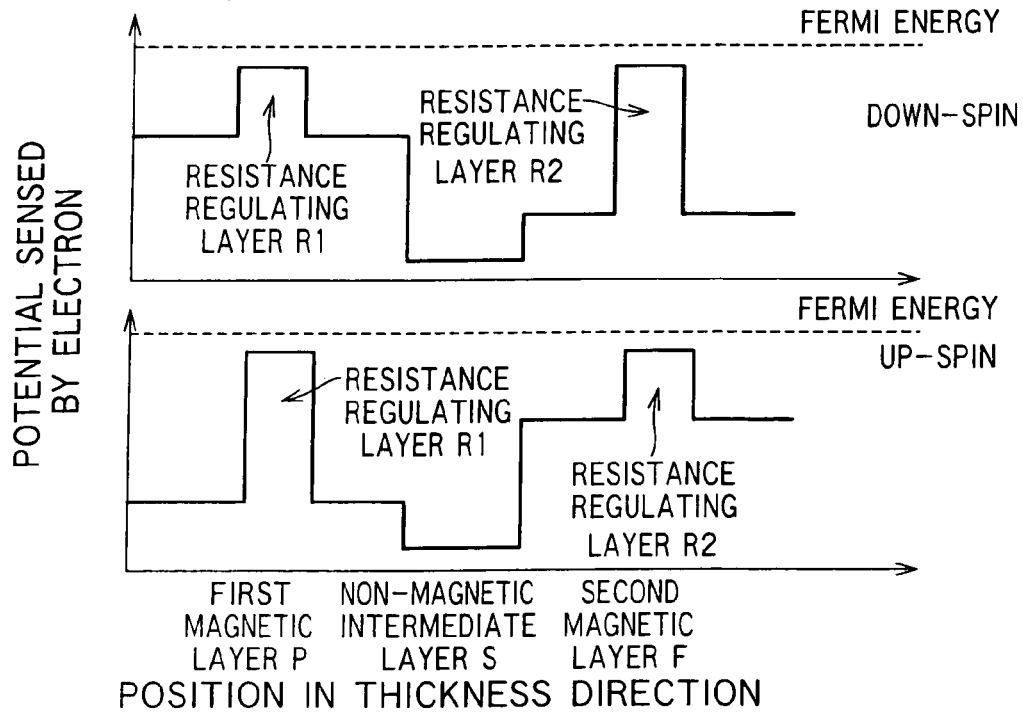
FIG. 2B is a graph showing potentials sensed by electrons in the cases of up-spin and down-spin when the magnetization of the pinned layer P is anti-parallel to the magnetization of the free layer F.

For that reason, if the resistance regulating layers R1 and R2 of a semimetal or a zero gap semiconductor are provided in a metal layer serving as a ferromagnetic material, large differences in potential level occur as illustrated in FIGS. 2A and 2B, so that the transmission of conduction electrons is restricted. Furthermore, FIG. 2A is a graph showing potentials sensed by electrons in the cases of up-spin and down-spin when the magnetization of the pinned layer P is parallel to the magnetization of the free layer F, and FIG. 2B is a graph showing potentials sensed by electrons in the cases of up-spin and down-spin when the magnetization of the pinned layer P is anti-parallel to the magnetization of the free layer F.

In the construction according to the embodiment of the present invention, since conduction electrons also exist in the resistance regulating layers R1 and R2, the conduction probability of conduction electrons is sufficiently larger than the transmission probability of electrons due to tunnel, so that the usual conduction controls the total value of resistance. For that reason, it is possible to make resistance lower than that in the case of a ferromagnetic tunnel junction, so that it is possible to obtain a good element resistance in a fine junction.

The value of Fermi potential in these materials is preferably in the range of from 1 eV to 0 eV, and more preferably in the range of 0.5 eV to 0 eV. The first one of the reasons for this is that, in these materials, the difference in potential level sensed by electrons can be increased as the value of Fermi potential is decreased, so that the transmission probability of electrons can be small. In addition, since the number of conduction electrons in the semimetal is decreased, the transmission probability of electrons can be very small. In the case of 0.5 eV, the number of conduction electrons is about $3.5 \times 10^{20}$, which is smaller than that in a noble metal, such as Cu, by about two digits, so that it is possible to greatly increase resistance. Therefore, the value of Fermi potential in these materials is preferably 0.5 eV or less. However, if it is 1 eV or less, the number of conduction electrons is about $4.6 \times 10^{21}$, which is smaller than that in a noble metal, such as Cu, by about one digit, so that it is possible to sufficiently increase resistance.

The resistance regulating layers R1 and R2 in this embodiment may be also formed of Au (gold), Ag (silver) or an alloy thereof. However, in this case, it is difficult to form so great difference in potential level, so that it is not easy to greatly increase resistance.

Figure 3A:
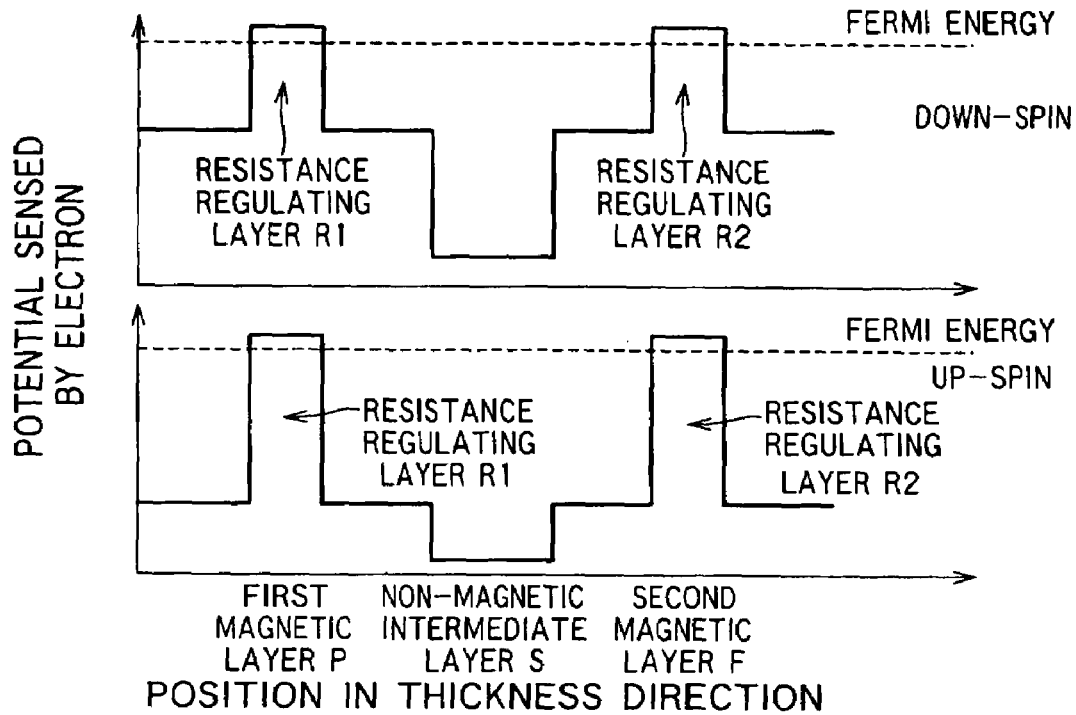
FIG. 3A is a graph showing potentials sensed by electrons in the cases of up-spin and down-spin when the magnetization of the pinned layer is parallel to the magnetization of the free layer.
Figure 3B:
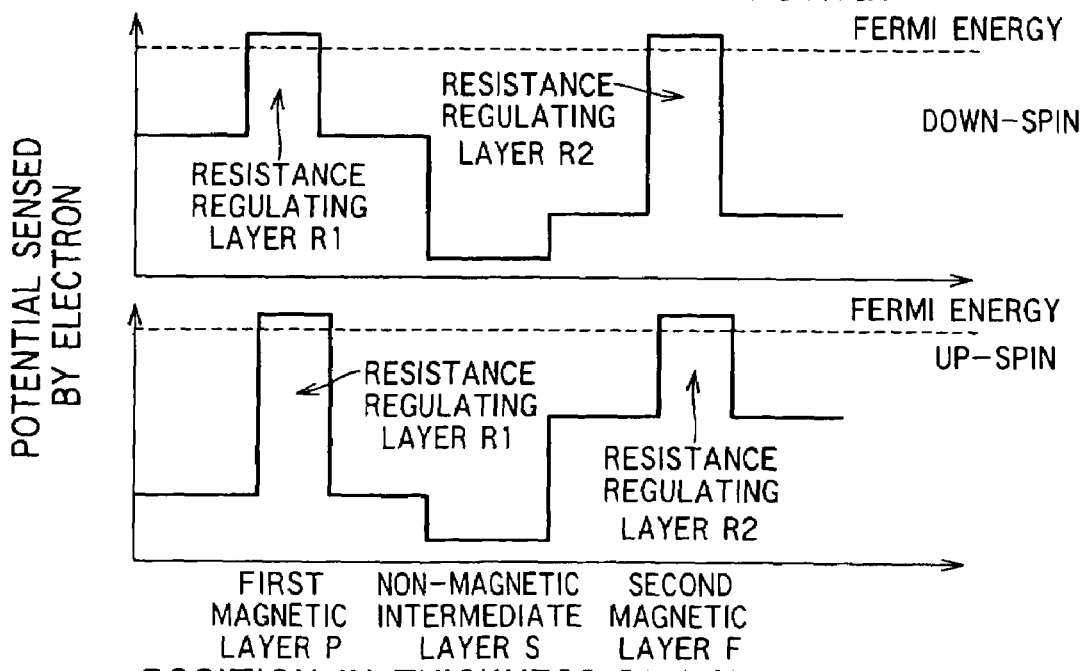
FIG. 3B is a graph showing potentials sensed by electrons in the cases of up-spin and down-spin when the magnetization of the pinned layer is anti-parallel to the magnetization of the free layer.

The resistance regulating layers R1 and R2 in this embodiment may be also formed of an insulating material which has a potential barrier having a relatively low height. FIGS. 3A and 3B are potential diagrams corresponding to this construction. That is, FIG. 3A is a graph showing potentials sensed by electrons in the cases of up-spin and down-spin when the magnetization of the pinned layer is parallel to the magnetization of the free layer, and FIG. 3B is a graph showing potentials sensed by electrons in the cases of up-spin and down-spin when the magnetization of the pinned layer is anti-parallel to the magnetization of the free layer.

In this example, the transmission probability of electrons is determined by the tunnel probability of electrons in the resistance regulating layers R1 and R2. Therefore, since the element resistance is too high if the barrier height increases, the barrier height of the resistance regulating layers R1 and R2 is preferably 0.1 eV or less.

Figure 4:
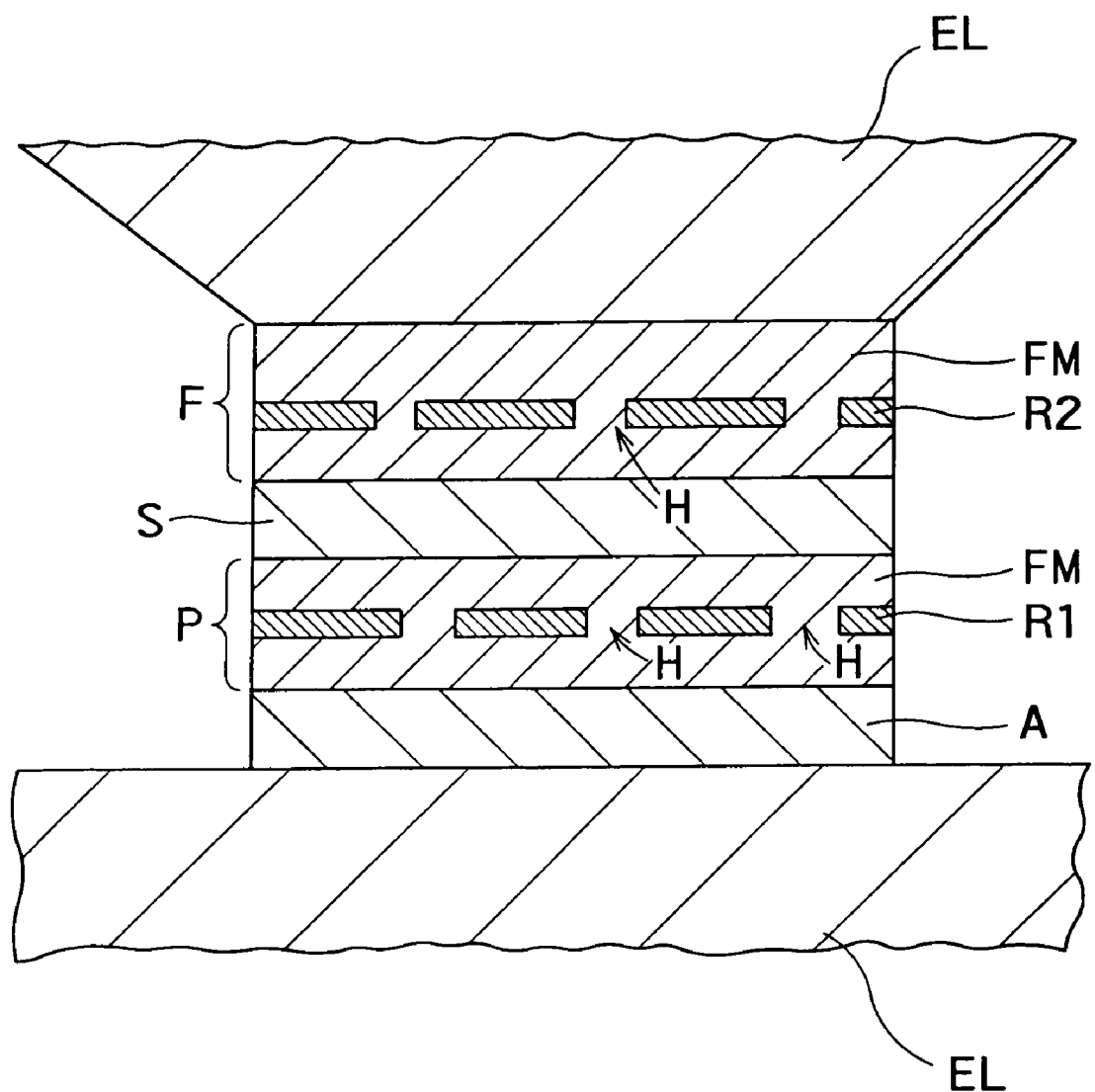
FIG. 4 is a conceptual drawing showing a cross-sectional structure of a magnetoresistance effect element in this embodiment.

On the other hand, the resistance regulating layers R1 and R2 in this embodiment may be formed of an insulating material having pin holes. In this case, the transmission probability of electrons is determined by the size and density of pin holes. FIG. 4 is a conceptual drawing showing the cross-sectional construction in this example. As shown in this figure, the resistance regulating layers R1 and R2 may suitably have pin holes H. If the size of the pin holes H is about the mean free path of electrons or less, it is possible to obtain a greater resistance increasing effect. From the standpoint of repeatability of element characteristics, at least 10 or more pin holes H are preferably formed in the films of the element. However, only one pin hole H may exist in the element. The ratio of the total area of the pin holes H to the area of the film of the element may be suitably determined, and is preferably 50% or less in order to increase the element resistance.

In the example of FIG. 4, the transmission probability of electrons is determined by the electric conduction through the pin holes H. Therefore, the resistance regulating layers R1 and R2 may be formed of an insulating material having a high barrier height, e.g., Al (aluminum) oxide or Si (silicon) oxide. However, the resistance regulating layers R1 and R2 may be formed of a material having a low barrier height, such as Co (cobalt) oxide, Ni (nickel) oxide or Cu (copper) oxide. Also in that case, the electric conduction is mainly controlled by the pin holes H.

The thickness of the resistance regulating layers R1 and R2 in the example of FIG. 4 can be suitably determined, and is preferably set to be in the range of from 0.5 nm to 10 nm in order to surely and easily form the pin holes H.

It is not particularly required to control the positions of the pin holes H in the resistance regulating layers R1 and R2 of the pinned layer P and free layer F. In this case, it is possible to obtain electric conduction through the pin holes H which are formed at random.

Such resistance regulating layers R1 and R2 having pin holes H may be formed by a method for forming a very thin layer of, e.g., Al, which has formed by the sputtering method or the like, and then, exposing the layer to an atmosphere of oxygen for a short period of time to carry out a natural oxidation. Alternatively, the resistance regulating layers R1 and R2 having the pin holes H may be formed by a method for applying energy to a vary thin layer of Al or the like by exposing it to oxygen plasma or irradiating it with oxygen ions or oxygen radicals.

Alternatively, a material which is relatively easy to be oxidized, and a material which is difficult to be oxidized, such as Al—Co, may be simultaneously deposited to form a granular film of Al—Co as a layer to be oxidized, and the formed layer may be exposed to selectively oxidize only Al to form the resistance regulating layers R1 and R2 having the pin holes H.

Alternatively, the oxidized layer having pin holes H may be formed by depositing a film in an atmosphere of oxygen.

As another method for forming such resistance regulating layers R1 and R2 having pin holes H, regularly arranged pinholes H may be formed by the fine pattern lithography using the AFM (atomic force microscope) or the like or by the self-organizing. In the case of the fine pattern lithography using the AFM or the like, continuous films of, e.g., AlOx (aluminum oxide), may be formed, and holes may be formed therein. When regularly arranged pin holes are formed by the self-organizing, the pin holes may be formed by forming continuous films of, e.g., AlOx, applying thereon a resist, in which pin holes can be formed by the self-organizing, and removing AlOx from the pin hole portion by the milling or RIE. Alternatively, an insulating material having pin holes H arranged by the self-organizing may be directly formed.

Figure 5A:
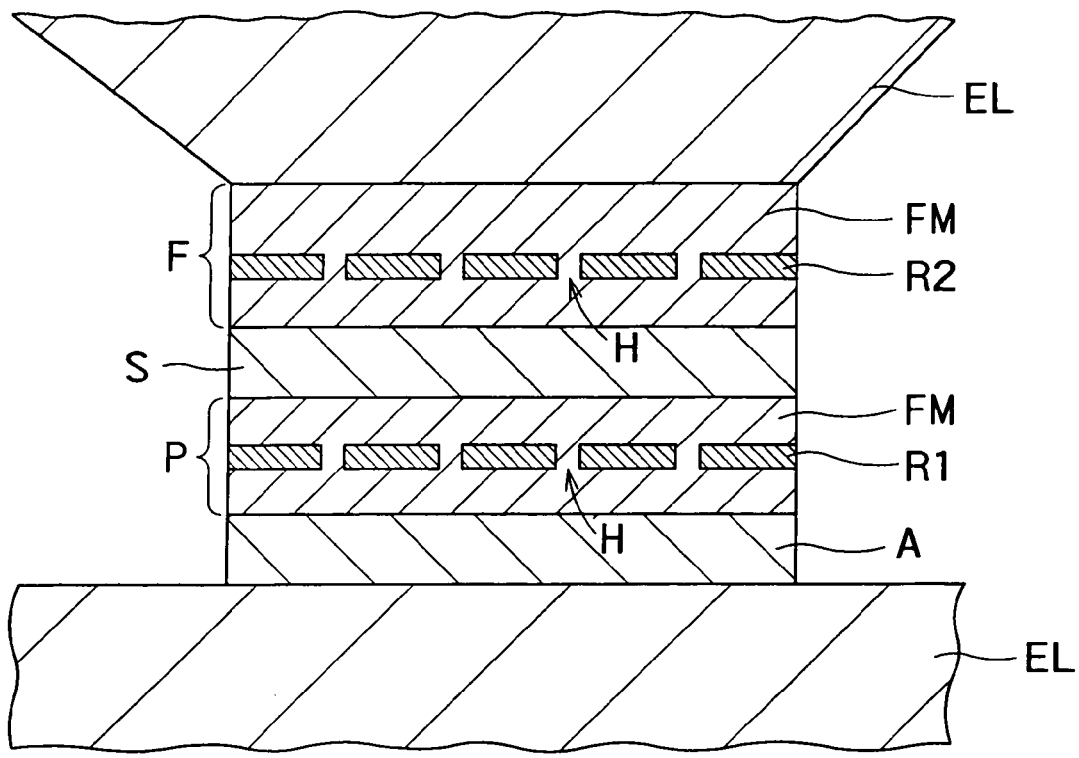
FIG. 5A is a sectional view showing the construction of a magnetoresistance effect element wherein the positions of pin holes H are the same between upper and lower resistance regulating layers R1 and R2.
Figure 5B:
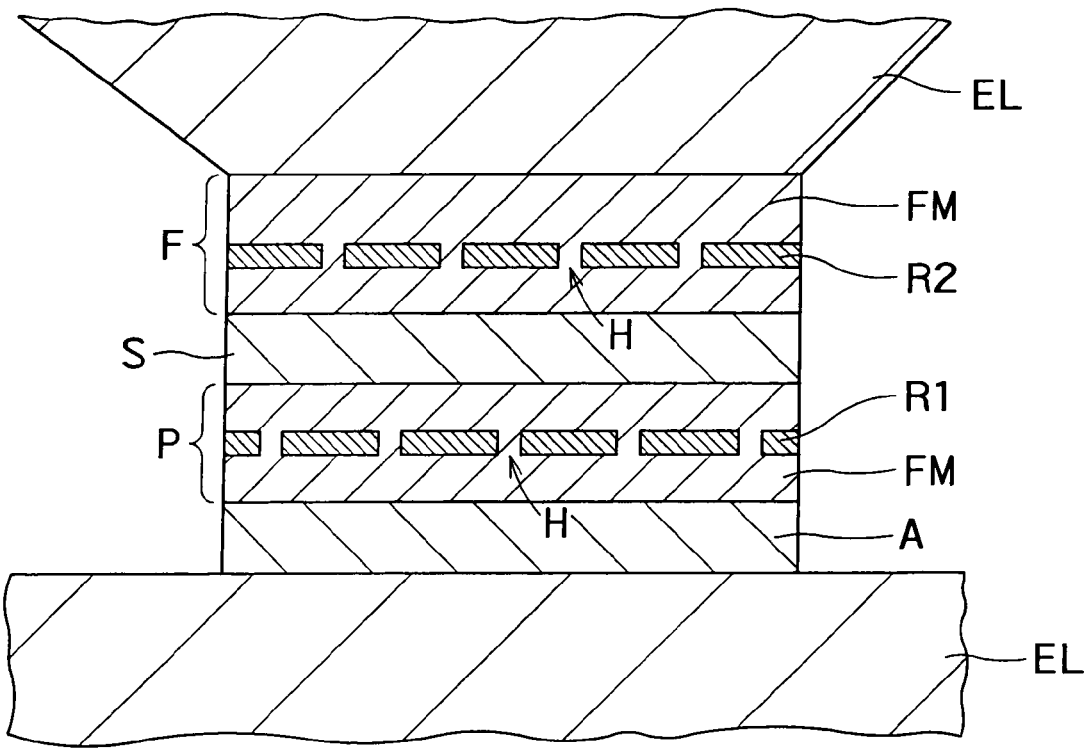
FIG. 5B is a sectional view showing the construction of a magnetoresistance effect element wherein the positions of pin holes H are shifted between upper and lower resistance regulating layers R1 and R2.

When pin holes H are formed by such a controlled method, the positional relationship between the pin holes H in the two resistance regulating layers R1 and R2 is important. That is, the pin holes H in the upper and lower resistance regulating layers R1 and R2 may be positioned at the same place as illustrated in FIG. 5A. Alternatively, the positions of the pin holes H in the upper and lower resistance regulating layers R1 and R2 may be shifted as illustrated in FIG. 5B. When the positions are shifted as illustrated in FIG. 5B, it is possible to more effectively reduce the quantity of current, so that it is possible to realize a CPP spin-valve element having a higher resistance.

When the pin holes H are formed by the controlled method, the relationship between the sizes of the pin holes H in the two resistance regulating layers R1 and R2 can be also adjusted. That is, the sizes of the pin holes H in the upper and lower resistance regulating layers R1 and R2 may be equal to or different from each other. If the size of the pin hole H in the electron entering resistance regulating layer of the resistance regulating layers R1 and R2 is greater than the size of the pin hole H in the other electron leaving regulating layer, it is possible to more effectively reduce the quantity of current, so that it is possible to form a CPP spin-valve element having a higher resistance.

Figure 6:
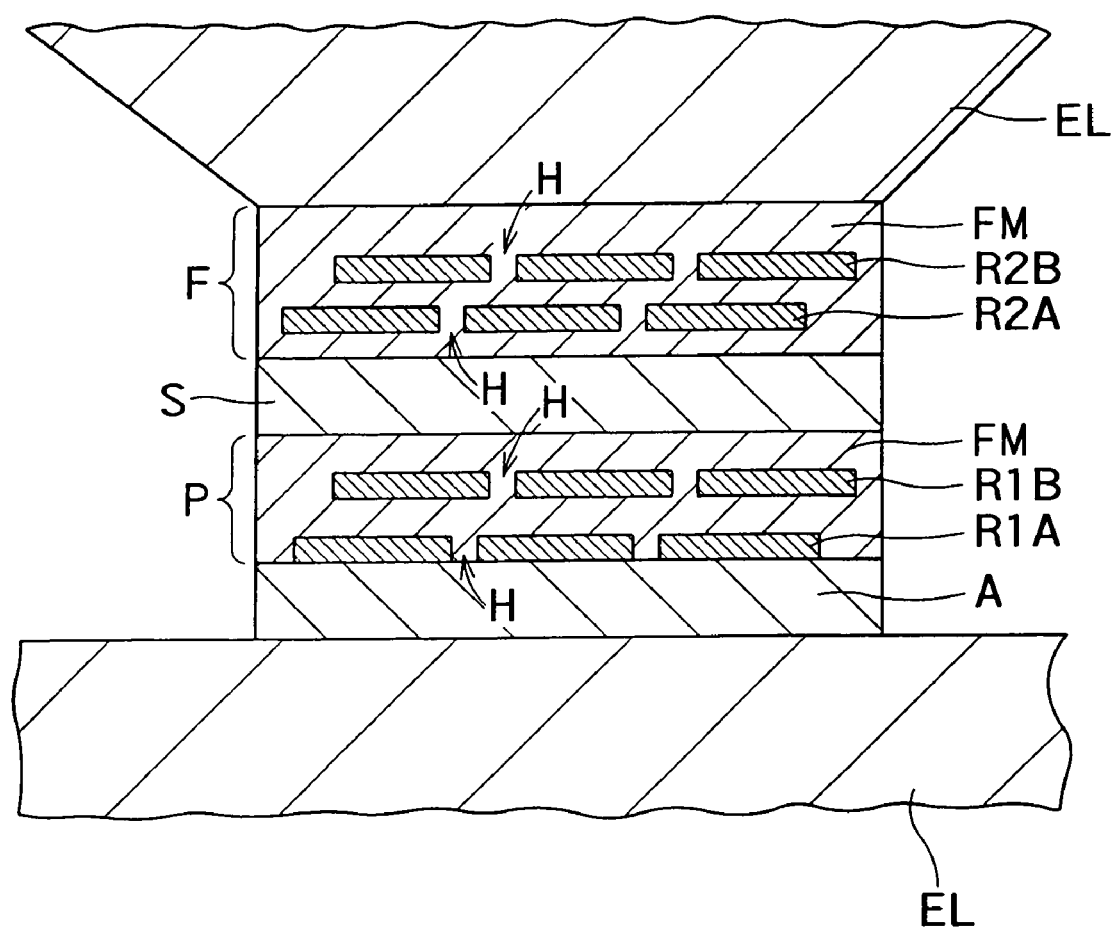
FIG. 6 is a conceptual drawing showing the construction of a magnetoresistance effect element which includes two or more resistance regulating layers R1A, R1B or R2A, R2B.

Each of the resistance regulating layers R1 and R2 in the stacked structure of ferromagnetic layer/electron reflective layer must not always comprise only one layer, and may include two or more resistance regulating layers R1A and R1B or resistance regulating layers R2A and R2B as illustrated in FIG. 6. By thus inserting the plurality of resistance regulating layers, it is possible to further reduce the simple transmission probability of electrons, so that it is possible to realize a CPP-SV having a higher resistance.

Figure 7:
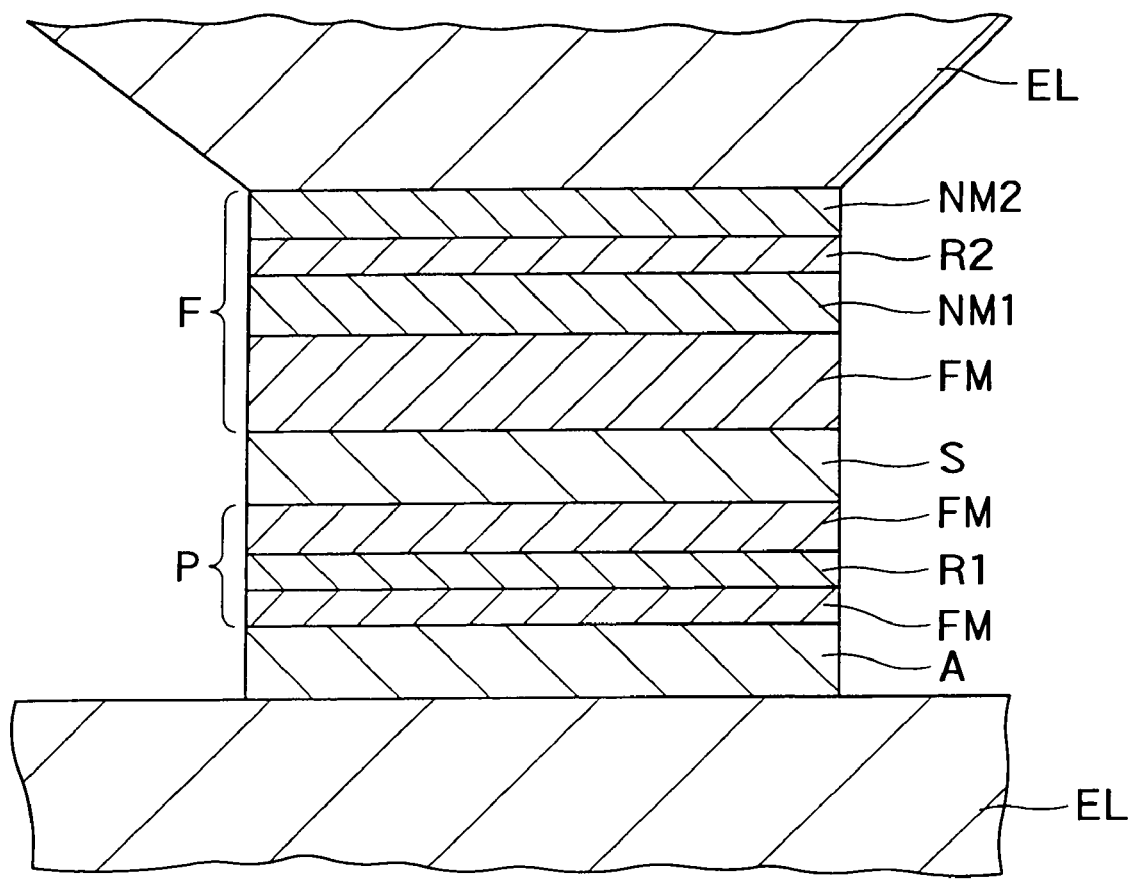
FIG. 7 is a conceptual drawing showing the construction of a magnetoresistance effect element wherein a resistance regulating layer is sandwiched between non-magnetic layers NM1 and NM2 without being inserted into a ferromagnetic layer FM.

On the side of the free layer F, the resistance regulating layer R2 may be sandwiched between non-magnetic layers NM1 and NM2 without being inserted into the ferromagnetic layer FM as illustrated in FIG. 7. Thus, it is possible to minimize the influence of the resistance regulating layer R2 on the magnetic characteristics of the free layer F, so that it is easy to be compatible with magnetically soft characteristics.

The ferromagnetic layers included in the above described first and second ferromagnetic layers P and F in this embodiment may be formed of, e.g., a simple substance of Co, a Co containing ferromagnetic material, an Ni base alloy such as NiFe alloy, or an Fe base alloy.

In this embodiment, the Fe base alloy is preferably a material which can easily obtain magnetically soft characteristics, such as Fe (iron), FeNi (iron nickel), FeCo (iron cobalt), FeSi (iron silicon), FeMo (iron molybdenum), or FeAl (iron aluminum).

The Co containing alloy may be an alloy of Co, to which one or more of Fe (iron, Ni (nickel), Au (gold), Ag (silver), Cu (copper), Pd (palladium), Pt (platinum), Ir (iridium), Rh (rhodium), Ru (ruthenium), Os (osmium) and Hf (hafnium) are added.

The amount of the additional element is preferably in the range of from 5 to 50 at %, and more preferably in the range of from 8 to 20 at %. Because there is the possibility that the bulk effect does not sufficiently increase if the amount of the additional element is too small and that the interface effect greatly decreases if the amount of the additional element is too large. In order to obtain a high rate of change in MR, the additional element is preferably Fe.

Figure 8:
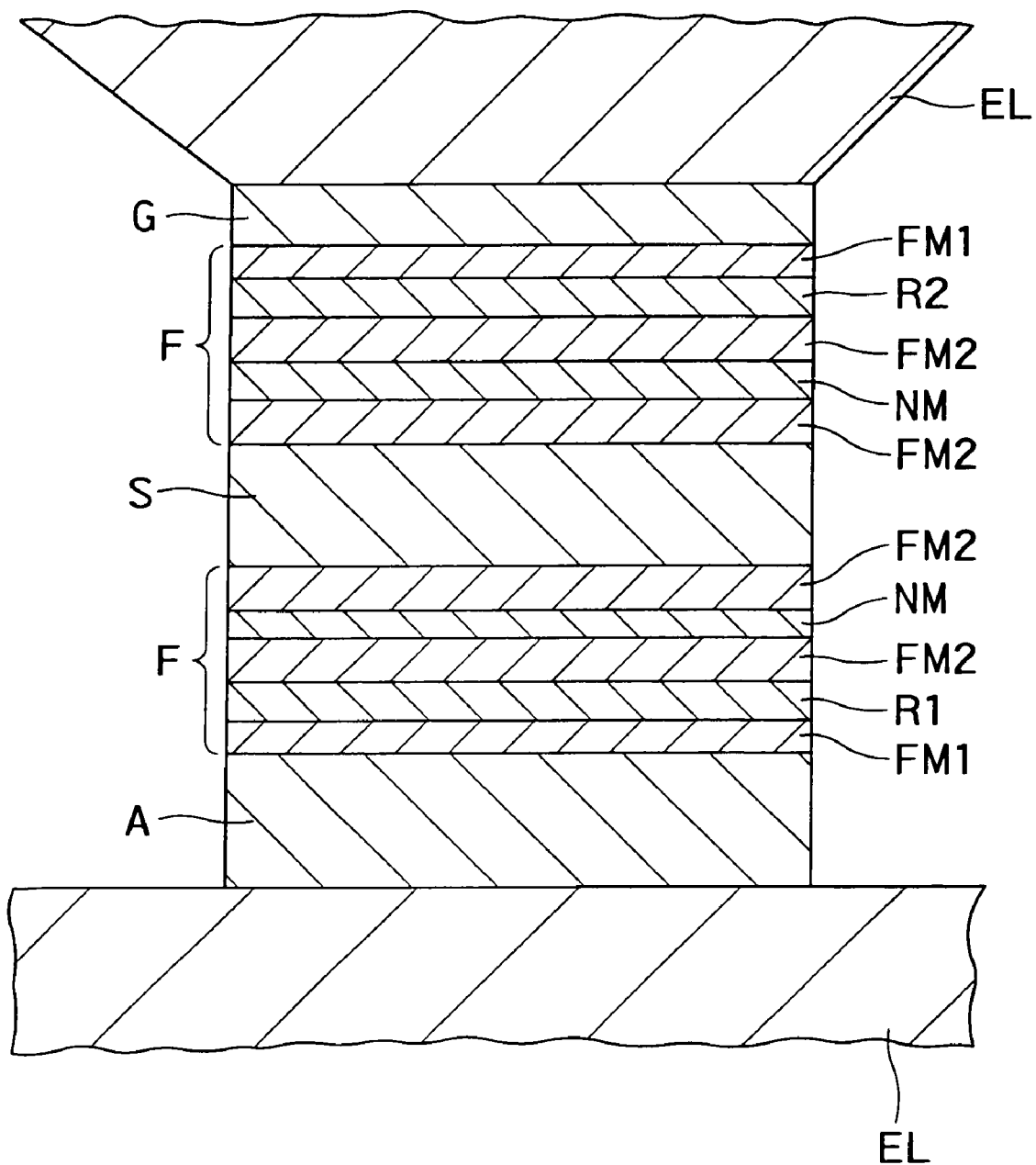
FIG. 8 is a conceptual drawing showing the construction of a magnetoresistance effect element which adopts a stacked structure of ferromagnetic films FM and non-magnetic films NM.

The ferromagnetic layers included in the first and second magnetic layers P and F in this embodiment may have a stacked structure of ferromagnetic layers FM and non-magnetic layers NM as illustrated in FIG. 8.

In this stacked structure of ferromagnetic layers FM/non-magnetic layers NM, the ferromagnetic layers FM sandwiching the non-magnetic layer NM therebetween are ferromagnetically coupled to each other, and the magnetization is substantially parallel to each other and substantially arranged in the same direction.

If the pinned layer P and the free layer F comprise films having the stacked structure illustrated in FIG. 8, electrons pass through a larger number of interfaces of ferromagnetic layers/non-magnetic layers. In the CPP spin-valve film, the effect of the scattering of electrons on the interfaces of ferromagnetic layers/non-magnetic layers, i.e., the interface resistance, has a large spin dependency and serves to increase the CPP-MR. In this example, it is possible to utilize a larger number of values of interface resistance, so that it is possible to obtain a higher resistance and a higher rate of change in resistance.

Furthermore, in FIG. 8, a high conductive layer G having a high electric conductivity is provided between the free layer F and the electrode EL.

The insertion of the resistance regulating layers R1 and R2 particularly has an effect on the increase of the resistance of the CPP spin-valve film, and the stacking of the pinned layer P and free layer F particularly has an effect on the increase the rate in MR. For that reason, by combining the two, it is possible to obtain a CPP spin-valve film which particularly has a high resistance and a high rate of change in MR.

As the film of the stacked structure of ferromagnetic layers FM/non-magnetic layers NM in this example, a large spin dependent interface resistance is preferably obtained on the interfaces of magnetic layers FM/non-magnetic layers NM. With respect to such combinations of ferromagnetic and non-magnetic materials, the ferromagnetic layers FM are preferably formed of an Fe base alloy, a Co base alloy or an Ni base alloy, and the non-magnetic layers NM are preferably formed of Cu, Ag, Au or an alloy thereof.

Alternatively, the non-magnetic layers NM may be particularly formed of a non-ferromagnetic metal, such as Rh (rhodium), Ru (ruthenium), Mn (manganese), Cr (chromium), Re (rhenium), Os (osmium) or Ir (iridium). In particular, the non-magnetic layers NM is preferably formed of Mn or Re.

The combinations providing a particularly large interface resistance, of these combinations, include Fe base alloy/Au, Fe base alloy/Ag, or Fe base alloy/Au—Ag alloy interface, Co base alloy/Cu, Co base alloy/Ag, Co base alloy/Au, or Co base alloy/Cu—Ag—Au alloy interface.

The thickness of the ferromagnetic layer FM included in the stacked structure of ferromagnetic layers FM/non-magnetic layers NM is preferably as thin as possible, in order to increase the magnetic stability of the pinned layer P and in order to decrease the Mst of the free layer F to sensitize it. The upper limit of the thickness is preferably 2 nm or less in order to increase the number of interfaces.

On the other hand, in order to suitably obtain the interface resistance, the combination of materials forming the stacked structure of ferromagnetic layers FM/non-magnetic layers NM is preferably a combination of non-solid-solution systems. That is the materials of the ferromagnetic layers FM and non-magnetic layers NM are not soluble in each other. However, it is not always required to be limited to combinations of non-solid-solution systems, in accordance with the required level.

Figure 9:
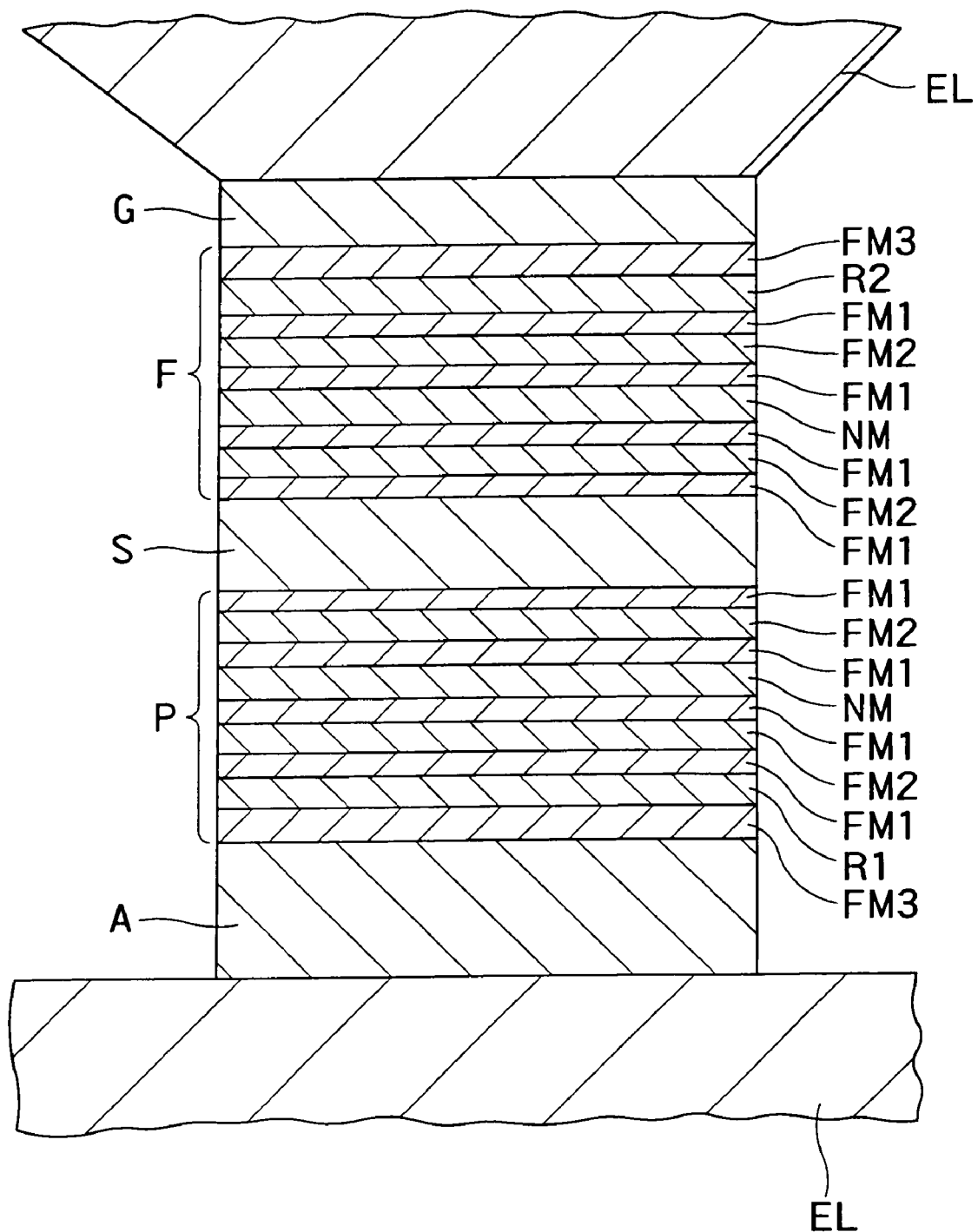
FIG. 9 is a conceptual drawing showing the construction of a magnetoresistance effect element which adopts a stacked film of two kinds or more of ferromagnetic materials.

The ferromagnetic layers FM in the stacked structure of ferromagnetic layers FM/non-magnetic layers NM in this example are not always required to be formed of one kind of material, but the ferromagnetic layers FM may be formed of a stacked film of two kinds or more of ferromagnetic materials. That is, in the example shown in FIG. 9, each of the pinned layer P and the free layer F has a construction wherein a first ferromagnetic layer FM1, a second ferromagnetic layer FM2 and a third ferromagnetic layer FM3 are stacked. However, the kind and number of the ferromagnetic layers, or the stacking order should not be limited to those in the figure.

For example, in the pinned layer P, an Fe/Au interface having a high interface resistance is preferably used. However, since Fe has a large fluctuation in spin, it is desired to inhibit the fluctuation in spin, in order to use it at room temperatures. For that reason, the ferromagnetic layers preferably have the stacked structure of Fe and a magnetic material, which has a small fluctuation in spin, such as Fe/CoFe/Fe or Fe/NiFe/Fe.

On the other hand, also in the free layer F, the Fe/Au interface having a high interface resistance is preferably used. However, it is difficult to obtain magnetically soft characteristics, which are required for the free layer, by only Fe. Therefore, the ferromagnetic layers preferably have the stacked structure of Fe and a magnetic material, which has excellent magnetically soft characteristics, such as Fe/CoFe/Fe or Fe/NiFe/Fe.

Also, the ferromagnetic layers in the stacked structure of ferromagnetic layers/resistance regulating layers are not always required to be formed of one kind of material.

Figure 10:
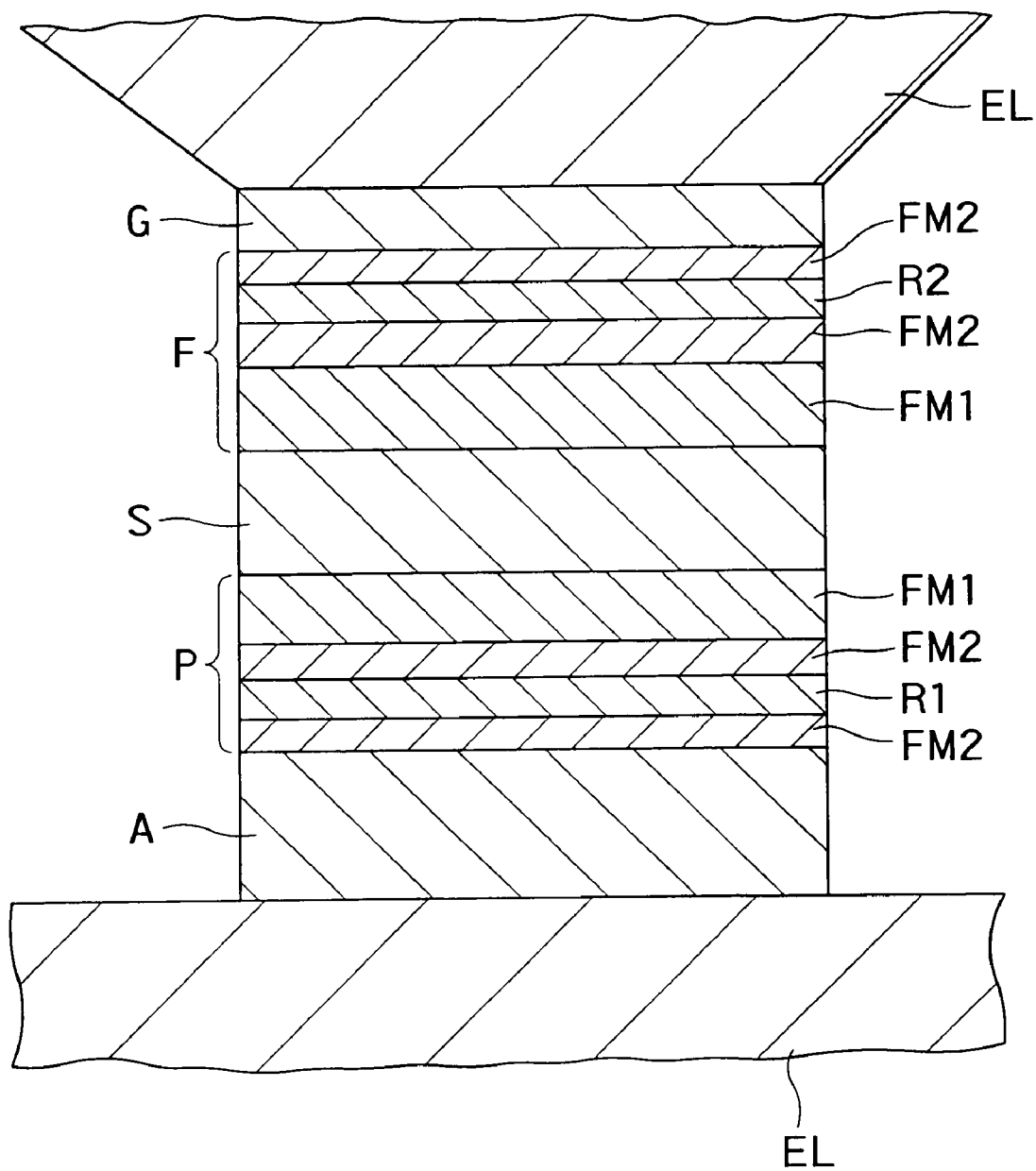
FIG. 10 is a conceptual drawing illustrating the construction of a magnetoresistance effect element wherein ferromagnetic layers sandwiching resistance regulating layers comprises two or more kinds of ferromagnetic layers.

FIG. 10 is a conceptual drawing illustrating the construction of a magnetoresistance effect element wherein ferromagnetic layers sandwiching resistance regulating layers comprises two or more kinds of ferromagnetic layers. That is, in the example shown in this figure, each of the pinned layer P and the free layer F has a first ferromagnetic layer FM1 and a second ferromagnetic layer FM2.

For example, although an Fe/Au interface having a high interface resistance is preferably used in the free layer F, it is difficult to obtain magnetically soft characteristics, which are required for the free layer, by only Fe. On the other hand, it is possible to improve magnetically soft characteristics by adding a magnetic layer of a magnetic material having excellent magnetically soft characteristics, such as CoFe or NiFe, which is ferromagnetically coupled as a ferromagnetic layer.

In addition, when the ferromagnetic layers FM in the stacked structure of ferromagnetic layers FM/non-magnetic layers NM contain Fe or an Fe base alloy, the crystal structure thereof is preferably the face-centered cubic (fcc) structure. Because the stacked structure can be more stable when a metal having the fcc structure, such as Au, Ag or Cu, is stacked and because the stacked structure can have good crystalline properties as a whole to improve magnetically soft characteristics and reduce fluctuation in spin. However, the bcc structure can also be used.

Figure 11:
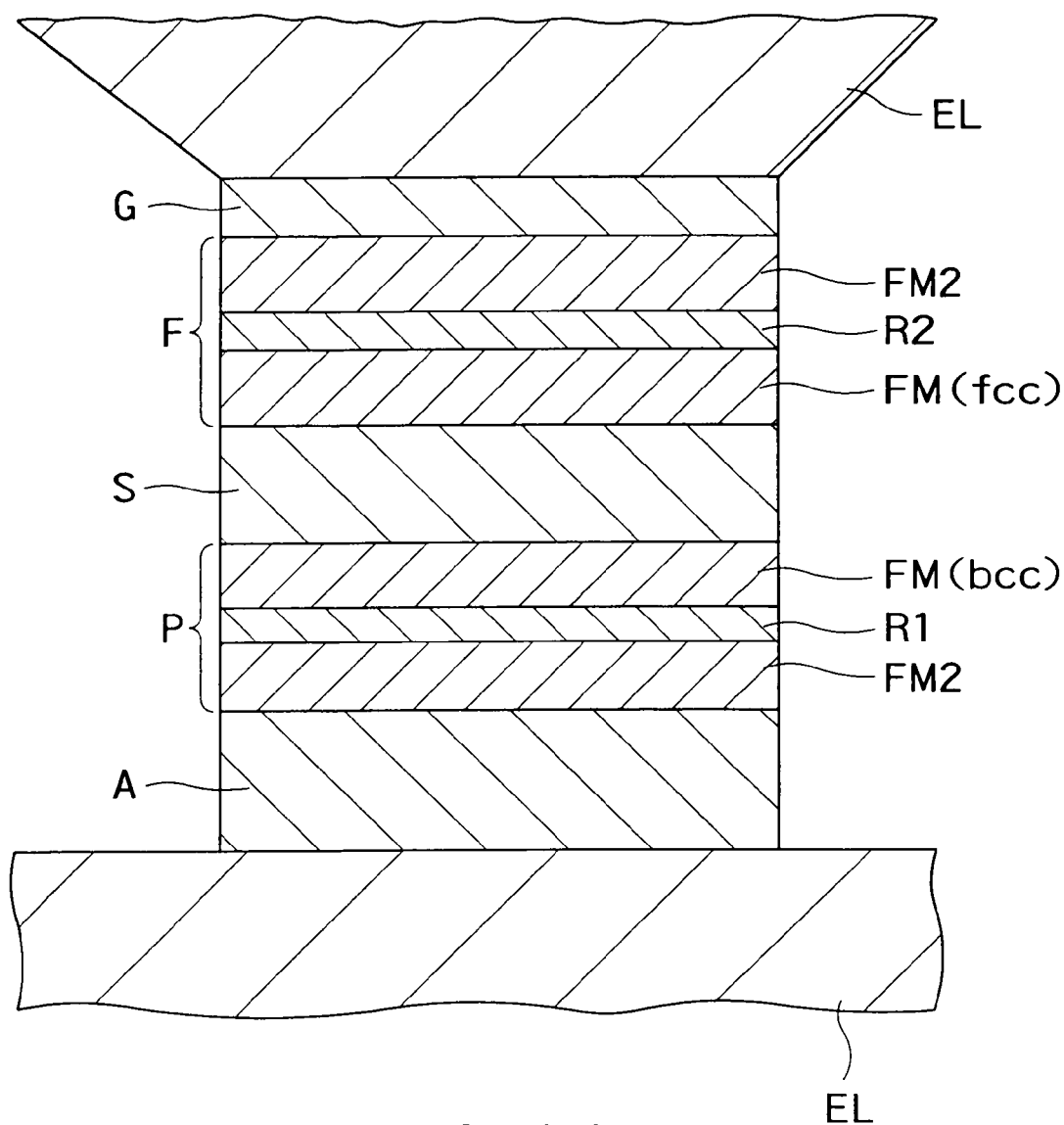
FIG. 11 is a conceptual drawing showing the construction of a magnetoresistance effect element wherein a ferromagnetic layer FM (fcc) having the fcc structure and a ferromagnetic layer FM (bcc) having the bcc structure are combined.

In particular, when two kinds of ferromagnetic materials are combined as the ferromagnetic layers in the stacked structure of ferromagnetic layers/non-magnetic layers, a ferromagnetic layer FM(fcc) having the fcc structure can be combined with a ferromagnetic layer FM(bcc) having the bcc structure as illustrated in FIG. 11. In such a combination, the state of electrons, the shape of the Fermi surface, and the distribution of state density of the ferromagnetic material FM(fcc) having the fcc structure are greatly different from those of the ferromagnetic material FM(bcc) having the bcc structure. For that reason, it is possible to obtain a considerable screen effect with respect to conduction electrons, so that it is possible to obtain a high resistance and a high rate of change in MR. As shown in the figure, the first magnetic layer P may be formed of ferromagnetic layers having the bcc structure, and the second magnetic layer F may be formed of ferromagnetic layers having the fcc structure. Even if the pinned layer P and free layer F thus have different crystal structures, it is possible to obtain a large screen effect.

Figure 12:
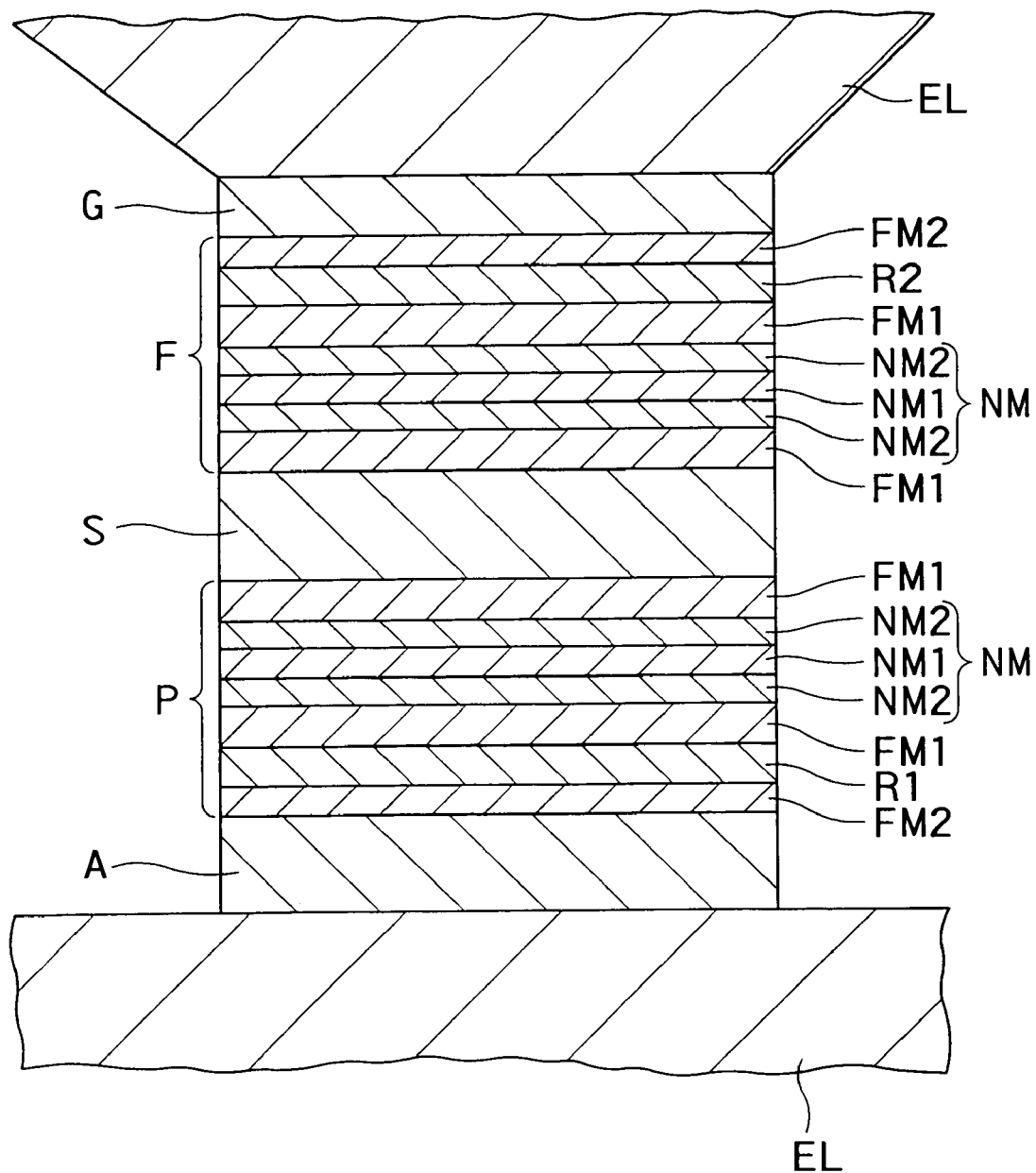
FIG. 12 is a conceptual drawing showing the construction of a magnetoresistance effect element wherein non-magnetic layers NM have a stacked structure of first and second non-magnetic layers NM1 and NM2.

In addition, according to an aspect of the present invention, the ferromagnetic layers must be ferromagnetically coupled to each other in the stacked structure of ferromagnetic layers/non-magnetic layers constituting the pinned layer P and free layer F. For that purpose, it is required to form a good stacked structure. In addition, the magnetic characteristics of the pinned layer P and free layer F can be improved by adjusting the crystal lattice constant in the stacked structure to be the optimum value. Therefore, the non-magnetic layers NM can also have a stacked structure of, e.g., a first non-magnetic layer NM1 and second non-magnetic layers NM2 as illustrated in FIG. 12. For example, if the non-magnetic layers NM have a stacked structure of Au layer/Cu layer/Au layer, it is possible to realize a good lattice constant while realizing a high interface resistance, and it is possible to obtain good magnetic characteristics.

Figure 13:
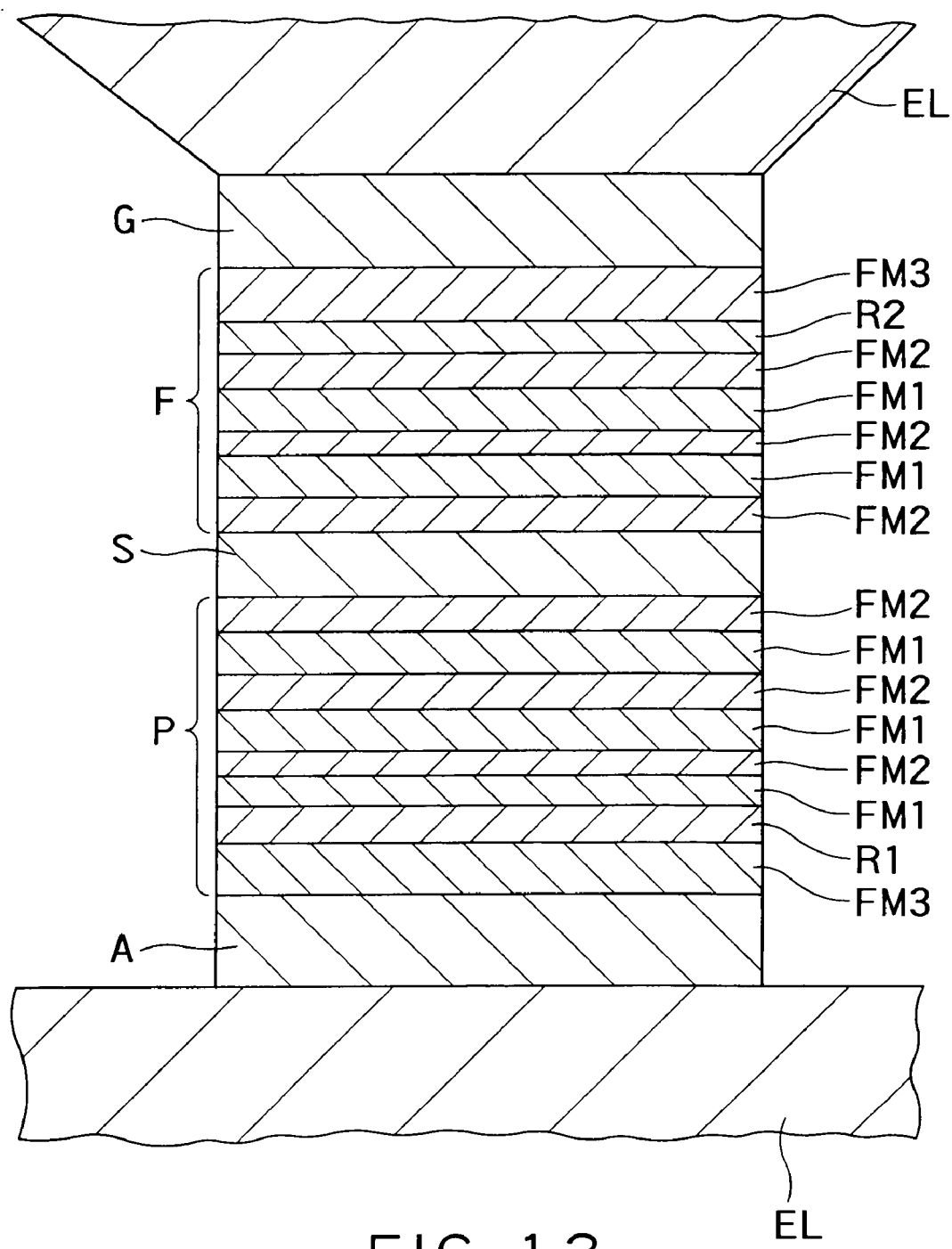
FIG. 13 is a conceptual drawing showing the construction of a magnetoresistance effect element which adopts a stacked structure of ferromagnetic layer FM1/ferromagnetic layer FM2.

The ferromagnetic layers FM included in the first and second magnetic layers P and F according to the present invention may have a stacked structure of ferromagnetic layers FM1/ferromagnetic layers FM2 as illustrated in FIG. 13. In this stacked structure of ferromagnetic layers FM1/ferromagnetic layers FM2, the ferromagnetic layers are ferromagnetically coupled to each other, and the magnetization is substantially parallel to each other and substantially arranged in the same direction.

If the pinned layer P and the free layer F comprise films having such a stacked structure, electrons pass through a larger number of interfaces of ferromagnetic layers/ferromagnetic layers. In the CPP spin-valve film, the effect of the scattering of electrons on the interfaces of ferromagnetic layers ferromagnetic layers, i.e., the interface resistance, has a large spin dependency and serves to increase the CPP-MR. In this example, it is possible to utilize a larger number of values of interface resistance, so that it is possible to obtain a higher resistance and a higher rate of change in resistance.

The insertion of the resistance regulating layers R1 and R2 particularly has an effect on the increase of the resistance of the CPP spin-valve film, and the stacking of the pinned layer P and free layer F particularly has an effect on the increase the rate in MR. For that reason, by combining the two, it is possible to obtain a CPP spin-valve film which particularly has a high resistance and a high rate of change in MR.

In this example, a large number of interfaces of ferromagnetic layers/ferromagnetic layers can be arranged in the pinned layer P and free layer F, and it is possible to utilize a larger number of values of interface resistance, so that it is possible to form a CPP-SV having a high resistance and a high rate of change in MR.

In addition, since the magnetization of the pinned layer P and the magnetization of the free layer F are operated so as to be integrated, the magnetization can be controlled only by the magnetization fixed of the pinned layer P and the control of the magnetization of one free layer F. Therefore, when the element is used for a reading sensor, such as a magnetic head, it is possible to realize a magnetic head wherein Barkhausen noises are suppressed.

Each of the ferromagnetic layers constituting the stacked structure of ferromagnetic layers/ferromagnetic layers in this example may be formed of, e.g., a simple substance of Co, a Co containing ferromagnetic material such as a Co containing magnetic alloy, a ferromagnetic material such as NiFe alloy, or an Fe base alloy.

As a combination in which the interface resistance is particularly high, any one of NiFe alloy/CoFe alloy, Fe base alloy/NiFe alloy, and Fe base alloy/CoFe alloy is preferably used.

The thickness of the ferromagnetic layer included in the stacked structure of ferromagnetic layers/ferromagnetic layers is preferably as thin as possible, in order to increase the number of interfaces without increasing the total Mst. In a combination capable of holding magnetic properties, the ferromagnetic layer may be a monatomic layer. The upper limit of the thickness is preferably 2 nm or less, in order to increase the number of interfaces.

On the other hand, the thickness of the ferromagnetic layer included in the stacked structure of ferromagnetic layers/ferromagnetic layers is preferably 1 nm or less, in order to increase the number of interfaces as much as possible. Even if the ferromagnetic layer comprises a monatomic layer as the lower limit thereof, it is possible to produce interface resistance.

In order to suitably obtain the interface resistance, the combination of materials forming the stacked structure of ferromagnetic layers/ferromagnetic layers is preferably a combination of non-solid-solution systems. However, the combination should not always be limited to the combination of non-solid-solution systems, and the combination can be suitably determined.

Figure 14:
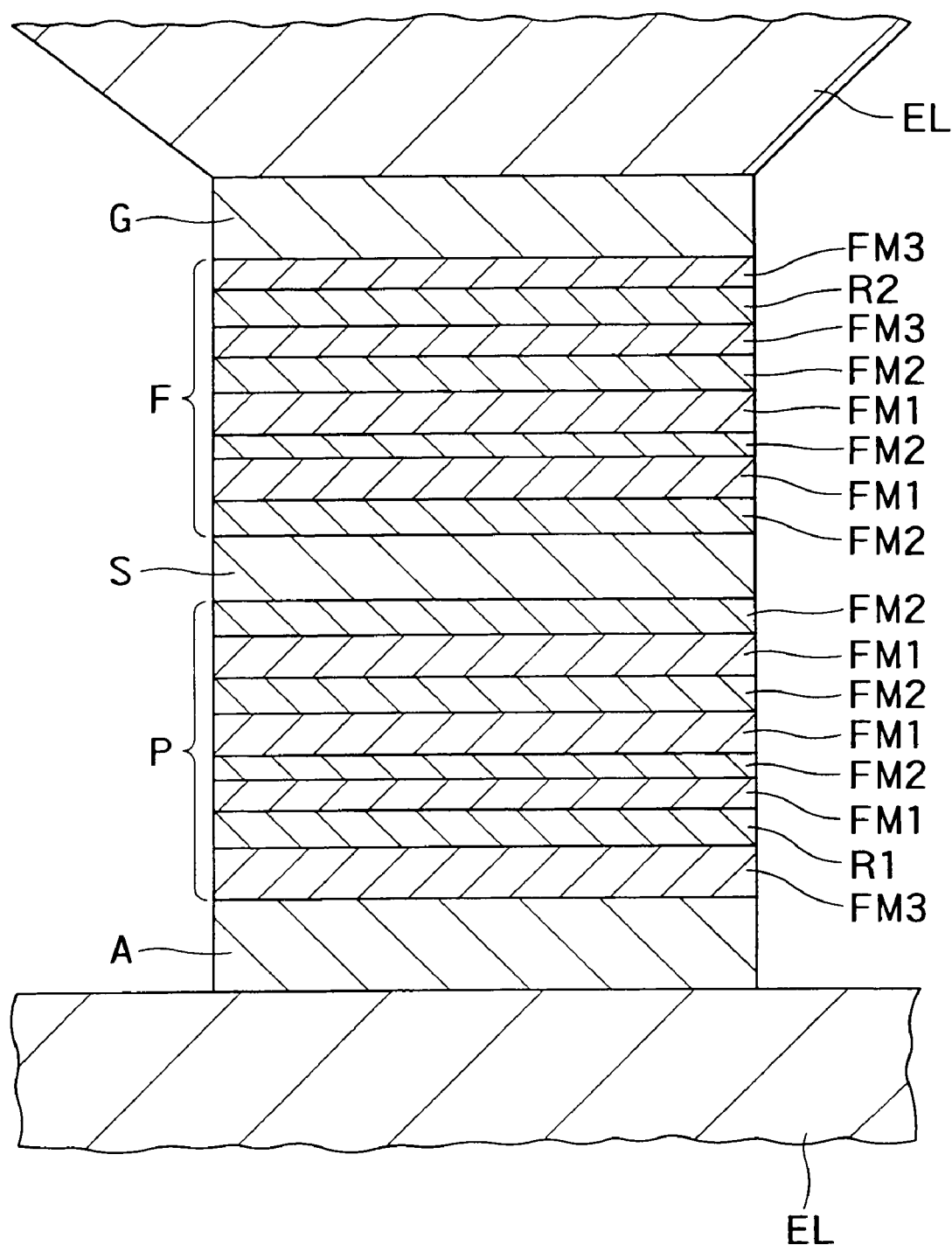
FIG. 14 is a conceptual drawing showing another example of a magnetoresistance effect element which has a plurality of ferromagnetic layers.

FIG. 14 is a conceptual drawing showing another example where the pinned layer or the free layer has a plurality of ferromagnetic layers. That is, in the example shown in this figure, each of the pinned layer P and the free layer F has the stacked structure of first ferromagnetic layers FM1 and second ferromagnetic layers FM2, and a third ferromagnetic layer FM3 is provided in the vicinity of each of the electron reflective layers R1 and R2.

For example, in the free layer F, the Fe/CoFe interface having a high interface resistance is preferably used. However, it is difficult to obtain magnetically soft characteristics, which are required for the free layer, by only Fe. Therefore, the magnetically soft characteristics can be improved by adding a magnetic material having excellent magnetically soft characteristics, such as NiFe, which is ferromagnetically coupled, as the ferromagnetic layer FM3.

When the ferromagnetic layer in the stacked structure of ferromagnetic layers/ferromagnetic layers contains Fe or an Fe base alloy, the ferromagnetic layer preferably has the fcc structure. Because the stacked structure can be more stable when a metal having the fcc structure, such as CoFe or NiFe, is stacked and because the stacked structure can have good crystalline properties as a whole to improve magnetically soft characteristics and reduce fluctuation in spin. However, the bcc structure can also be used.

As a combination of two kinds of ferromagnetic layers, a ferromagnetic material having the fcc structure can be combined with a ferromagnetic material having the bcc structure. As described above referring to FIG. 11, in such a combination, the state of electrons, the shape of the Fermi surface, and the distribution of state density of the ferromagnetic material having the fcc structure are greatly different from those of the ferromagnetic material having the bcc structure. For that reason, it is possible to obtain a considerable screen effect with respect to conduction electrons, so that it is possible to obtain a high resistance and a high rate of change in MR.

By the way, in the CPP-SV, the scattering of electrons occurs when conduction electrons pass through the pinned layer P and the free layer F. If the pinned layer P or the free layer F is multilayered, the modulation of band potential based on the multilayered cycle is carried out. Therefore, the wave number vector of electrons capable of flowing in a direction perpendicular to the plane of the film is restricted in accordance with the modulation of band potential. The restricted wave number varies in accordance with the cycle of the multilayered structure. Therefore, the wave number of electrons capable of passing through both layers can be greatly restricted by changing the multilayered cycles in the pinned layer P and free layer F. Since the screen effect itself has the spin dependent effect, it is possible to hold a high spin dependency while maintaining a low transmission probability of electrons as a whole. That is, if the stacking cycles in the pinned layer P and free layer F are intentionally caused to be different from each other, it is possible to realize a CPP-SV capable of realizing a high rate of change in MR while maintaining a higher resistance.

On the other hand, the non-magnetic intermediate layer S is preferably formed of a material, in which the mean free path of conduction electrons is long, such as Cu (copper), Au (gold) or Ag (silver). By using such a material, electrons can varistically conduct between the first ferromagnetic layer P and the second ferromagnetic layer F, so that it is possible to more effectively utilize the scattering effect of electrons depending on spin, which is caused by the ferromagnetic material. Thus, it is possible to obtain a higher rate of change in MR. Alternatively, the non-magnetic intermediate layer S may be formed of an alloy of the above described three kinds of elements. In this case, the composition is preferably adjusted so that the crystal lattice constant in the stacked structure can be adjusted to be the optimum value.

Figure 15:
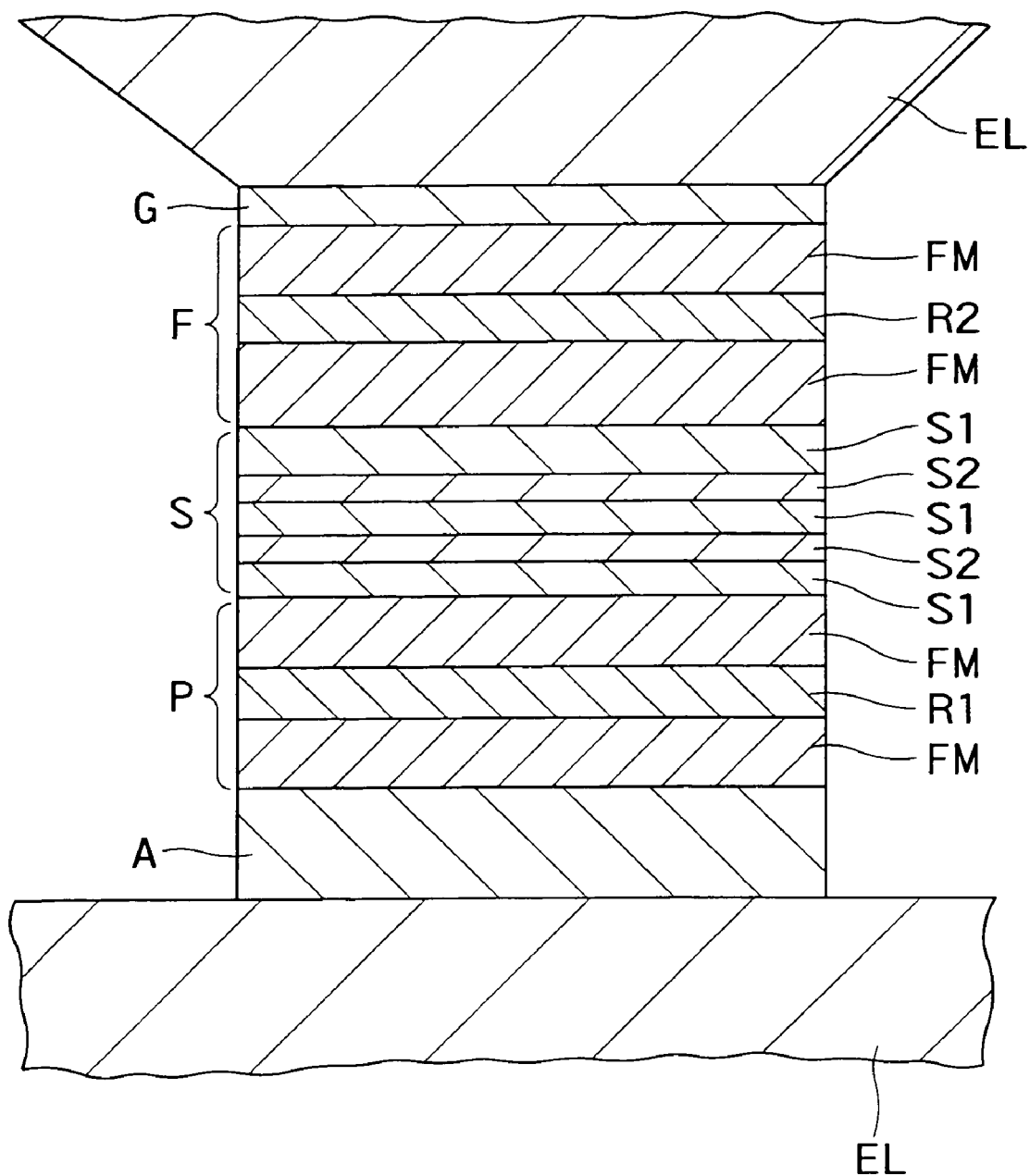
FIG. 15 is a conceptual drawing showing another example of a magnetoresistance effect element which has a plurality of ferromagnetic layers.

As shown by the sectional structure in FIG. 15, the non-magnetic intermediate layer S may have the stacked structure of non-magnetic layer S1/non-magnetic layer S2 wherein a material, such as Cu, Au or Ag, is stacked. In this case, if the stacking cycle of the stacked structure of non-magnetic layer S1/non-magnetic layer S2, and the stacking cycle of the pinned layer p or the free layer F are suitably set, the wave number vector of electrons capable of flowing through the whole CPP-SV in a direction perpendicular to the plane of the film can be restricted, so that it is possible to realize a CPP-SV capable of realizing a higher resistance and a higher rate of change in MR.

On the other hand, the antiferromagnetic layer A is preferably formed of a metallic antiferromagnetic material having excellent magnetization fixed characteristics. Specifically, an antiferromagnetic material, such as PtMn, NiMn, FeMn or IrMn, may be used. The thickness of the antiferromagnetic layer A is preferably as thin as possible from the standpoint of electric characteristics. However, if the antiferromagnetic layer A is too thin, the magnetization fixed characteristics deteriorate, so that it is required to select such a thickness that the blocking temperature does not decrease. For that reason, the thickness is preferably 5 nm or more.

Figure 16:
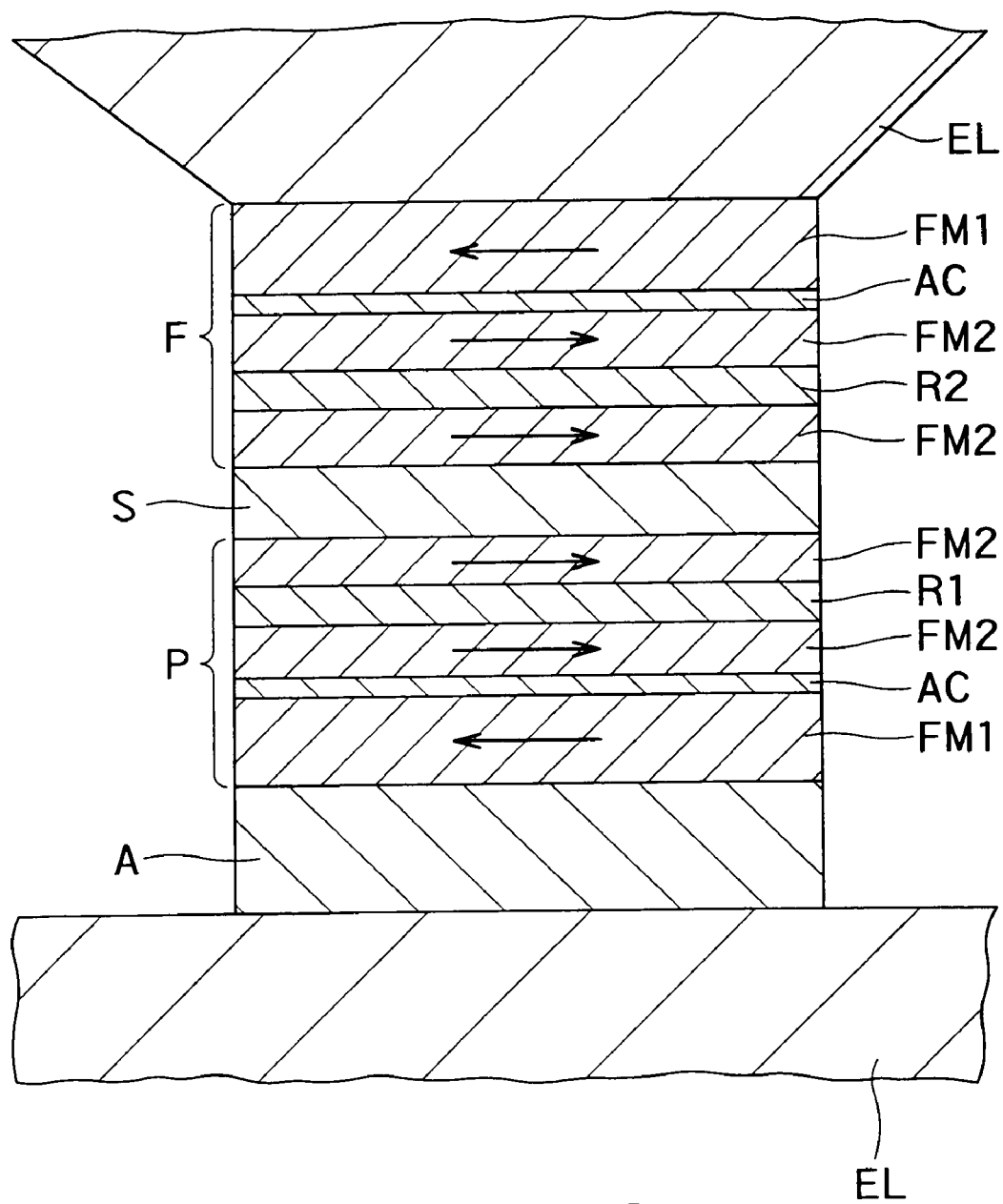
FIG. 16 is a conceptual drawing showing the construction of a magnetoresistance effect element having a so-called synthetic antiferromagnetic structure.

In addition to the above described construction, a so-called synthetic antiferromagnetic structure may be adopted as illustrated in FIG. 16. This is a structure wherein a pair of ferromagnetic layers FM1 and FM2 antiferromagnetically coupled to each other via an antiferromagnetic coupling layer AC are added in any one or both of the first magnetic layer P and the second magnetic layer F. By adopting such a synthetic construction, the apparent magnetization can be zero in the pinned layer P, so that the magnetization fixed in the pinned layer P can be more stable. In addition, by decreasing the apparent magnetization in the free layer F, it is possible to obtain a more sensitive response to external magnetic field.

Moreover, in addition to the above described construction, a so-called dual construction wherein the pinned layer P comprises two layers may be adopted.

Figure 17:
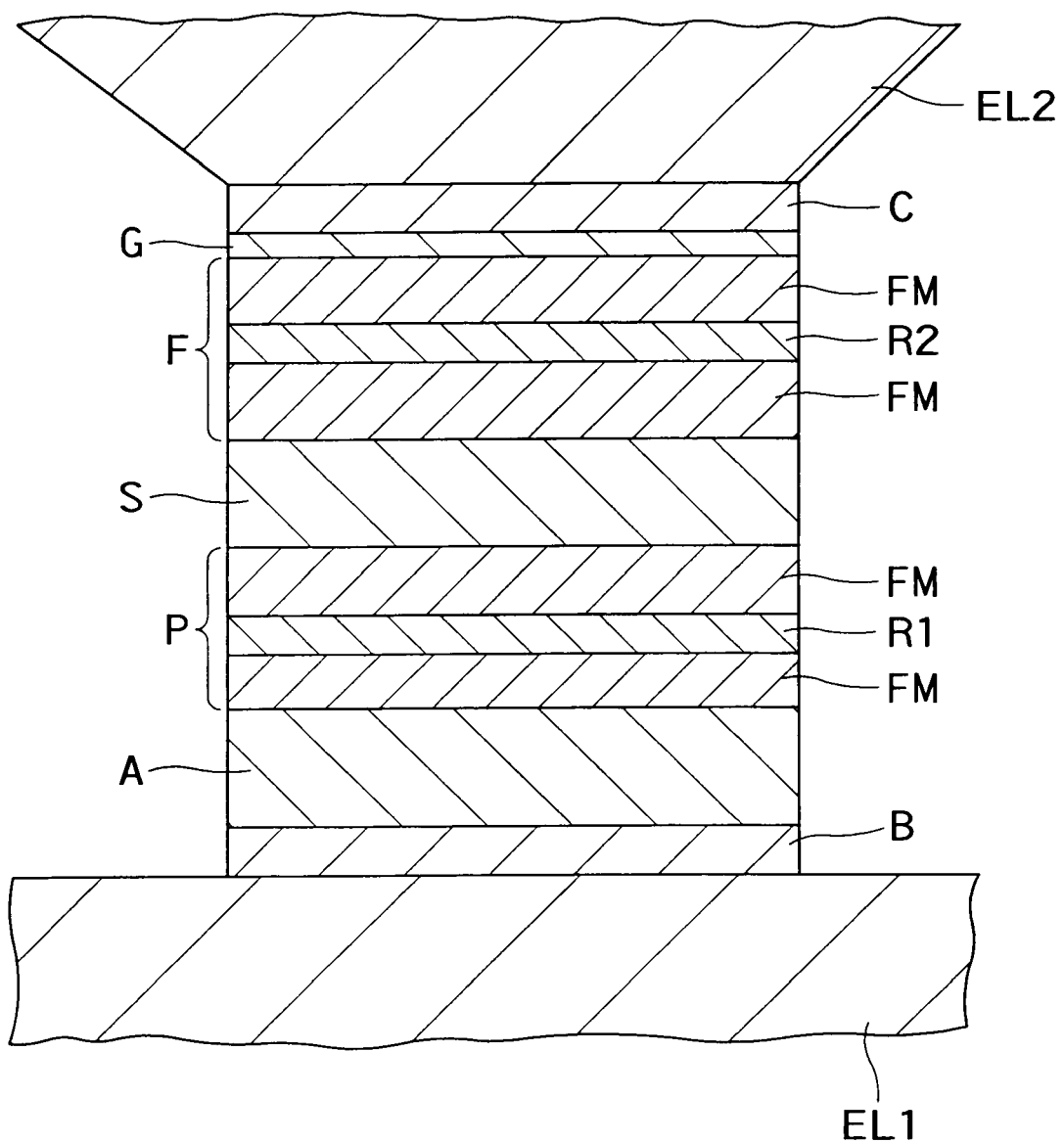
FIG. 17 is a conceptual drawing showing the construction of a magnetoresistance effect element which adopts an underlying layer (buffer layer) B and a protective layer C.

On other hand, although any special layers have not been arranged between the electrode EL and the spin-valve film in the above described examples, an underlying layer (buffer layer) B is preferably formed between the bottom electrode EL1 and the antiferromagnetic layer A as illustrated in FIG. 17 in order to improve smoothness and crystalline properties when an actual element is formed. In addition, a layer C to be a protective layer is preferably arranged between the top electrode EL2 and the free layer F. The underlying layer B and the protective layer C are preferably formed of a material having a good wetting property, such as Ta (tantalum), Ti (titanium) or Cr (chromium), a material having a low electric resistance and a stable fcc structure, such as Cu, Au or Ag, or a stacked structure thereof.

Second Embodiment

Figure 18:
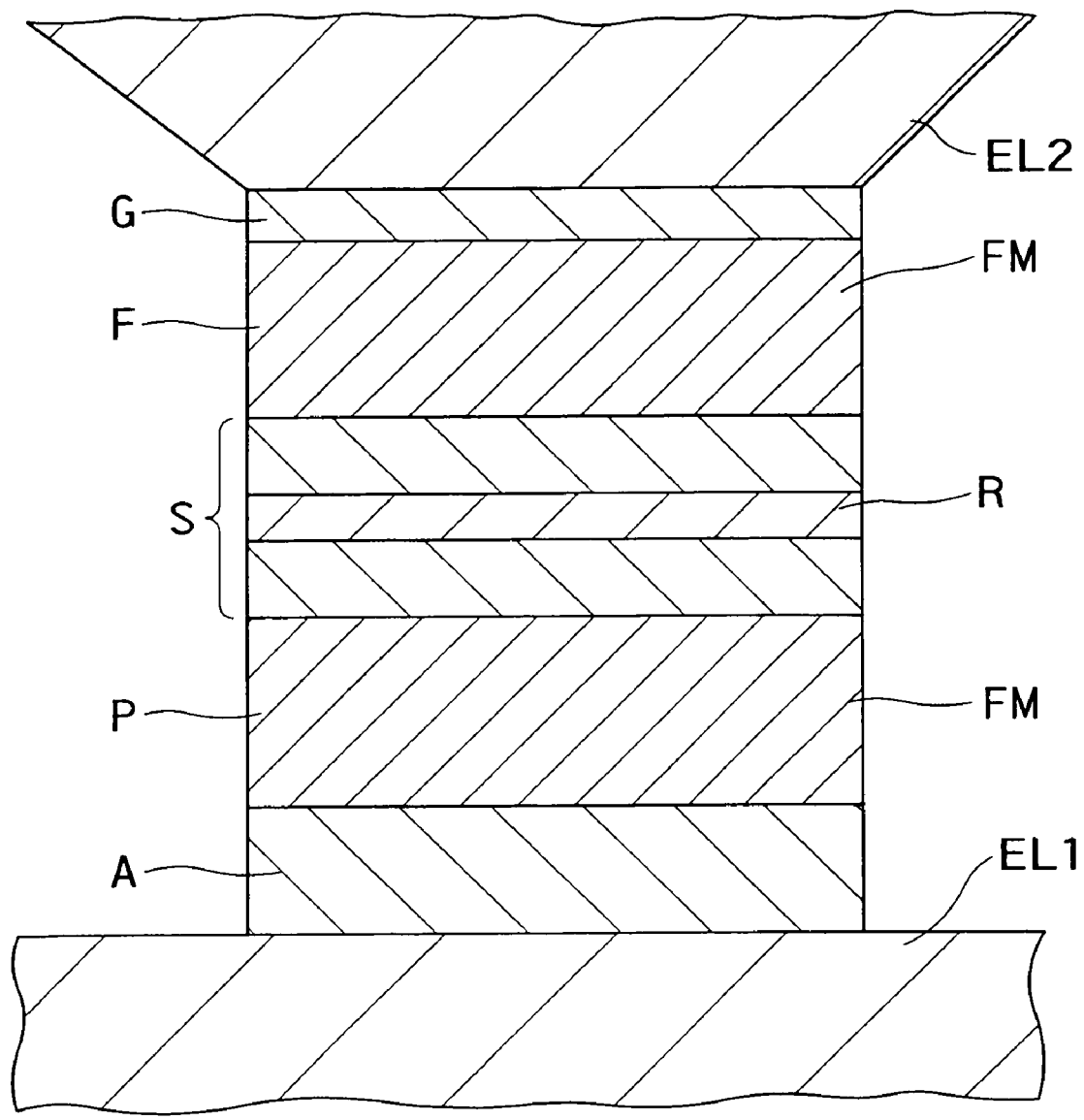
FIG. 18 is a conceptual drawing showing a cross-sectional structure of the second embodiment of a magnetoresistance effect element according to an aspect of the present invention.

FIG. 18 is a conceptual drawing showing a cross-sectional structure of the second embodiment of a magnetoresistance effect element according to an aspect of the present invention. In this figure, the same reference numbers are given to the same elements as those described above referring to FIGS. 1 through 17, and the detailed descriptions thereof are omitted.

The magnetoresistance effect element in this embodiment also comprises an antiferromagnetic layer A, a first magnetic layer P, an non-magnetic intermediate layer S and a second magnetic layer F which are stacked on a predetermined substrate in that order, and a sense current I is caused to flow in a direction perpendicular to the plane of the film. Furthermore, the antiferromagnetic layer A, the first magnetic layer P, the non-magnetic intermediate layer S and the second magnetic layer F constitute a magnetoresistance effect film.

In addition, in this embodiment, a resistance regulating layer R is inserted into the non-magnetic intermediate layer S.

In this embodiment, although the current I flows from the top electrode EL2 toward the bottom electrode EL1, the quantity of current is reduced by the resistance regulating layer R. Thus, the probability that electrons will pass through the CPP spin-valve structure decreases, so that it is possible to greatly increase the electric resistance as a whole.

In this embodiment, although it is possible to greatly increase the electric resistance as a whole since the transmission probability of electrons decreases, it is possible to hold a high rate of change in MR since the scattering effect depending on spin is not damaged.

By the above described effects, it is possible to provide a CPP spin-valve film suitably utilizing an interface resistance and having an appropriate value of resistance though it has a spin-valve construction.

Also in this embodiment, since the magnetization of the pinned layer P and the magnetization of the free layer F are operated so as to be integrated, the magnetization can be controlled only by the magnetization fixed of the pinned layer P and the control of the magnetization of one free layer F. Therefore, when the element is used for a reading sensor, such as a head, it is possible to realize a magnetic head wherein Barkhausen noises are suppressed.

Also in this embodiment, it is possible to obtain a good value of resistance and a good rate of change in MR while the total thickness of the pinned layer P and free layer F is small. That is, as compared with conventional simple CPP spin-valve constructions, this construction can reduce the simple transmission probability of electrons, increase the value of resistance and sufficiently utilize the interface resistance. Therefore, in a region wherein the total Mst of the pinned layer P and free layer F is small, it is possible to obtain a sufficient value of resistance and a sufficient rate of change in MR. Specifically, although the thickness of the magnetic material of the pinned layer P and free layer F must be about 20 nm in conventional constructions, this embodiment can obtain sufficient characteristics even if the total thickness of the magnetic layers is 5 nm or less. Thus, the Mst of the free layer F can be held to be a small value, so that it is possible to form a sensitive spin-valve element.

In addition, since it is also possible to decrease the Mst of the pinned layer P, it is possible to improve the magnetization fixed characteristics by the antiferromagnetic layer A, so that it is possible to improve the reliability of the device.

In this embodiment similar to the above described first embodiment, the resistance regulating layer R may be formed of a semimetal, such as Bi, Sb or C, or a so-called zero gap semiconductor, such as ZnSe. In these materials unlike insulating materials, conduction electrons exist, but the density thereof is vary small, so that potential sensed by the conduction electrons is vary small. Specifically, as described above, a metal, such as Cu, has a Fermi potential of about 7 eV, whereas a semimetal has a small Fermi potential of 1 eV or less.

For that reason, if the semimetal or zero gap semiconductor is provided in a metal layer, a large difference in potential level occurs, so that conduction electrons are reflected. In this construction, since conduction electrons also exist in the resistance regulating layer, the conduction probability of conduction electrons is sufficiently larger than the transmission probability of electrons due to tunnel, so that the usual conduction controls the total value of resistance. For that reason, it is possible to make resistance lower than that in the case of a ferromagnetic tunnel junction, so that it is possible to obtain a good element resistance in a fine junction.

The value of Fermi potential in these materials is preferably in the range of from 1 eV to 0 ev, and more preferably in the range of 0.5 eV to 0 eV. The reason for this has been described above with respect to the first embodiment.

The resistance regulating layer R in this embodiment may be also formed of Au, Ag or an alloy thereof. However, in this case, it is difficult to form so great difference in potential level, so that it is difficult to greatly increase resistance.

The resistance regulating layer R in this embodiment may be also formed of an insulating material which has a potential barrier having a relatively low height. In this case, since the transmission probability of electrons is determined by the tunnel probability, the element resistance is too high if the barrier height increases. From this standpoint, the barrier height is preferably 0.1 eV or less.

The resistance regulating layer R in this embodiment may be formed of an insulating material having pin holes as described above referring to FIGS. 4 through 6. In this case, the transmission probability of electrons is determined by the size and density of pin holes. If the size of the pin holes is about the mean free path of electrons or less, it is possible to obtain a greater resistance increasing effect. From the standpoint of repeatability of element characteristics, at least about 10 pin holes are preferably formed in the area of the element. However, only one pin hole may exist in the element. The ratio of the total area of the pin holes to the area of the element is preferably 50% or less in order to increase the element resistance.

In this case, since the transmission probability of electrons is determined by the electric conduction through the pin holes, the resistance regulating layer R may be formed of an insulating material having a high barrier height, e.g., Al oxide or Si oxide. However, the resistance regulating layer R may be formed of a material having a low barrier height, such as Co oxide, Ni oxide or Cu oxide. Also in that case, the electric conduction is controlled by the pin holes.

The thickness of the insulating layer in this embodiment is preferably set to be in the range of from 0.5 nm to 10 nm in order to facilitate the formation of the pin holes.

As a method for forming such an insulating layer having pin holes, various methods described above in the first embodiment may be used. That is, the insulating layer may be formed by a method for forming a very thin layer of Al by the sputtering method or the like, and then, exposing the layer of Al to an atmosphere of oxygen for a short period of time to carry out a natural oxidation. Alternatively, the insulating layer may be formed by a method for applying energy to a layer of Al by exposing it to oxygen plasma or irradiating it with oxygen ions or oxygen radicals. Alternatively, a material which is relatively easy to be oxidized, and a material which is difficult to be oxidized, such as Al—Au, may be simultaneously deposited to form a granular film of Al—Au as a layer to be oxidized, and the formed layer may be exposed to selectively oxidize only Al to form the insulating layer. Alternatively, the oxidized layer having pin holes may be formed by depositing a film in an atmosphere of oxygen.

As another method for forming such insulating layer having pin holes, regularly arranged pin holes may be formed by the fine pattern lithography using the AFM or the like or by the self-organizing. The details thereof are the same as those described above in the first embodiment.

On the other hand, the resistance regulating layer R in this embodiment is not always required to comprise only one layer, but it may have a stacked construction of two or more layers. In addition, a plurality of resistance regulating layers R, not only one resistance regulating layer R, may be provided in the non-magnetic intermediate layer S. By thus inserting the plurality of resistance regulating layers R into the non-magnetic intermediate layer S, it is possible to further reduce the simple transmission probability of electrons, so that it is possible to form a CPP spin-valve element having a higher resistance.

Moreover, the construction in this embodiment may be combined with any one of the above described various constructions in the first embodiment of the present invention. Thus, it is possible to form a CPP spin-valve film having a higher resistance.

Figure 19:
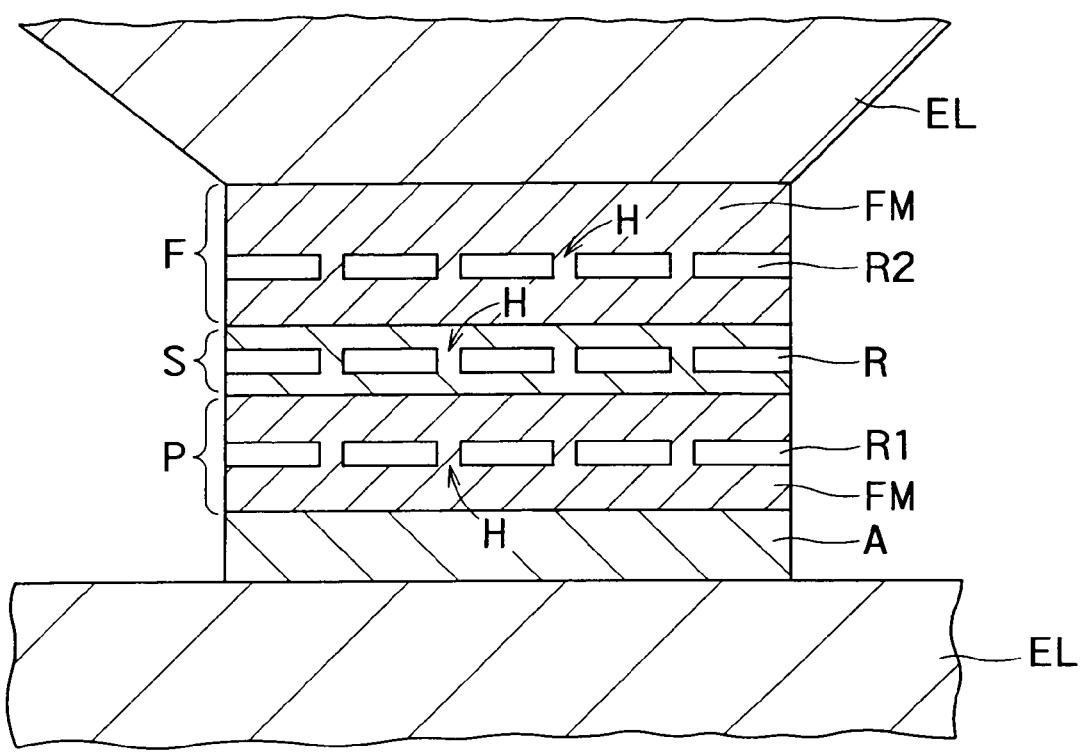
FIG. 19 is a conceptual drawing showing the construction of a magnetoresistance effect element wherein pin holes are arranged at the same place between the respective resistance regulating layers.

In the combination of the second embodiment with the first embodiment, when pin holes are formed while the positions thereof are controlled, the positional relationship between the pin holes H in the resistance regulating layers R, R1 and R2 is important. That is, the pin holes H in the respective resistance regulating layers may be positioned at the same place as illustrated in FIG. 19. Alternatively, the positions of the pin holes H in the respective resistance regulating layers may be shifted as illustrated in FIG. 20.

Figure 20:
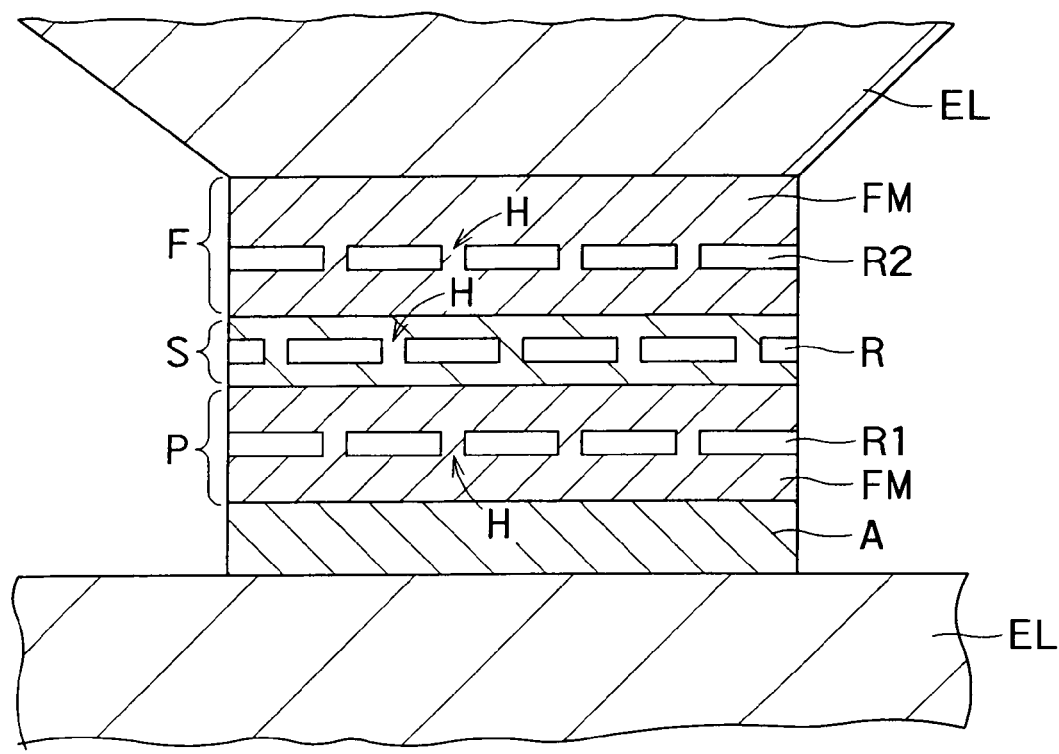
FIG. 20 is conceptual drawing showing the construction of a magnetoresistance effect element wherein the positions of pin holes are shifted between the respective resistance regulating layers.

When the positions of the pin holes H are shifted as shown in FIG. 20, it is possible to more effectively reduce the quantity of current, so that it is possible to form a CPP spin-valve element having a higher resistance.

When the pin holes H are thus formed while the positions thereof are controlled, the relationship between the sizes of the pin holes H in the respective resistance regulating layers R, R1 and R2 is also important. In this case, although the sizes of the pin holes H in all of the resistance regulating layers may be equal to each other, the sizes of the pin holes H in the resistance regulating layers may be different from each other. That is, if the size of the pin hole H in the resistance regulating layer, which is provided on the upstream side with respect to the flow of electrons, of the resistance regulating layers R, R1 and R2 is largish, it is possible to effectively reduce the quantity of current, so that it is possible to form a CPP spin-valve element having a higher resistance.

Each of the first and second magnetic layers P and F may also have a construction of a ferromagnetic layer, a stacked structure of ferromagnetic layer/non-magnetic layer, or a stacked structure of ferromagnetic layer/ferromagnetic layer, similar to that described above in the first embodiment.

The non-magnetic intermediate layer S in the second embodiment of the present invention may also have the same stacked construction as that described above in the first embodiment of the present invention.

The antiferromagnetic layer A in the second embodiment of the present invention is also preferably formed of a metallic antiferromagnetic material having excellent magnetization fixed characteristics, similar to the first embodiment. Specifically, an antiferromagnetic material, such as PtMn, NiMn, FeMn or IrMn, may be used. The thickness of the antiferromagnetic layer A is preferably as thin as possible from the standpoint of electric characteristics. However, if the antiferromagnetic layer A is too thin, the magnetization fixed characteristics deteriorate, so that it is required to select such a thickness that the blocking temperature does not decrease. For that reason, the thickness is preferably 5 nm or more.

In addition to the above described constructions, one or both of the first magnetic layer P and the second magnetic layer F may have a so-called synthetic antiferromagnetic layer structure. Moreover, in addition to the above described constructions, a so-called dual construction wherein the pinned layer P comprises two layers may be adopted. These points are the same as those described above referring to FIG. 16 with respect to the first embodiment.

Referring to Examples, the embodiments of the present invention will be described below in more detail.

Example 1

First, Example 1 of the present invention will be described below.

Figure 21:
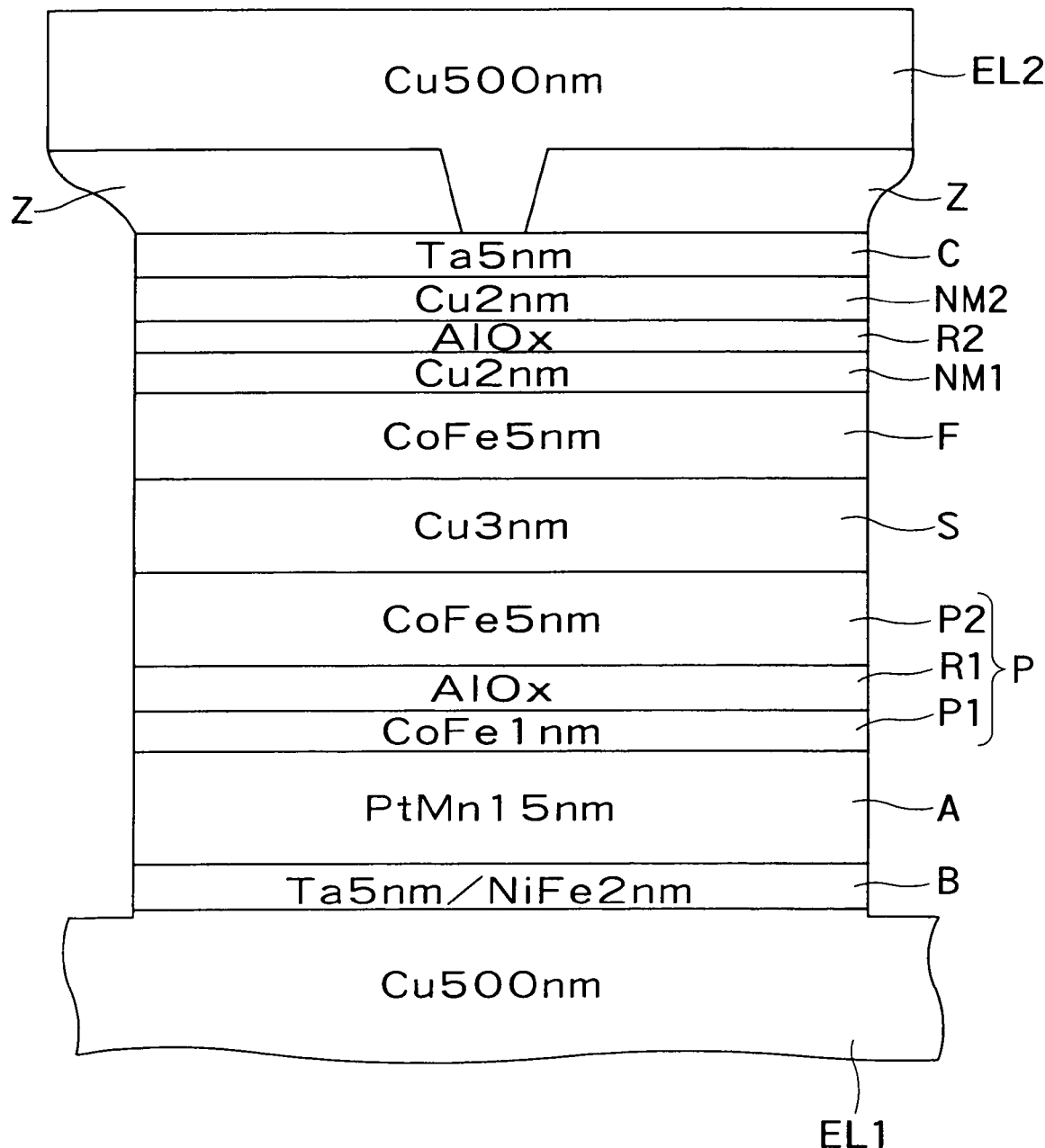
FIG. 21 is a conceptual drawing showing a cross-sectional construction of a principal part of a first example of a magnetoresistance effect element according to an aspect of the present invention.

FIG. 21 is a conceptual drawing showing a cross-sectional construction of a first example of a magnetoresistance effect element according to the present invention. In the formation of this magnetoresistance effect element, a Cu bottom electrode EL1 having a thickness of 500 nm was first stacked on a thermally oxidized silicon (Si) substrate (not shown) by the sputtering method, and the Cu bottom electrode EL1 was formed so as to have a stripe shape having a width of 9 μm by the photolithography. Then, a CPP-SV 3 μm square was deposited thereon. The construction of the film was as follows.

Ta 5 nm (buffer layer B)/NiFe 2 nm (buffer layer B)/PtMn 15 nm (antiferromagnetic layer A)/CoFe 1 nm (pinned layer P1)/AlOx (resistance regulating layer R1)/CoFe 5 nm (pinned layer P2)/Cu 3 nm (non-magnetic intermediate layer S)/CoFe 5 nm (free layer F)/Cu 2 nm (non-magnetic layer NM1)/AlOx (resistance regulating layer R2)/Cu 2 nm (non-magnetic layer NM2)/Ta 5 nm (protective layer C)

The AlOx layer to be a resistance regulating layer was formed by depositing Al (aluminum), and then, by exposing the deposited Al to an atmosphere of oxygen to self-oxidize Al. In this example, the Al film was deposited so as to have a thickness of 1 nm, and was exposed to oxygen by 1 k Langmuir to form the AlOx having pin holes (not shown). That is, in this example, the AlOx layers having pin holes serves as the resistance regulating layer R1 and R2.

An insulating AlOx film Z was deposited on the above described spin-valve construction, and a hole 0.1 μm square was formed therein. Then, a Cu (copper) film having a thickness of 500 nm was stacked thereon by the sputtering method, to form a top electrode EL2. In this example, with the above described construction, it was possible to measure CPP-SV characteristics via the hole 0.1 μm square of the insulating AlOx film Z.

As the results of measurement at room temperatures, it was possible to obtain an element resistance of 7Ω and a rate of change in resistance of 10%. Thus, it was possible to obtain an amount of change in resistance of 0.7Ω. In addition, it was verified that the pinned layer P was suitably magnetization-fixed and that the magnetization of the stacked structure constituting the pinned layer P moved integrally. It was also verified that Hc of the free layer F was small and its magnetization moved integrally with respect to the external magnetic field.

Comparative Example 1

First, a Cu bottom electrode EL1 having a thickness of 500 nm was stacked on a thermally oxidized silicon (Si) substrate by the sputtering method, and the Cu bottom electrode EL1 was formed so as to have a stripe shape having a width of 9 μm by the photolithography. Then, a CPP-SV 3 μm square was deposited thereon. The construction of the film was as follows.

Ta 5 nm (buffer layer)/NiFe 2 nm (buffer layer)/PtMn 15 nm (antiferromagnetic layer)/CoFe 5 nm (pinned layer)/Cu 3 nm (non-magnetic intermediate layer)/CoFe 5 nm (free layer)/Cu 2 nm (non-magnetic layer)/Ta 5 nm (protective layer)

The same insulating film of AlOx as that shown in FIG. 21 was formed thereon, and a hole 0.1 μm square was formed in AlOx. Then, a Cu film having a thickness of 500 nm was stacked thereon by the sputtering method, to form atop electrode. As the results of measurement at room temperatures, the element resistance was 3Ω, and the rate of change in resistance was only 3%. That is, in this example, the amount of change in resistance was only 0.09Ω, so that the amount of change was only about ⅛ as large as that in Example 1.

Example 2

Similar to the first example, first, a Cu bottom electrode having a thickness of 500 nm was stacked on a thermally oxidized silicon (Si) substrate by the sputtering method, and the Cu bottom electrode was formed so as to have a stripe shape having a width of 9 μm by the photolithography. Then, a CPP-SV 3 μm square was deposited thereon. The construction of the film was as follows. Ta 5 nm (buffer layer B)/NiFe 2 nm (buffer layer B)/PtMn 15 nm (antiferromagnetic layer A)/CoFe 1 nm (ferromagnetic layer FM1)/AlOx (resistance regulating layer R1)/CoFe 1 nm (ferromagnetic layer FM2)/Cu 1 nm (non-magnetic layer NM1)/CoFe 1 nm (ferromagnetic layer FM3)/Cu 1 nm (non-magnetic layer NM2)/CoFe 1 nm (ferromagnetic layer FM4)/Cu 3 nm (non-magnetic intermediate layer S)/CoFe 1 nm (ferromagnetic layer FM5)/Cu 1 nm (non-magnetic layer NM3)/CoFe 1 nm (ferromagnetic layer FM6)/Cu 1 nm (non-magnetic layer NM4)/CoFe 1 nm (ferromagnetic layer FM7)/Cu 2 nm (non-magnetic layer NM5)/AlOx (resistance regulating layer R2)/Cu 2 nm (non-magnetic layer NM6)/Ta 5 nm (protective layer C)

In the above described stacked structure, the stacked layers from the ferromagnetic layer FM1 to the ferromagnetic layer FM constitute a pinned layer P, and the stacked layers from the ferromagnetic layer FM5 to the ferromagnetic layer FM7 constitute a free layer F.

The AlOx layers constituting the resistance regulating layers R1 and R2 were formed as AlOx layers having pin holes by the same method as that in Example 1.

Similar to FIG. 21, an insulating AlOx film was deposited on the above described spin-valve construction, and a hole 0.1 μm square was formed therein. Then, a Cu film having a thickness of 500 nm was stacked thereon by the sputtering method, to form a top electrode EL2. In this example, with the above described construction, it was possible to measure CPP-SV characteristics via the hole 0.1 μm square of the insulating AlOx film.

As the results of measurement at room temperatures, it was possible to obtain an element resistance of 9Ω and a rate of change in resistance of 20%. That is, it was possible to obtain an amount of change in resistance of 1.8Ω. In addition, it was verified that the pinned layer P was suitably magnetization-fixed and that the magnetization of the pin stacked structure moved integrally. It was also verified that Hc of the free layer F was small and its magnetization moved integrally with respect to the external magnetic field.

Third Embodiment

Figure 31:
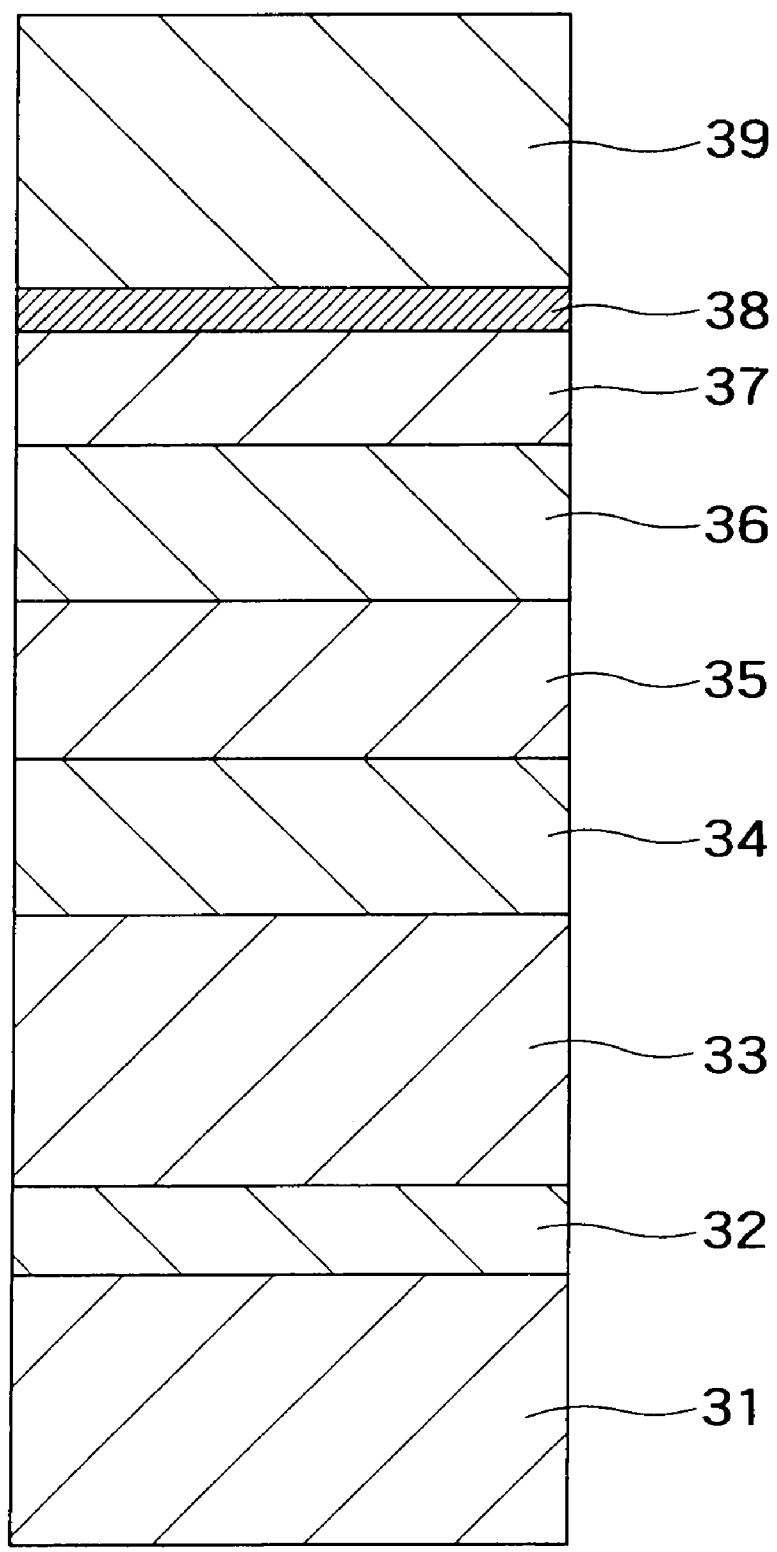
FIG. 31 is a sectional view showing the construction of the third embodiment of a magnetoresistance effect element according to an aspect of the present invention.

Referring to FIG. 31, the third embodiment of the present invention will be described below. FIG. 31 is a conceptual drawing showing a cross-section of the third embodiment of a magnetoresistance effect element according to an aspect of the present invention. As shown in FIG. 31, the magnetoresistance effect element in this embodiment comprises a bottom electrode 31, an underlying layer 32, an antiferromagnetic layer 33, a magnetization fixed layer 34, an non-magnetic intermediate layer 35, a magnetization free layer 36, a non-magnetic metal layer 37, a non-magnetic compound layer 38 and a top electrode 39, which are stacked in that order. Furthermore, the antiferromagnetic layer 33, the magnetization fixed layer 34, the non-magnetic intermediate layer 35 and the magnetization free layer 36 constitute a magnetoresistance effect film.

The non-magnetic compound layer 38 is formed of at least one selected from the group consisting of oxides, nitrides, borides and carbides of B, Si, Ge, Ta, W, Nb, Al, Mo, P, V, As, Sb, Zr, Ti, Zn, Pb, Th, Be, Cd, Sc, La, Y, Pr, Cr, Sn, Ga, Cu, In, Rh, Pd, Mg, Li, Ba, Ca, Sr, Mn, Fe, Co, Ni and Rb. The non-magnetic compound layer 38 is preferably crystalline. Materials easy to obtain crystalline include oxides which contain at least one selected from the group consisting of B, Si, Ge, W, Nb, Mo, P, V, Sb, Zr, Ti, Zn, Pb, Cr, Sn, Ga, Fe and Co. Throughout the specification, the term "crystalline" means that the non-magnetic compound layer is single crystal or polycrystal, and does not mean a state wherein microcrystals are scattered in amorphous. This can be easily verified by observing a lattice image by means of a cross-sectional TEM (Transmission Electron Microscopy) or the like. For example, if an orderly arrangement is observed, it can be said that it is crystalline. Alternatively, if a spot-like pattern is observed in an electron beam diffraction image, it can be determined that a range irradiated with electron beams is substantially single crystal to be crystalline. If a ring-shaped pattern is obtained, it can be determined that a range irradiated with electron beams is in a polycrystalline state to be crystalline. The state of the epitaxial growth from the bottom layer can be verified by observing the lattice image.

The non-magnetic compound layer 38 allows its pseudo thickness to be increased by the electron reflecting effect, so that it is possible to increase the output. If the non-magnetic compound layer 38 includes a metal phase, a semimetal phase and a half metal phase or has pin holes, it cause current to be contracted, and causes the current density to be effectively increased. Therefore, the output increases. If the proportion of the non-magnetic phase to the metal phase is too large, the resistance is too high, so that the heat generation of the element increases to deteriorate the characteristics of the element. Therefore, in order to obtain the above described effects, the proportion of the metal layer portion is 2% or more. On other hand, if the metal phase portion is too large, the function of increasing the current density decreases, so that the proportion of the metal phase portion is preferably 30% or less.

The presence of the metal phase or pin hole portion in the layer can be verified by observing the lattice image by the cross-sectional TEM. That is, if a portion epitaxially connected to the upper and lower metal phases exists, it can be said that this portion is a metal phase. If a component analysis in the non-magnetic layer is carried out, the presence of a metal phase can be verified. That is, if the concentration of oxygen, nitrogen, fluorine or boron is less than 20% by composition ratio, it can be said that it is substantially a metal phase.

The mean diameter of such a metal phase portion or pin hole portion is preferably in the range of 10% to 100% with respect to the total thickness of the magnetization free layer, non-magnetic intermediate layer and magnetization fixed layer. If it is 10% or less, the increase of resistance due to contraction is too large, so that this is not practical. On the other hand, if it is 100% or more, the current is too broad, so that the contraction effect can not be obtained. In the case of a structure (synthetic antiferromagnetic structure) that the magnetization fixed layer is antiferromagnetically coupled via a non-magnetic metal layer such as Ru, the total thickness must be calculated in view of only the ferromagnetic layer nearer to the non-magnetic intermediate layer.

The distance between such metal phase portions or pin hole portions on the plane of the film is preferably in the range of from 1 nm to 100 nm. If it is 1 nm or less, the current having been contracted once overlaps with each other in the vicinity of the non-magnetic compound layer, so that the effect deteriorates. On the other hand, if it is 100 nm or more, the number of the portions existing in the actual element is about 1 through 3, so that the variation in characteristics is stochastically increased.

If the non-magnetic compound layer 38 is amorphous, the rapidity of electron potentials on the interface of the film is lost, and the elastic scattering is inhibited. Therefore, it is not possible to obtain so great electron reflecting effect, so that the increase of the output can not be expected. In addition, the non-magnetic compound layer 38 is amorphous, its structure is unstable, and its heat resistance deteriorates, so that the deterioration of the output is caused. In order to obtain a crystalline non-magnetic compound layer, a compound selected from the group consisting of oxides of rare earth metals, e.g., B, Si, Ge, W, Nb, Mo, P, V, Sb, Zr, Ti, Zn, Pb, Cr, Sn, Ga, Fe and Co, is preferably used.

The thickness of the non-magnetic compound layer 38 must be 0.2 nm or more since its shape is easily changed by the thermal diffusion if the thickness is 0.2 nm or less. On the other hand, if the thickness is 10 nm or more, the resistance of the element increases, and when a sense current is caused to flow, excessive head is generated to cause the deterioration of the output. The thickness of the non-magnetic compound layer 38 is more preferably in the range of from 0.5 mm to 5 nm. However, it should not be limited thereto if the non-magnetic compound layer 38 is made of a compound of a semimetal, a half metal or a metal.

The non-magnetic metal layer 37 is preferably made of an element having low reactivity, in order to stabilize the compound of the non-magnetic compound layer 38. From this standpoint, a metal layer containing at least one selected from the group consisting of Cu, Au, Ag, Ru, Ir, Re, Rh, Pt, Pd, and Os is effective. Al can be used as the non-magnetic metal layer 37. In this case, the non-magnetic compound layer 38 is preferably made of a material which is easily oxidizable than Al. Comparing the non-magnetic metal layer 37 with the non-magnetic compound layer 38, the non-magnetic compound layer 38 is preferably made of a compound mainly containing an element which is different from the element of the non-magnetic metal layer 37. Because it is difficult to hold the thermostability of the non-magnetic compound layer 38 since oxygen is easy to diffuse if the bond energies of oxygen, nitrogen, carbon and boron are equal to each other. However, it is possible to produce a compound, which is very resistant to diffusion, by some method for preparing the compound. For example, the compound prepared by irradiating a metal layer with ions, plasma or radicals of an element to be combined is very stable, and does not exhibit so considerable diffusion between the compound phase and metal phase of the same kind of metallic element. Moreover, combinations of the above described compound layer of a compound prepared by irradiating a metal layer with produced ions, plasma and radicals, and the above described non-magnetic metal layer containing at least one selected from the group consisting of Cu, Au, Ag, Ru, Ir, Re, Rh, Pt, Pd, Al, and Os, are very thermostable.

Figure 32:
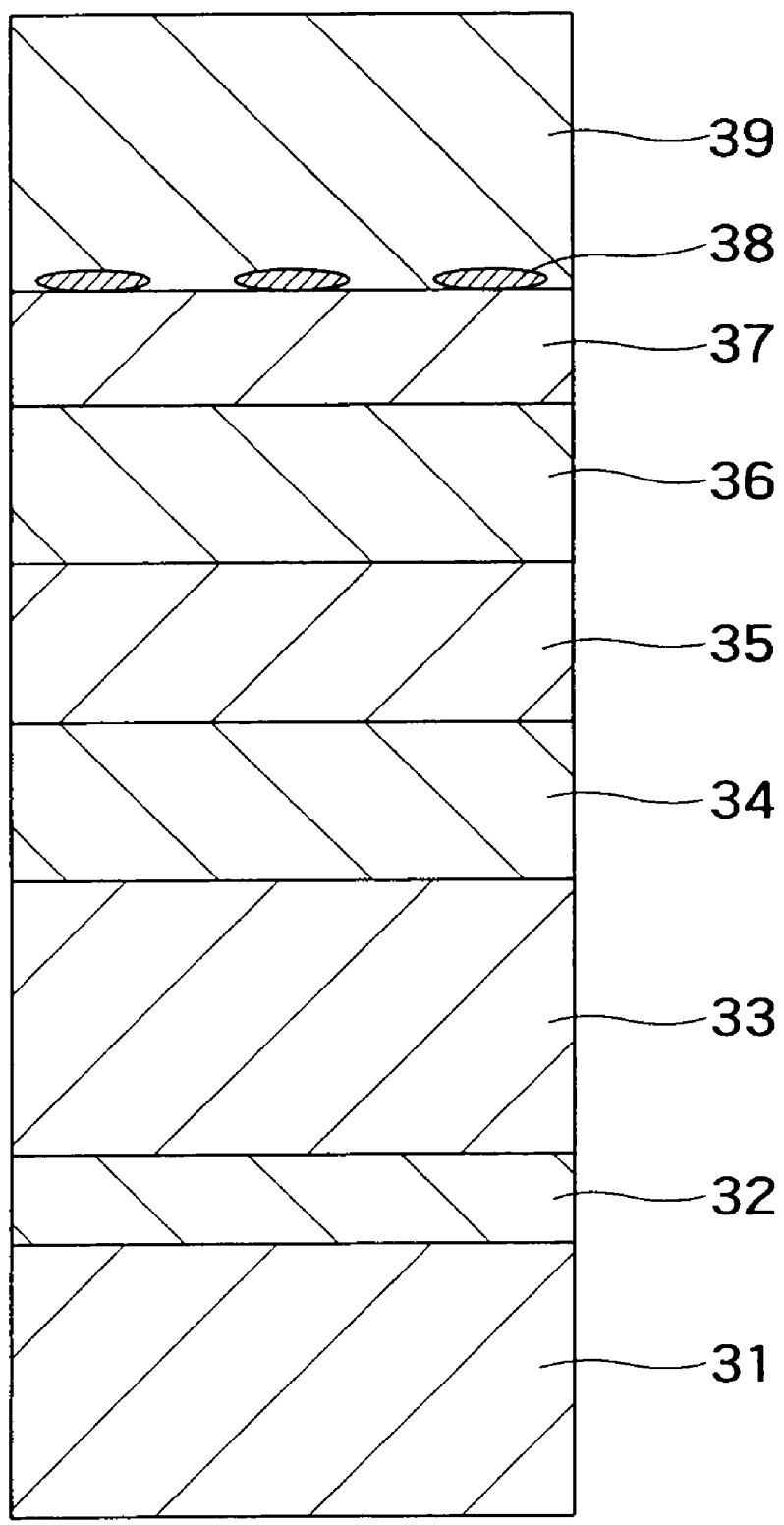
FIG. 32 is a sectional view showing the construction of a modified example of the third embodiment.

The non-magnetic compound layer 38 is not always required to be formed as a layer, but it may be formed in the non-magnetic metal layer 37 as islands as shown in FIG. 32. In this case, the materials of the non-magnetic metal layer 32 and the non-magnetic compound are the same as those in FIG. 31. The distance between such island-like compounds on the plane of the film is preferably in the range of from 1 nm to 100 nm. If it is 1 nm or less, the current having been contracted once overlaps with each other in the vicinity of the non-magnetic compound layer, so that the effect deteriorates. On the other hand, if it is 100 nm or more, the number of the portions existing in the actual element is about 1 through 3, so that the variation in characteristics is stochastically increased. In addition, the ratio of the area of the island-like portion to the metal portion therebetween on the plane of the film is preferably in the range of from 2% to 30%.

In order to form the metal phase portion in the non-magnetic compound layer or in order to form the structure having pin holes, materials having different oxidation energies may be combined. In particular, the material forming the metal phase portion preferably mainly contains the above described metal containing at least one selected from the group consisting of Cu, Au, Ag, Ru, Ir, Re, Rh, Pt, Pd, Al, and Os. In this case, if atoms forming the non-magnetic compound layer diffuse into the metal phase portion, there is the possibility that the resistance of the metal phase portion increases to cause practical problems. For that reason, the atoms forming the metal phase and the atoms forming the compound phase are not substantially soluble.

For example, if the main component of the metal phase portion is Cu, the main component forming the non-magnetic compound layer is preferably at least one selected from the group consisting of B, Fe, Mo, Pb, Ta, Cr, V, Si, Sb and Ge, and more preferably at least one selected from the group consisting of B, Fe, Mo, Pb, Cr, V, Si, Sb and Ge which are easy to be crystalline.

For example, if the main component of the metal phase portion is Au, the main component forming the non-magnetic compound layer is preferably at least one selected from the group consisting of B, Fe, Ge, Mo, P, Rh, Si, W and Cr, and more preferably at least one selected from the group consisting of B, Fe, Mo, P, Si, W and Cr which are easy to be crystalline.

For example, if the main component of the metal phase portion is Ag, the main component forming the non-magnetic compound layer is preferably at least one selected from the group consisting of B, Be, Co, Cr, Fe, Mo, Pb, Si, Ta, V, W, Ge, Sn, Al and Rh, and more preferably at least one selected from the group consisting of B, Be, Co, Cr, Fe, Mo, Pb, Si, V, W, Ge, Sn, Al and Rh which are easy to be crystalline.

For example, if the main component of the metal phase portion is Pt, the main component forming the non-magnetic compound layer is preferably W.

For example, if the main component of the metal phase portion is Pd, the main component forming the non-magnetic compound layer is preferably W or Cr.

As a method for forming the above described combination of the metal phase and the non-magnetic compound phase, the non-magnetic compound may be formed in the layer or on the interface of the material forming the metal phase. The non-magnetic compound may be formed by feeding a reaction gas after deposition, or the non-magnetic compound may be directly stacked by sputtering or the like.

As another method for forming the above described combination of the metal phase and the non-magnetic compound phase, the non-magnetic compound may be formed by feeding a reactive gas after forming an alloy layer of the material forming the metal phase and the material forming the non-magnetic compound layer. Such an alloy layer may be formed by, e.g., stacking an alloy target by sputtering or the like. The alloy target may be prepared by the above described combination of the non-solid-solution materials. Although the target is non soluble, the target may be prepared by sintering, or may be a mosaic of two materials.

The bottom electrode 31 is formed of a metal containing a material selected from the group consisting of Cu, Au, Ag, Ru, Ir, Re, Rh, Pt, Pd, Al, Os and Ni. The underlying layer 32 is formed of NiFeCr, Ta/NiFeCr, Ta/Ru, Ta/NiFe, Ta/Cu, or Ta/Au. The stacked structure of Ta and fcc or a metal layer of HCP is important in order to obtain a good film growth. In particular, in order to obtain good magnetically soft characteristics of the magnetization free layer, it is important to obtain the (111) orientation of the fcc structure, and it is required to provide the above described structure of the underlayer 32.

Also in this embodiment, it is possible to obtain a CPP type magnetoresistance effect element which has an appropriate value of resistance and a large amount of change in MR and which is magnetically sensitive.

Fourth Embodiment

Figure 33:
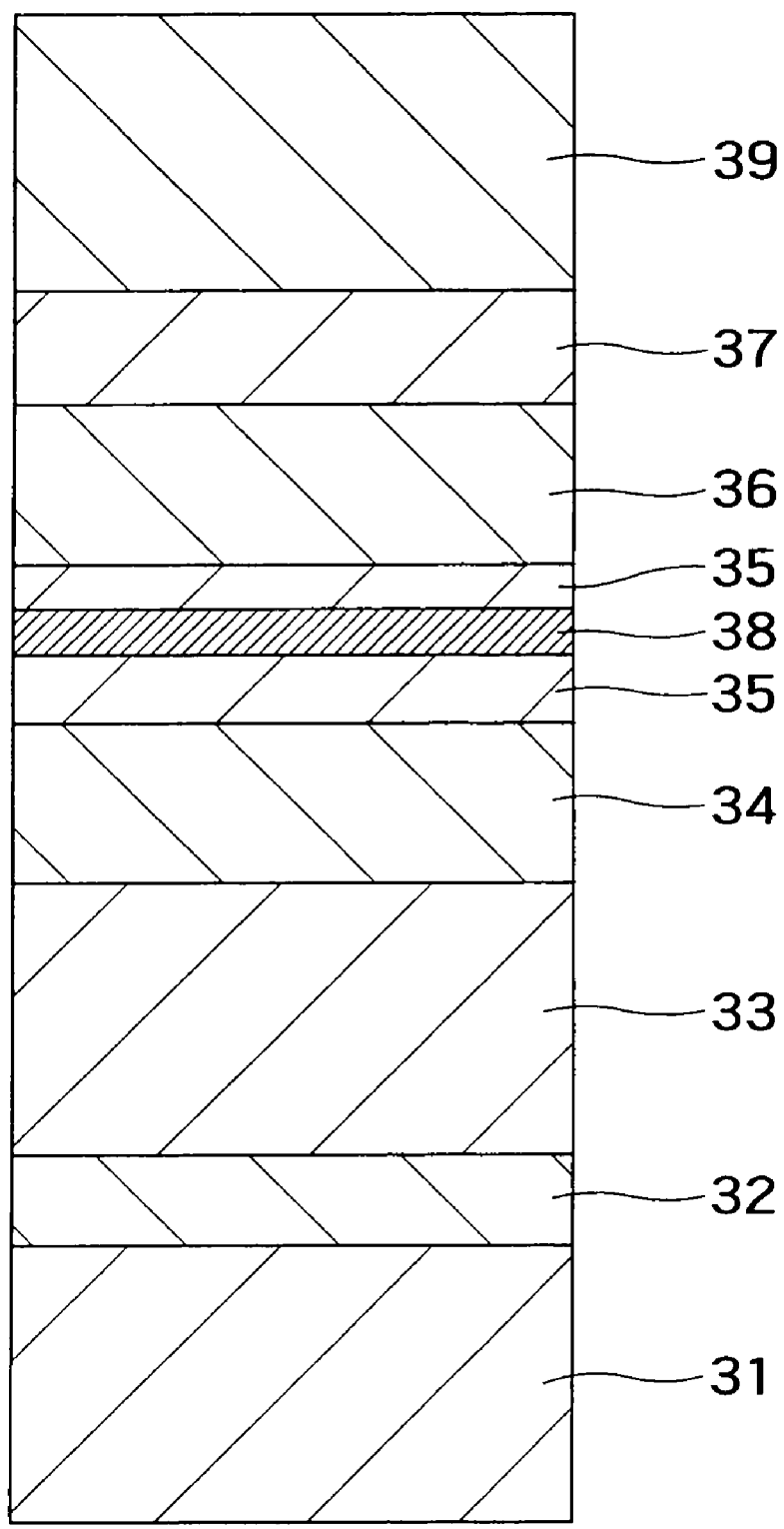
FIG. 33 is a sectional view showing the construction of the fourth embodiment of a magnetoresistance effect element according to an aspect of the present invention.

Referring to FIG. 33, the fourth embodiment of the present invention will be described below. FIG. 33 is a conceptual drawing showing a cross-section of the fourth embodiment of a magnetoresistance effect element according to an aspect of the present invention. The magnetoresistance effect element in this embodiment comprises a bottom electrode 31, an underlying layer 32, an antiferromagnetic layer 33, a magnetization fixed layer 34, an non-magnetic intermediate layer 35, a magnetization free layer 36, a non-magnetic metal layer 37, a non-magnetic compound layer 38 and a top electrode 39, which are stacked in that order. Furthermore, the antiferromagnetic layer 33, the magnetization fixed layer 34, the non-magnetic intermediate layer 35 and the magnetization free layer 36 constitute a magnetoresistance effect film.

Figure 34:
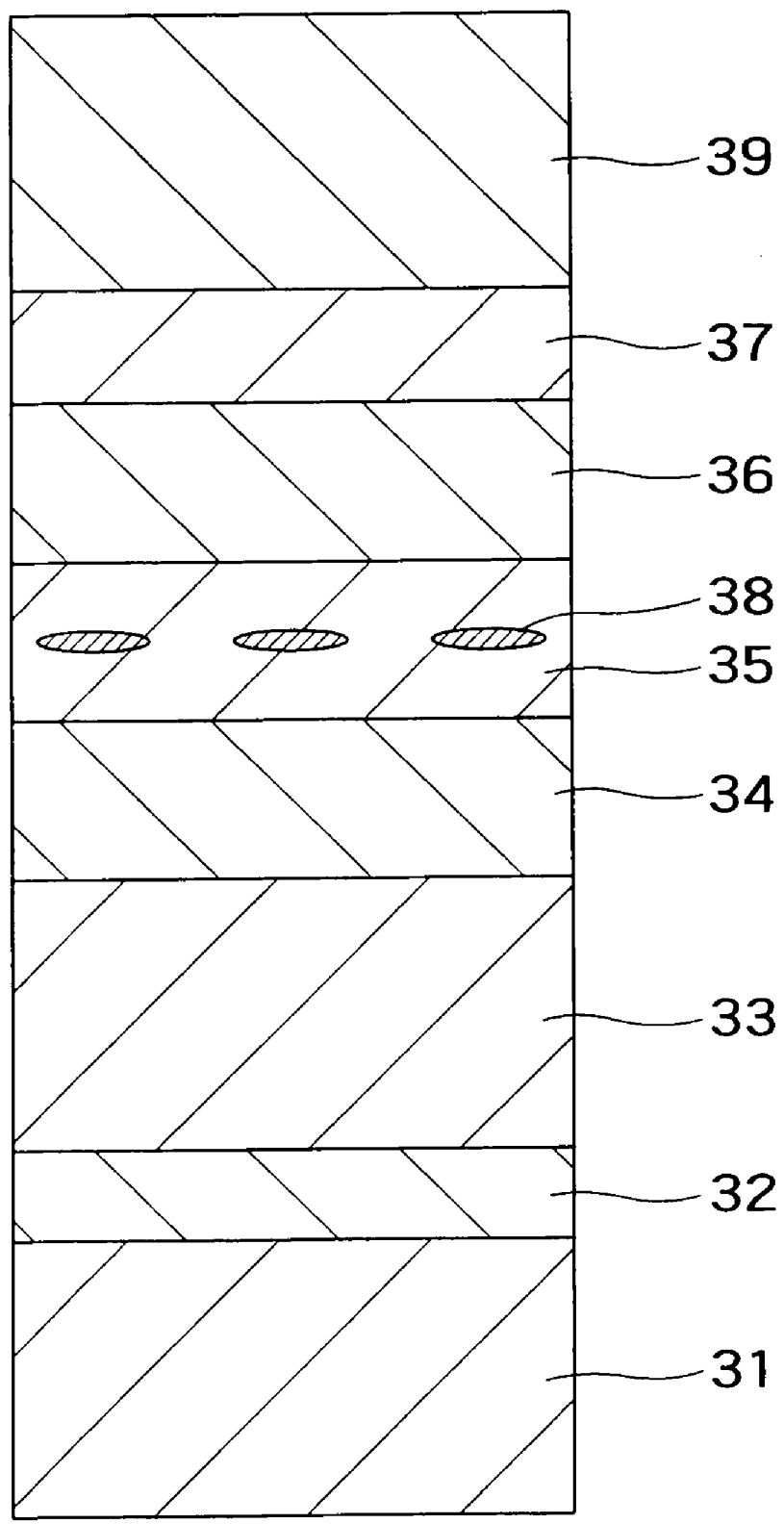
FIG. 34 is a sectional view showing the construction of a modified example of the fourth embodiment.
Figure 35:
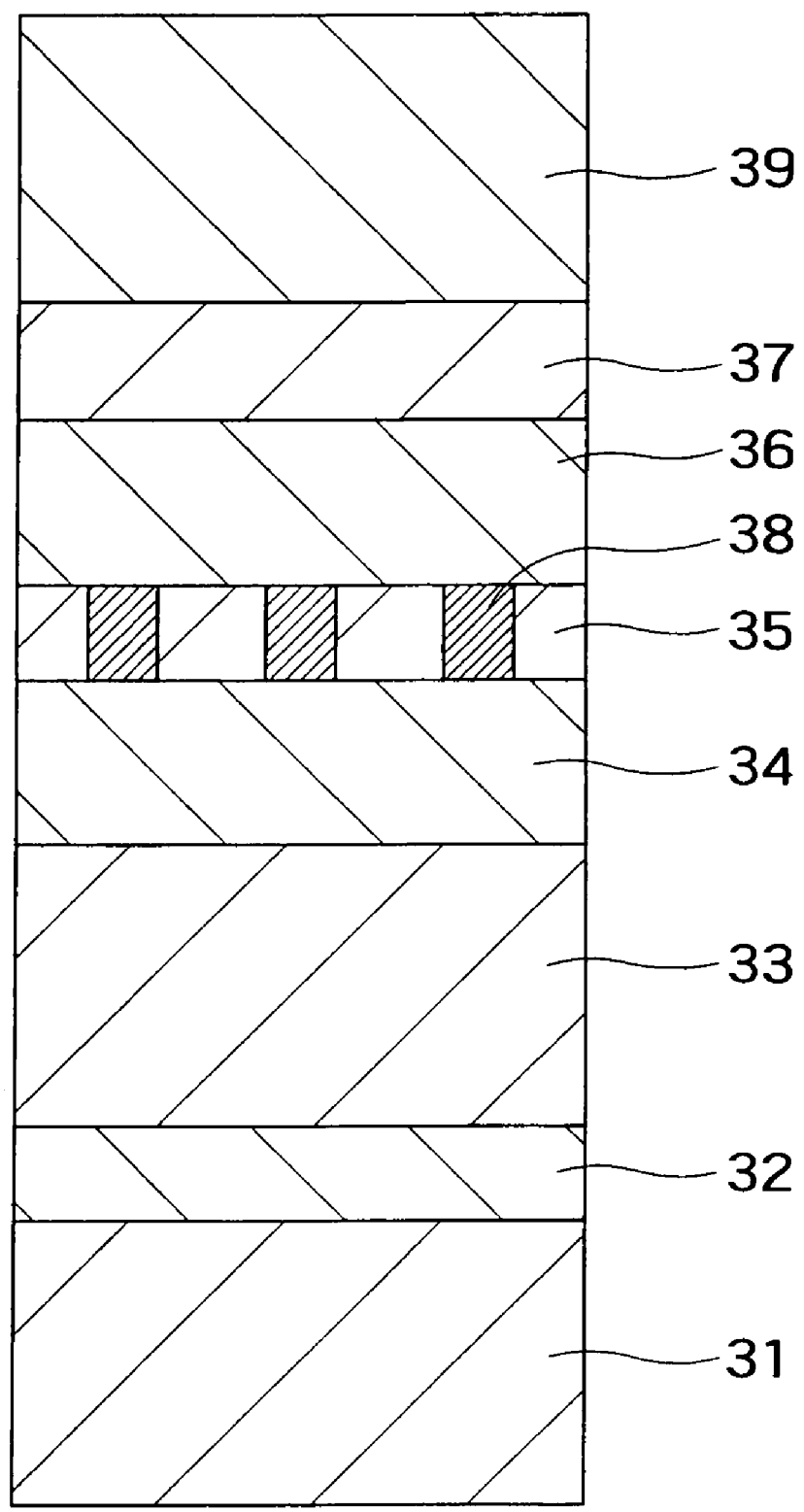
FIG. 35 is a sectional view showing the construction of a modified example of the fourth embodiment.

The non-magnetic intermediate layer 35 is in a mixed state with the non-magnetic compound layer 38. As shown in FIG. 34, the non-magnetic compound layer 38 may be deposited in the non-magnetic intermediate layer 35 or may be granular. The non-magnetic compound layer 38 may pass through the non-magnetic intermediate layer 35 in a direction perpendicular to the plane of the film (see FIG. 35). The non-magnetic compound layer 38 is no always required to be arranged in the non-magnetic intermediate layer 35, but it may be formed on the interface (see FIG. 36). By preparing such a structure, it is possible to effectively decrease the element size to increase the current density, so that it is possible to increase the output. There is also such a current contracting effect if the non-magnetic compound layer 38-is arranged on the magnetization free layer 36 on the opposite side to the non-magnetic intermediate layer 35 as described in the third embodiment. However, the contracting effect is stronger if the non-magnetic compound layer 38 is formed at the substantially center of a portion, which is related directly to the magnetoresistance effect, as this embodiment. If the non-magnetic compound layer 38 is amorphous, thermodiffusion may be caused to have a bad influence on the mean free path in the non-magnetic intermediate layer 35. For that reason, the non-magnetic compound layer 38 is preferably crystalline. If the proportion of the non-magnetic compound layer 38 to the metal phase is too great, the resistance is too high, so that the heat generation of the element increases to deteriorate the characteristics of the element. For that reason, the proportion of the metal layer portion is 2% or more. On other hand, if the metal phase portion is too large, the function of increasing the current density decreases, so that the proportion of the metal phase portion is preferably 30% or less.

The presence of the metal phase or pin hole portion in the layer can be verified by observing the lattice image by the cross-sectional TEM. That is, if a portion epitaxially connected to the upper and lower metal phases exists, it can be said that this portion is a metal phase. If a component analysis in the non-magnetic compound layer is carried out, the presence of a metal phase can be verified. That is, if the concentration of oxygen, nitrogen, fluorine or boron is less than 20% by composition ratio, it can be said that it is substantially a metal phase.

However, in order to obtain good magnetoresistance effect, it is important that electrons pass through the non-magnetic intermediate layer without being scattered. For that reason, the concentration of oxygen, nitrogen, fluorine or boron is preferably less than 15% by composition ratio.

The mean diameter of such a metal phase portion or pin hole portion is preferably in the range of 10% to 100% with respect to the total thickness of the magnetization free layer, non-magnetic intermediate layer and magnetization fixed layer. If it is 10% or less, the increase of resistance due to contraction is too large, so that this is not practical. On the other hand, if it is 100% or more, the current is too broad, so that the contraction effect can not be obtained. In the case of a structure (synthetic antiferromagnetic structure) that the magnetization fixed layer is antiferromagnetically coupled via a non-magnetic metal layer such as Ru, the total thickness must be calculated in view of only the ferromagnetic layer nearer to the non-magnetic intermediate layer.

The distance between such metal phase portions or pin hole portions on the plane of the film is preferably in the range of from 1 nm to 100 nm. If it is 1 nm or less, the current having been contracted once overlaps with each other in the vicinity of the non-magnetic compound layer, so that the effect deteriorates. It is more preferably the distance is 10 nm or more. On the other hand, if it is 100 nm or more, the number of the portions existing in the actual element is about 1 through 3, so that the variation in characteristics is stochastically increased.

In order to form the metal phase portion in the non-magnetic compound layer or in order to form the structure having pin holes, materials having different oxidation energies may be combined. In particular, the material forming the metal phase portion in the non-magnetic compound layer preferably mainly contains the above described metal containing at least one selected from the group consisting of Cu, Au, Ag, Ru, Ir, Re, Rh, Pt, Pd, Al and Os. In this case, if atoms forming the non-magnetic compound layer diffuse into the metal phase portion, there is the possibility that the resistance of the metal phase portion increases to cause practical problems. For that reason, the atoms forming the metal phase and the atoms forming the compound phase are not substantially soluble.

For example, if the main component of the metal phase portion is Cu, the main component forming the non-magnetic compound layer is preferably at least one selected from the group consisting of B, Fe, Mo, Pb, Ta, Cr, V, Si, Sb and Ge, and more preferably at least one selected from the group consisting of B, Fe, Mo, Pb, Cr, V, Si, Sb and Ge which are easy to be crystalline.

For example, if the main component of the metal phase portion is Au, the main component forming the non-magnetic compound layer is preferably at least one selected from the group consisting of B, Fe, Ge, Mo, P, Rh, Si, W and Cr, and more preferably at least one selected from the group consisting of B, Fe, Mo, P, Si, W and Cr which are easy to be crystalline.

For example, if the main component of the metal phase portion is Ag, the main component forming the non-magnetic compound layer is preferably at least one selected from the group consisting of B, Be, Co, Cr, Fe, Mo, Pb, Si, Ta, V, W, Ge, Sn, Al and Rh, and more preferably at least one selected from the group consisting of B, Be, Co, Cr, Fe, Mo, Pb, Si, V, W, Ge, Sn, Al and Rh which are easy to be crystalline.

For example, if the main component of the metal phase portion is Pt, the main component forming the non-magnetic compound layer is preferably W.

For example, if the main component of the metal phase portion is Pd, the main component forming the non-magnetic compound layer is preferably W or Cr.

As a method for forming the above described combination of the metal phase and the non-magnetic compound phase, the non-magnetic compound may be formed in the layer or on the interface of the material forming the metal phase. The non-magnetic compound may be formed by feeding a reaction gas after deposition, or the non-magnetic compound may be directly stacked by sputtering or the like.

As another method for forming the above described combination of the metal phase and the non-magnetic compound phase, the non-magnetic compound may be formed by feeding a reactive gas after forming an alloy layer of the material forming the metal phase and the material forming the non-magnetic compound layer. Such an alloy layer may be formed by, e.g., stacking an alloy target by sputtering or the like. The alloy target may be prepared by the above described combination of the non-solid-solution materials. Although the target is non soluble, the target may be prepared by sintering, or may be a mosaic of two materials.

Also in this embodiment, it is possible to obtain a CPP type magnetoresistance effect element which has an appropriate value of resistance and a large amount of change in MR and which is magnetically sensitive.

Fifth Embodiment

As the fifth embodiment of the present invention, a magnetic head using a magnetoresistance effect element according to an aspect of the present invention will be described below.

Figure 22:
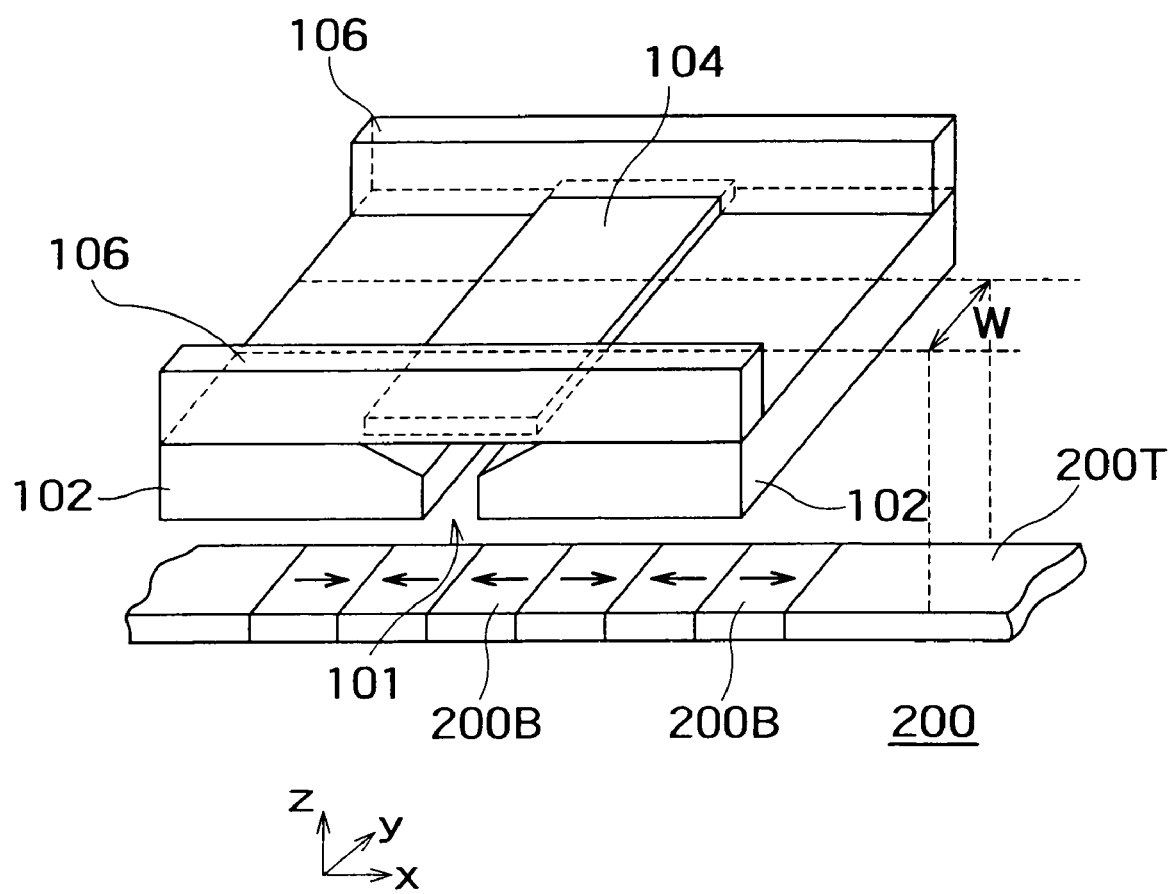
FIG. 22 is a schematic perspective view showing the construction of a principal part of a magnetic head using a magnetoresistance effect element according to an aspect of the present invention.

FIG. 22 is a schematic perspective view of a principal part of a magnetic head using a magnetoresistance effect element according to the embodiment of the present invention. That is, the magnetic head according to the embodiment of the present invention has a pair of magnetic yokes 102, 102 which are arranged so as to face a recording medium 200. On the magnetic yokes 102, 102, a magnetoresistance effect element 104 magnetically coupled thereto is provided. The magnetoresistance effect element 104 is any one of the CPP type elements according to embodiments of the present invention, which have been described above referring to FIGS. 1 through 21 and FIGS. 31 through 34. On both sides thereof, a pair of bias layers 106, 106 are formed so as to straddle the pair of magnetic yokes 102, 102. The bias layers 106 are made of an antiferromagnetic or ferromagnetic material, and have the function of directing the magnetization of the magnetic yoke 102 and the free layer of the magnetoresistance effect element 104 to a direction perpendicular to a recording magnetic field, i.e., to the y direction in the figure.

In the recording medium 200, a recording track 200 T is formed, and recording bits 200B are arranged. In each of the recording bits 200B, a signal magnetization illustrated by arrows is formed. The signal magnetic flux from these recording bits is given to a magnetic circuit which connects the magnetic yokes 102 to the magnetoresistance effect element 104. If the magnetic field of the recording bit 200B is given to the magnetoresistance effect element 104, the magnetization of the free layer rotates on the plane from the y direction due to the bias layer 106. Then, the variation in magnetizing direction is detected as the variation in magnetic resistance.

In order to match the magnetic detection region of the magnetoresistance effect element 104 to the size of the recording bit 200B, the contact of the electrode of the magnetoresistance effect element 104 is formed so as to be limited to a region corresponding to a recording track width W shown in FIG. 22.

According to the embodiment of the present invention, any one of the CPP type elements described above referring to FIGS. 1 through 21 and FIGS. 31 through 34 is used as the magnetoresistance effect element 104, so that it is possible to obtain both an appropriate element resistance and a large variation in magnetic resistance. That is, it is possible to realize a magnetic head having a greatly higher sensitive and more stable reliability than those of conventional heads.

While the magnetic head suitable for magnetic recording media of a longitudinal (in-plane) recording system has been described in this embodiment, the present invention should not be limited thereto. The magnetoresistance effect element according to an aspect of the present invention may be applied similarly to a magnetic head suitable for vertical recording media, to obtain the same effects.

Sixth Embodiment

As the sixth embodiment of the present invention, a magnetic recording and/or reproducing system using a magnetoresistance effect element according to an aspect of the present invention will be described below. Any one of the magnetoresistance effect elements according to embodiments of the present invention, which have been described above referring to FIGS. 1 through 21 and FIGS. 31 through 34, can be mounted on a magnetic head illustrated in FIG. 22, and can be incorporated in, e.g., a recording/reproducing integral type magnetic head assembly, to be applied to a magnetic recording and/or reproducing system.

Figure 23:
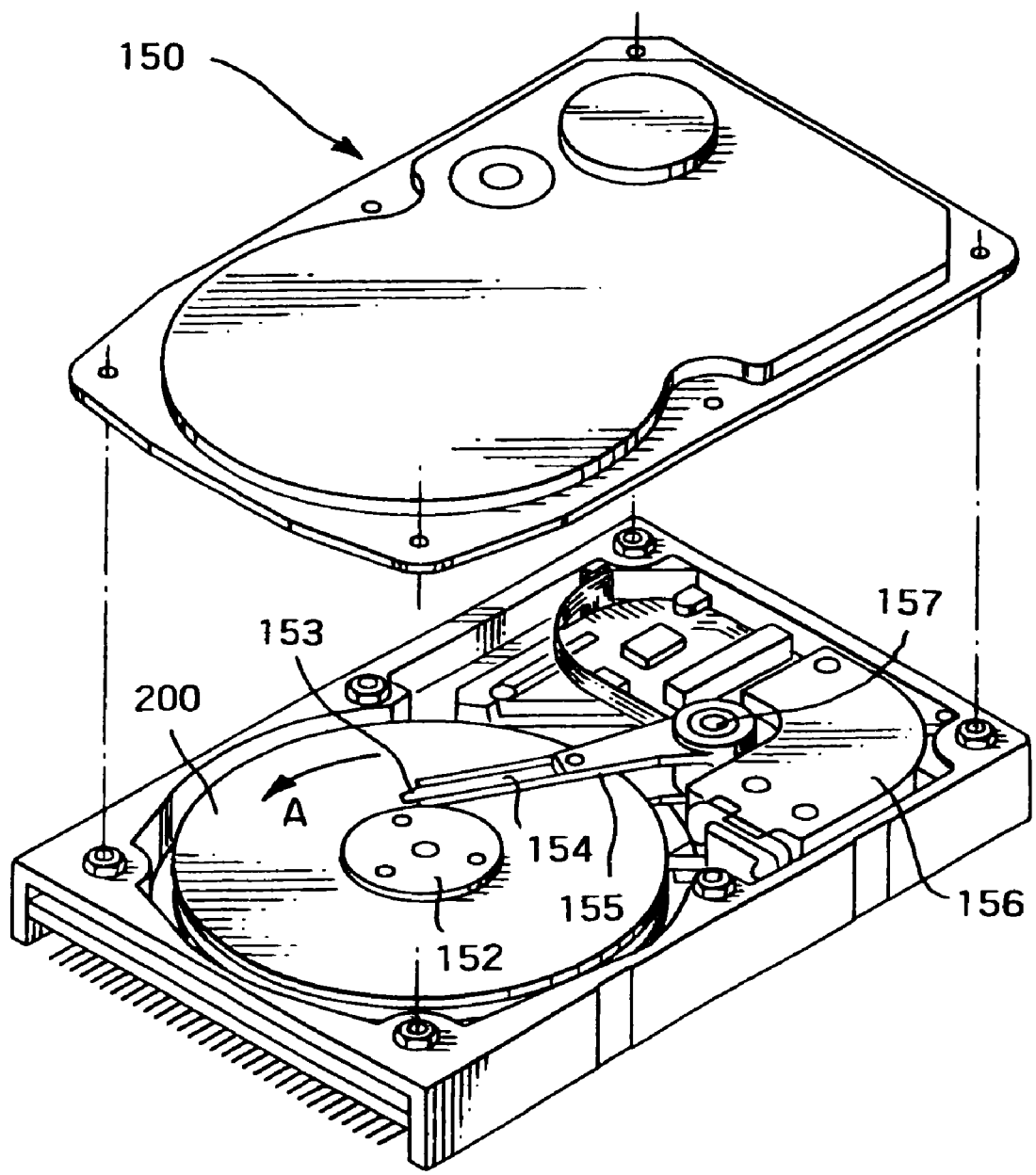
FIG. 23 is a perspective view of a principal part illustrating a schematic construction of a magnetic recording and/or reproducing system according to an aspect of the present invention.

FIG. 23 is a perspective view illustrating a schematic construction of a principal part of such a magnetic recording and/or reproducing system. That is, a magnetic recording and/or reproducing system 150 according to an aspect of the present invention is a system of a type using a rotary actuator. In this figure, a longitudinal recording or vertical recording magnetic disk 200 is mounted on a spindle 152, and is rotated in a direction of arrow A by means of a motor (not shown) which responds to a control signal from a drive unit control part (not shown). A head slider 153 for recording/reproducing information to be stored in the magnetic disk 200 is mounted on the tip of a thin-film-like suspension 154. For example, a magnetic head including any one of the magnetoresistance effect elements according to embodiments of the present invention, which have been described in Example 6, is provided in the vicinity of the tip of the head slider 153.

If the magnetic disk 200 rotates, the medium facing surface or air bearing surface (ABS) of the head slider 153 is held at a predetermined flying height from the surface; of the magnetic disk 200.

The suspension 154 is connected to one end of an actuator arm 155 which has a bobbin portion or the like for holding a driving coil (not shown). On the other hand of the actuator arm 155, a voice coil motor 156 which is a kind of a linear motor is provided. The voice coil motor 156 comprises: a driving coil (not shown) wound onto the bobbin portion of the actuator arm 155; and a magnetic circuit comprising permanent magnets, which are arranged so as to face each other via the coil, and facing yokes.

The actuator arm 155 is held by two ball bearings (not shown) which are provided above and below a fixing shaft 157, and is rotatable and slidable by means of the voice coil motor 156.

Figure 24:
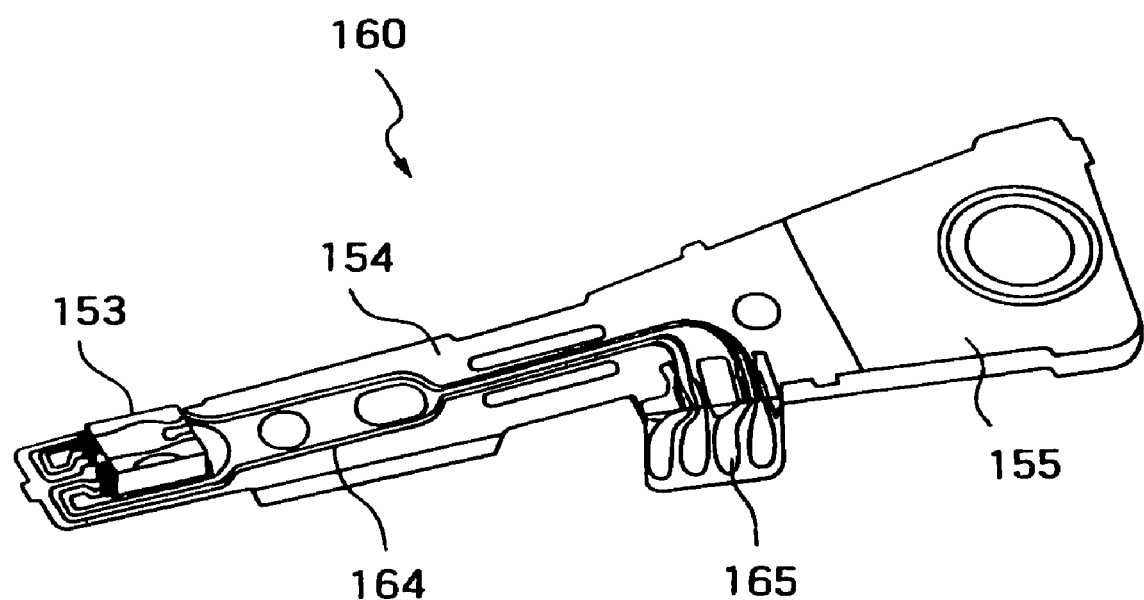
FIG. 24 is an enlarged perspective view of a magnetic head assembly in front of an actuator arm 155, viewed from the side of a disk.
Figure 25:
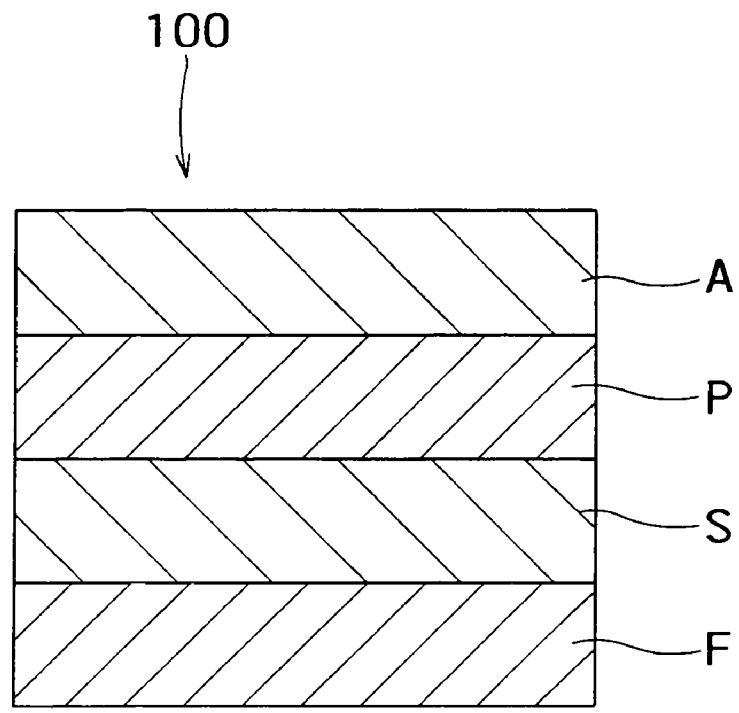
FIG. 25 is a conceptual drawing illustrating a schematic cross-sectional structure of a spin-valve film.
Figure 26:
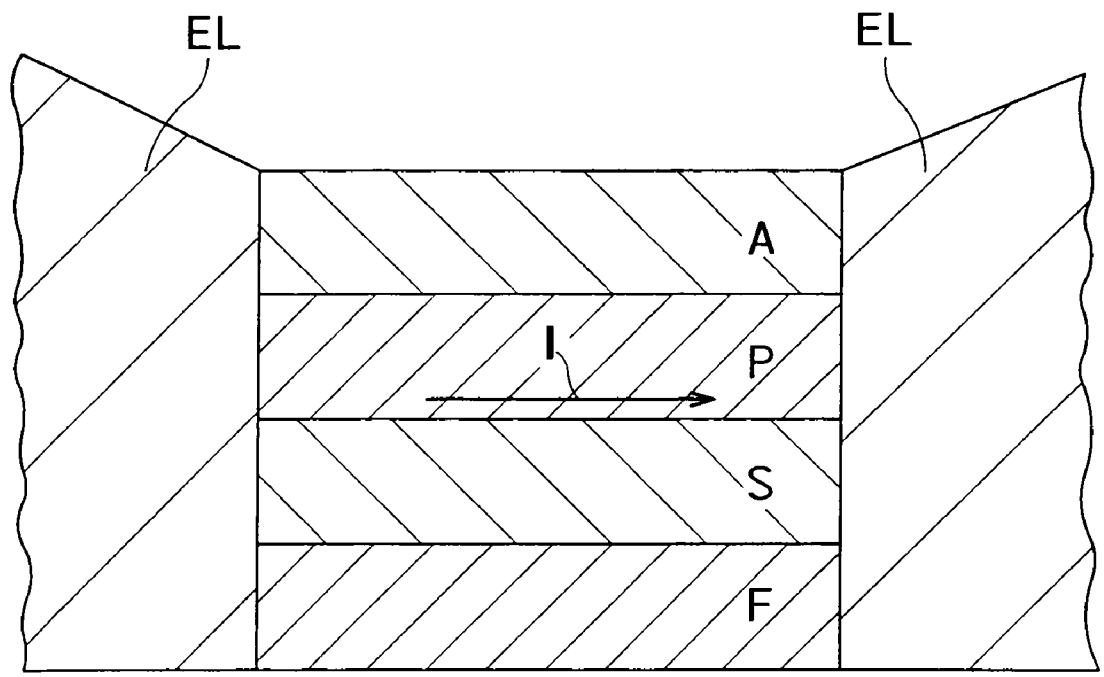
FIG. 26 is a conceptual drawing showing a generally used current supply system.
Figure 27:
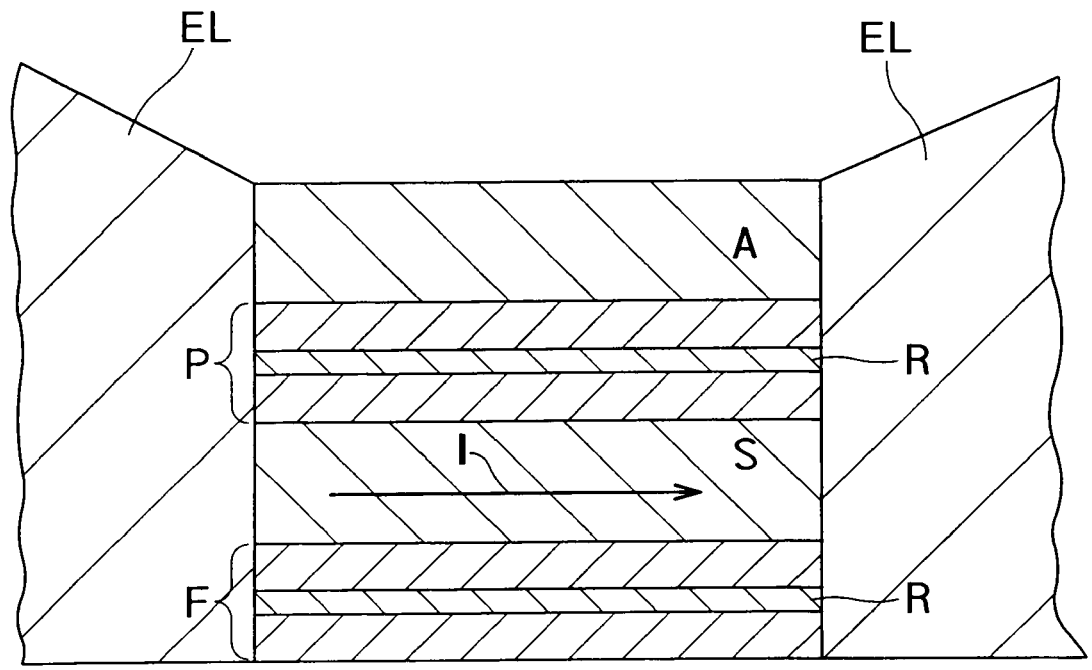
FIG. 27 is a conceptual drawing showing a cross-sectional construction of a spin-valve film.

FIG. 24 is an enlarged perspective view of a magnetic head assembly in front of an actuator arm 155, which is viewed from the side of a disk. That is, the magnetic head assembly 160 has an actuator arm 151 having, e.g., a bobbin portion or the like for holding a driving coil, and a suspension 154 is connected to one end of the actuator arm 155.

A head slider 153 having a reproducing magnetic head using a magnetoresistance effect element according to embodiments of the present invention is mounted on the tip of the suspension 154. A recording head may be combined. The suspension 154 has a lead wire 164 for writing and reading signals. This lead wire 164 is electrically connected to each electrode of the magnetic head which is incorporated in the head slider 153. In the figure, reference number 165 denotes an electrode pad of the magnetic head assembly 160.

Between the medium facing surface or air bearing surface (ABS) of the head slider 153 and the surface of the magnetic disk 200, a predetermined flying height is set.

The slider 153 including the magnetic head 10 operates while flying at a predetermined height from the surface of the magnetic disk 200. According to an aspect of the present invention, such a "flying traveling type" magnetic recording and/or reproducing system can also reproduce at low noises with a higher resolution than conventional systems.

On the other hand, of course, a "contact traveling type" magnetic recording and/or reproducing system for traveling the slider while positively causing the magnetic head 10 to contact the magnetic disk 200 can also reproduce at low noises with a higher resolution than conventional systems.

Referring to Examples, the embodiments of the present invention have been described. However, the present invention should not be limited to these examples.

For example, with respect to the structure of the spin-valve element and the materials of the respective layers, the present invention may be similarly applied to all embodiments, which can be selected by persons with ordinary skill in the art, to provide the same effects. For example, the present invention can be similarly applied to a "dual type" structure.

In addition, the structure of the magnetic head, the materials and shapes of the respective elements constituting the magnetic head should not be limited to those described above in Examples, but the present invention may be similarly applied to all embodiments, which can be selected by persons with ordinary skill in the art, to provide the same effects.

The magnetic recording and/or reproducing system may be a reproducing only system or a recording and/or reproducing system. In addition, the medium should not be limited to a hard disk, but it may be any one of all magnetic recording media, such as flexible disks and magnetic cards. Moreover, the magnetic recording and/or reproducing system may be a so-called "removable" type system wherein a magnetic recording medium is removed from the system.

Moreover, a magnetoresistance effect element according to an aspect of the present invention can be combined with a transistor/diode or the like, or used alone, to form a "magnetic memory cell" for storing magnetic information. That is, the present invention can be applied to a "magnetic random access memory (MRAM)" comprising integrated magnetic memory cells.

As described above in detail, according to the present invention, it is possible to provide a CPP type magnetoresistance effect element which has an appropriate value of resistance and a large amount of change in MR and which is magnetically sensitive.

As a result, it is possible to surely read magnetic information from a finer recording bit from that in conventional elements, so that it is possible to greatly improve the packing density of a recording medium. Simultaneously, the reliability of the magnetic recording and/or reproducing system is improved due to thermal stability, and the utilized scope thereof is extended, so that there is a great industrial merit.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The invention claimed is:

1. A magnetoresistance effect element comprising:
    a magnetoresistance effect film including a magnetization fixed layer having a ferromagnetic film in which the direction of magnetization is substantially fixed to one direction, a magnetization free layer having a ferromagnetic film in which the direction of magnetization varies in response to an external magnetic field, and a non-magnetic intermediate layer provided between the magnetization fixed layer and the magnetization free layer;
    a pair of electrodes which are electrically connected to the magnetoresistance effect film and configured to apply a current in a direction perpendicular to the plane of the magnetoresistance effect film; and
    a resistance regulating layer containing an oxide, a nitride, a fluoride, a carbide or a boride, the resistance regulating layer formed in the non-magnetic intermediate layer or on the interface between the non-magnetic intermediate layer and at least one of the magnetization fixed layer and the magnetization free layer.

2. The magnetoresistance effect element according to claim 1, wherein the ferromagnetic film of the magnetization fixed layer comprises a stacked structure which has at least a non-magnetic layer and two first magnetic layers sandwiching the non-magnetic layer, the first magnetic layers are anti-ferromagnetic coupled via the non-magnetic layer.

3. The magnetoresistance effect element as set forth in claim 1, wherein the non-magnetic layer has a film thickness of 2 nm or less.

4. The magnetoresistance effect element as set forth in claim 1, wherein the ferromagnetic film of at least one of the magnetization fixed layer and the magnetization free layer comprises at least a second magnetic layer formed of Fe or an Fe base alloy.

5. The magnetoresistance effect element as set forth in claim 1, wherein the ferromagnetic film of at least one of the magnetization fixed layer and the magnetization free layer contains at least one selected from the group consisting of FeNi, FeCo, FeSi, FeMo, and FeAl.

6. The magnetoresistance effect, element according to claim 1, wherein the ferromagnetic film of at least one of the magnetization fixed layer and the magnetization free layer is formed of a Co base alloy and contains at least one selected from the group consisting of Fe, Ni, Au, Ag, Cu, Pd, Pt, Ir, Rh, Ru, Os, and Hf as an additional element.

7. The magnetoresistance effect element according to claim 1, wherein the non-magnetic layer contains at least one selected from the group consisting of Cu, Ag, Au, Rh, Ru, Mn, Cr, Re, Os, and Ir.

8. The magnetoresistance effect element according to claim 1, wherein the resistance regulating layer has a hole or holes provided with metal therein, two adjacent layers which contact the resistance regulating layer have an electric conduction substantially limited to conduction through the hole of the resistance regulating layer.

9. The magnetoresistance effect element according to claim 8, wherein the resistance regulating layer has holes of metal phase of 2% to 30%.

10. The megnetoresistance effect element according to claim 8, wherein the mean diameter of each of the holes of the resistance regulating layer is in the range from 10% to 100% with respect to the total thickness of the magnetization free layer, the non-magnetic intermediate layer, and the magnetization fixed layer.

11. The magnetoresistance effect element according to claim 8, wherein a concentration of oxygen, nitrogen, fluorine or boron in the resistance regulating layer is less than 20% by composition ratio.

* * * * *